United States Patent
Duggeli et al.

(10) Patent No.: US 9,893,288 B2
(45) Date of Patent: *Feb. 13, 2018

(54) DIKETOPYRROLOPYRROLE POLYMERS FOR USE IN ORGANIC FIELD EFFECT TRANSISTORS

(71) Applicant: BASF SE, Ludwigshafen (DE)

(72) Inventors: Mathias Duggeli, Thürnen (CH); Mahmoud Zaher Eteish, Huningue (FR); Pascal Hayoz, Hofstetten (CH); Olivier Aebischer, Dudingen (CH); Marta Fonrodona Turon, Blanes (ES); Margherita Fontana, Basel (CH); Marian Lanz, Roschenz (CH); Mathieu G. R. Turbiez, Rixheim (FR); Beat Schmidhalter, Bubendorf (CH); Jean-Charles Flores, Mulhouse (FR)

(73) Assignee: BASF SE, Ludwigshafen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/364,978

(22) Filed: Nov. 30, 2016

(65) Prior Publication Data
US 2017/0148992 A1 May 25, 2017

Related U.S. Application Data

(63) Continuation of application No. 14/529,078, filed on Oct. 30, 2014, now abandoned, which is a
(Continued)

(30) Foreign Application Priority Data

Oct. 31, 2008 (EP) .................................... 08168010
May 19, 2009 (EP) .................................... 09160579

(51) Int. Cl.
*C08G 73/00* (2006.01)
*H01L 51/00* (2006.01)
(Continued)

(52) U.S. Cl.
CPC ........ *H01L 51/0036* (2013.01); *C08G 61/126* (2013.01); *H01L 51/0043* (2013.01);
(Continued)

(58) Field of Classification Search
CPC .................................................. C09B 57/004
(Continued)

(56) References Cited

U.S. PATENT DOCUMENTS 5,856,434 A   1/1999   Stern et al.
6,451,459 B1  9/2002   Tieke et al.
(Continued)

FOREIGN PATENT DOCUMENTS

EP   2033983 A2   3/2009
EP   2034537 A2   3/2009
(Continued)

OTHER PUBLICATIONS

Beyerlein, T., et al., "New Photoluminescent Conjugated Polymers with 1,4-dioxo-3,6-diphenylpyrrolo [3, 4-c] pyrrole (DPP) and 1, 4-phenylene Units in the Main Chain," *Macromolecular Rapid Communications* 21, No. 4 (2000), pp. 182-189.
(Continued)

*Primary Examiner* — Shane Fang
(74) *Attorney, Agent, or Firm* — Marshall, Gerstein & Borun LLP

(57) ABSTRACT

The present invention relates to polymers comprising a repeating unit of the formula I, or III and their use as organic semiconductor in organic devices, especially an organic field effect transistor (OFET), or a device containing a diode and/or an organic field effect transistor. The polymers
(Continued)

according to the invention have excellent solubility in organic solvents and excellent film-forming properties. In addition, high efficiency of energy conversion, excellent field-effect mobility, good on/off current ratios and/or excellent stability can be observed, when the polymers according to the invention are used in organic field effect transistors.

20 Claims, 1 Drawing Sheet

Related U.S. Application Data continuation of application No. 13/126,182, filed as application No. PCT/EP2009/063767 on Oct. 21, 2009, now Pat. No. 8,912,305.

(51) Int. Cl.
C08G 61/12 (2006.01)
H01L 51/05 (2006.01)
H01L 27/28 (2006.01)

(52) U.S. Cl.
CPC .......... C08G 2261/124 (2013.01); C08G 2261/1412 (2013.01); C08G 2261/18 (2013.01); C08G 2261/228 (2013.01); C08G 2261/3223 (2013.01); C08G 2261/3229 (2013.01); C08G 2261/3241 (2013.01); C08G 2261/3243 (2013.01); C08G 2261/411 (2013.01); C08G 2261/92 (2013.01); H01L 27/283 (2013.01); H01L 51/0007 (2013.01); H01L 51/0558 (2013.01)

(58) Field of Classification Search
USPC .......... 257/40, E51.012; 427/331; 528/367
See application file for complete search history.

(56) References Cited

U.S. PATENT DOCUMENTS

| 7,932,344 | B2 | 4/2011 | Li |
| 7,939,818 | B2 | 5/2011 | Heim et al. |
| 8,629,238 | B2 | 1/2014 | Dueggeli et al. |
| 2007/0228359 | A1 | 10/2007 | Heim et al. |
| 2009/0065878 | A1* | 3/2009 | Li .................. 257/411 |
| 2009/0302311 | A1 | 12/2009 | Turbiez et al. |

FOREIGN PATENT DOCUMENTS

| EP | 2075274 A1 | 7/2009 |
| JP | H0493083 A | 3/1992 |
| WO | WO-2005/049695 A1 | 6/2005 |
| WO | WO-2008/000664 A1 | 1/2008 |
| WO | WO-2009/047104 A2 | 4/2009 |
| WO | WO-2010/049323 A1 | 5/2010 |

OTHER PUBLICATIONS

Beyerlein, T, et al., "Red Electroluminescence From a 1, 4-diketopyrrolo [3, 4-c] pyrrole (DPP)-Based Conjugated Polymer," *Synthetic Metals* 130, No. 2 (2002), pp. 115-119.

Bürgi, L, et al., "High-Mobility Ambipolar Near-Infrared Light-Emitting Polymer Field-Effect Transistors," *Advanced Materials* 20, No. 11 (2008), pp. 2217-2224.

Peet, J., et al., "Small Molecule Sensitizers for Near-Infrared Absorption in Polymer Bulk Heterojunction Solar Cells," *Applied Physics Letters* 93, No. 16 (2008), pp. 163306-1-63306-3.

Wienk, M.M., et al., "Narrow-Bandgap Diketo-Pyrrolo-Pyrrole Polymer Solar Cells: the Effect of Processing on the Performanc," *Advanced Materials* 20, No. 13 (2008), pp. 2556-2560.

English-Language Abstract of JP 4093083, dated Mar. 26, 1992.

* cited by examiner

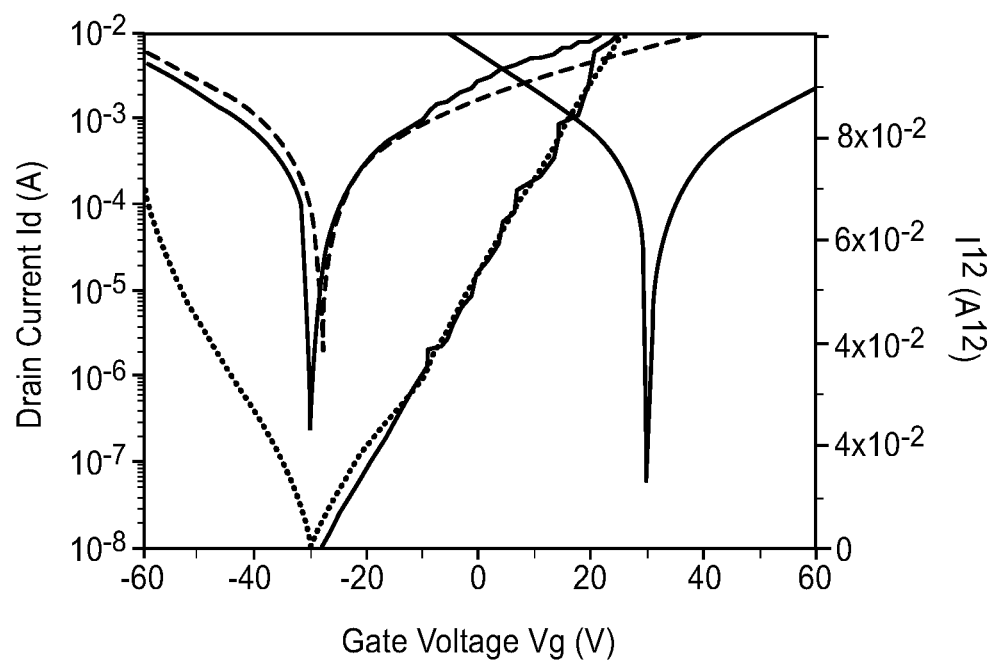

DIKETOPYRROLOPYRROLE POLYMERS FOR USE IN ORGANIC FIELD EFFECT TRANSISTORS

CROSS-REFERENCE TO RELATED APPLICATIONS

This is a continuation of U.S. patent application Ser. No. 14/529,078, filed Oct. 30, 2014, which is a continuation of U.S. patent application Ser. No. 13/126,182, filed Jun. 21, 2011, which is the U.S. national phase of International Application No. PCT/EP2009/063767 filed Oct. 21, 2009, which claims the benefit of European Patent Application No. 09160579.0 filed May 19, 2009, European Patent Application No. 09153172.3 filed Feb. 19, 2009, and European Patent Application No. 08168010.0 filed Oct. 31, 2008.

The present invention relates to polymers comprising a repeating unit of the formula I, or III and their use as organic semiconductor in organic devices, especially an organic field effect transistor (OFET), or a device containing a diode and/or an organic field effect transistor. The polymers according to the invention have excellent solubility in organic solvents and excellent film-forming properties. In addition, high efficiency of energy conversion, excellent field-effect mobility, good on/off current ratios and/or excellent stability can be observed, when the polymers according to the invention are used in organic field effect transistors.

U.S. Pat. No. 6,451,459 (cf. B. Tieke et al., Synth. Met. 130 (2002) 115-119; Macromol. Rapid Commun. 21 (4) (2000) 182-189) describes diketopyrrolopyrrole based polymers and copolymers comprising the following units

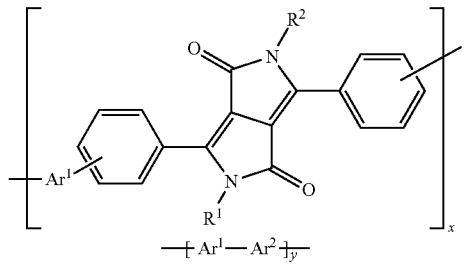

wherein x is chosen in the range of from 0.005 to 1, preferably from 0.01 to 1, and y from 0.995 to O, preferably 0.99 to O, and wherein x+y=1, and wherein $Ar^1$ and $Ar^e$ independently from each other stand for

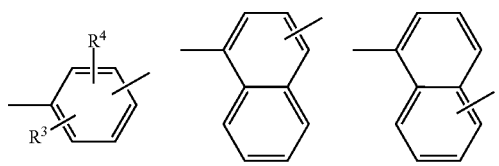

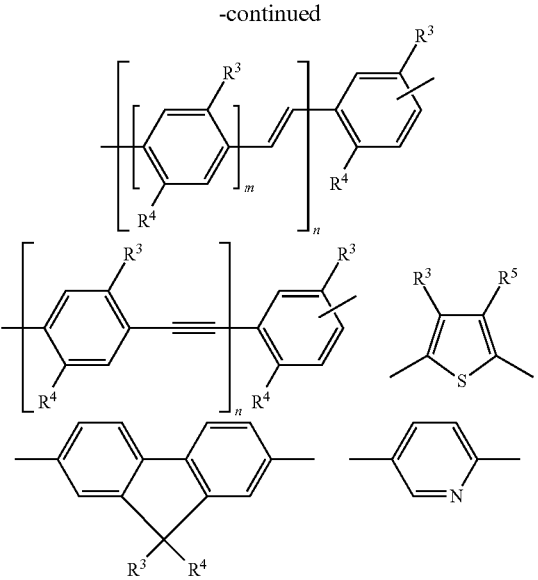

and m, n being numbers from 1 to 10, and $R^1$ and $R^2$ independently from each other stand for H, $C_1$-$C_{18}$alkyl, —C(O)O—$C_1$-$C_{15}$alkyl, perfluoro-$C_1$-$C_{12}$alkyl, unsubstituted $C_6$-$C_{12}$aryl or one to three times with $C_1$-$C_{12}$alkyl, $C_1$-$C_{12}$alkoxy, or halogen substituted $C_6$-$C_{12}$aryl, $C_1$-$C_{12}$alkyl-$C_6$-$C_{12}$aryl, or $C_6$-$C_{12}$aryl-$C_1$-$C_{12}$alkyl, $R^3$ and $R^4$ preferably stand for hydrogen, $C_1$-$C_{12}$alkyl, $C_1$-$C_{12}$alkoxy, unsubstituted $C_6$-$C_{12}$aryl or one to three times with $C_1$-$C_{12}$alkyl, $C_1$-$C_{12}$alkoxy, or halogen substituted $C_6$-$C_{12}$aryl or perfluoro-$C_1$-$C_{12}$alkyl, and $R^5$ preferably stands for $C_1$-$C_{12}$alkyl, $C_1$-$C_{12}$alkoxy, unsubstituted $C_6$-$C_{12}$aryl or one to three times with $C_1$-$C_{12}$alkyl, $C_1$-$C_{12}$alkoxy, or halogen substituted $C_6$-$C_{12}$aryl, or perfluoro-$C_1$-$C_{12}$alkyl, and their use in EL devices. The following polymer

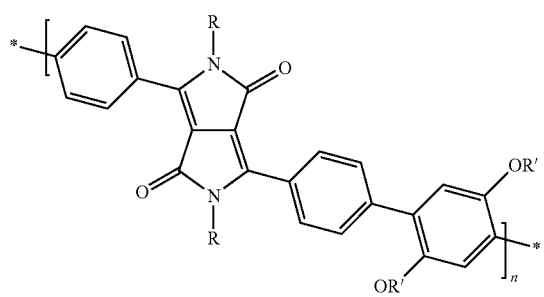

is explicitly disclosed in Tieke et al., Synth. Met. 130 (2002) 115-119. The following polymers

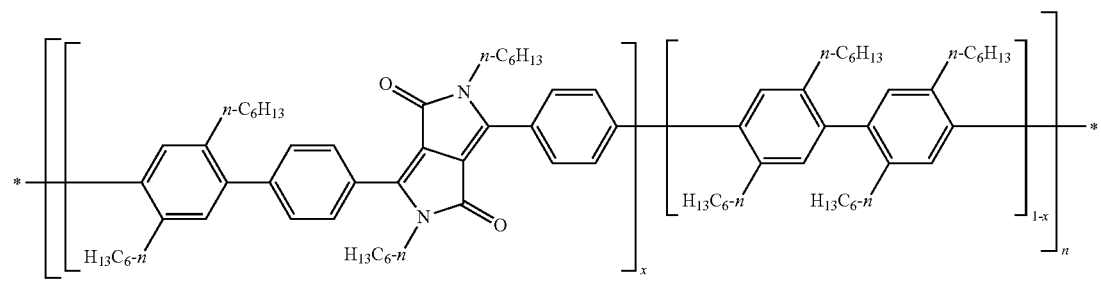

are explicitly disclosed in Macromol. Rapid Commun. 21 (4) (2000) 182-189.

WO05/049695 discloses diketopyrrolopyrrole (DPP) based polymers and their use in PLEDs, organic integrated circuits (O-ICs), organic field effect transistors (OFETs), organic thin film transistors (OTFTs), organic solar cells (O-SCs), or organic laser diodes, but fails to disclose the specific DPP based polymers of formula I.

A preferred polymer comprises a repeating unit of formula

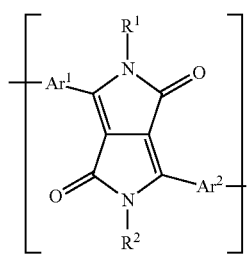

(I)

and a repeating unit

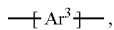

wherein
$R^1$ and $R^2$ are independently of each other a $C_1$-$C_{25}$alkyl group, especially a $C_4$-$C_{12}$alkyl group, which can be interrupted by one or more oxygen atoms, and $Ar^1$ and $Ar^2$ are independently of each other a group of formula

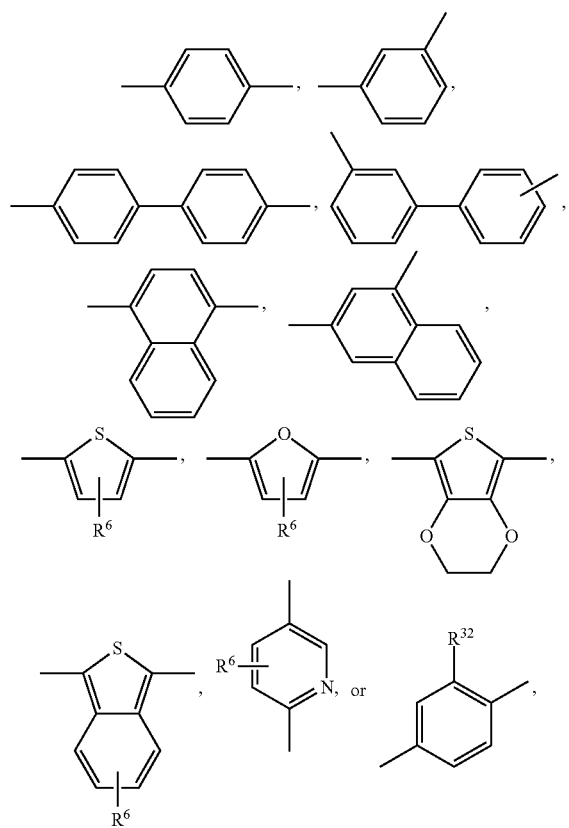

wherein —$Ar^3$- is a group of formula

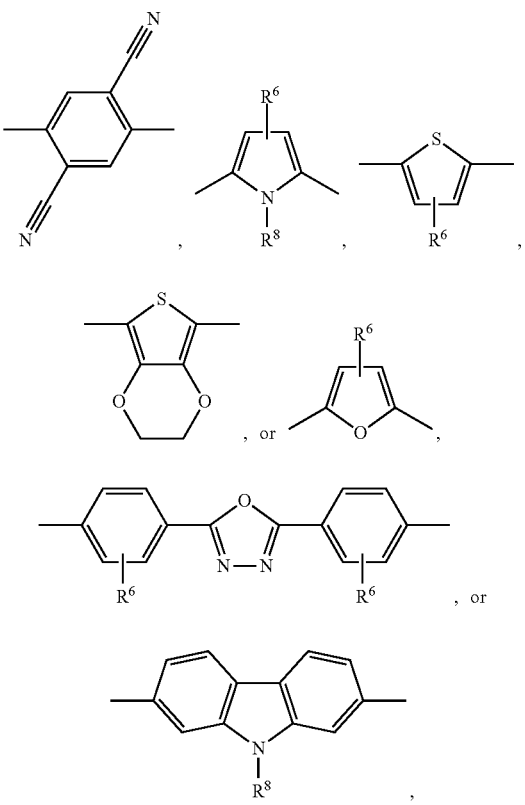

wherein
$R^6$ is hydrogen, $C_1$-$C_{18}$alkyl, or $C_1$-$C_{18}$alkoxy, and $R^{32}$ is methyl, Cl, or OMe, and $R^8$ is H, $C_1$-$C_{18}$alkyl, or $C_1$-$C_{15}$alkyl which is substituted by E and/or interrupted by D, especially $C_1$-$C_{18}$alkyl which is interrupted by —O—.

In Example 12 the preparation of the following polymer is described:

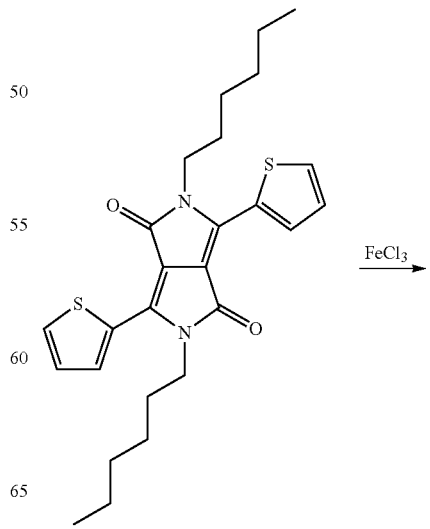

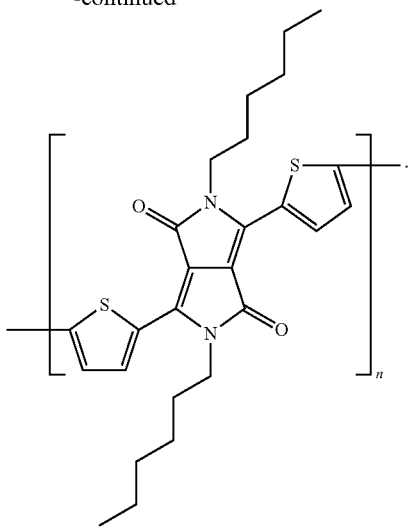

WO08/000664 describes polymers comprising (repeating) unit(s) of the formula

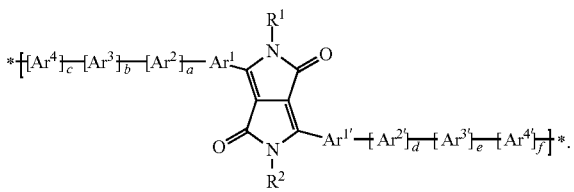

$Ar^1$ and $Ar^{1'}$ are preferably the same and are a group of formula

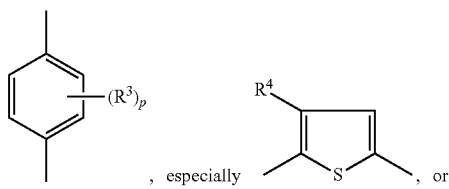, especially 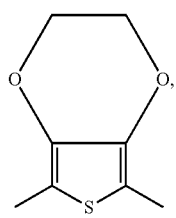, or and $Ar^2$, $Ar^{2'}$, $Ar^3$, $Ar^{3'}$, $Ar^4$ and $Ar^{4'}$ are independently of each other a group of formula

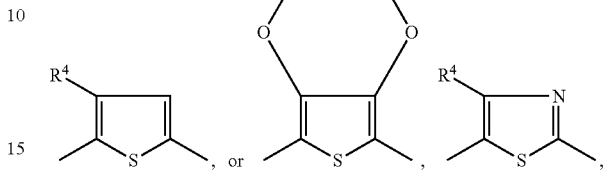

wherein p stands for 0, 1, or 2, $R^3$ may be the same or different within one group and is selected from $C_1$-$C_{25}$alkyl, which may optionally be substituted by E and/or interrupted by D, or $C_1$-$C_{18}$alkoxy, which may optionally be substituted by E and/or interrupted by D;

$R^4$ is $C_6$-$C_{25}$alkyl, which may optionally be substituted by E and/or interrupted by D, $C_6$-$C_{14}$aryl, such as phenyl, naphthyl, or biphenylyl, which may optionally be substituted by G, $C_1$-$C_{25}$alkoxy, which may optionally be substituted by E and/or interrupted by D, or $C_7$-$C_{15}$aralkyl, wherein ar may optionally be substituted by G, D is —CO—, —COO—, —S—, —SO—, —SO$_2$—, —O—, —NR$^{25}$—, wherein R$^{25}$ is $C_1$-$C_{12}$alkyl, such as methyl, ethyl, n-propyl, iso-propyl, n-butyl, isobutyl, or sec-butyl;

E is —OR$^{29}$; —SR$^{29}$; —NR$^{25}$R$^{25}$; —COR$^{28}$; —COOR$^{27}$; —CONR$^{25}$R$^{25}$; or —CN; wherein R$^{25}$, R$^{27}$, R$^{28}$ and R$^{29}$ are independently of each other $C_1$-$C_{12}$alkyl, such as methyl, ethyl, n-propyl, iso-propyl, n-butyl, isobutyl, sec-butyl, hexyl, octyl, or 2-ethyl-hexyl, or $C_6$-$C_{14}$ aryl, such as phenyl, naphthyl, or biphenylyl, G has the same preferences as E, or is $C_1$-$C_{18}$alkyl, especially $C_1$-$C_{12}$alkyl, such as methyl, ethyl, n-propyl, iso-propyl, n-butyl, isobutyl, sec-butyl, hexyl, octyl, or 2-ethyl-hexyl.

The following polymers were disclosed in the Examples:
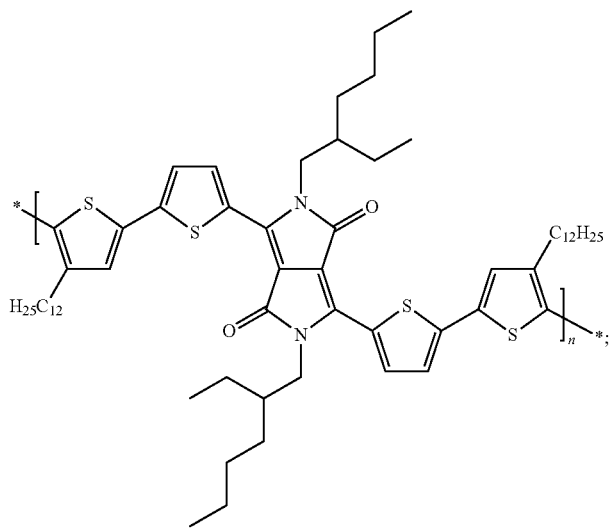
(Example 1, Homopolymer; Adv. Mat. 2008, 20, 13, 2556-2560)
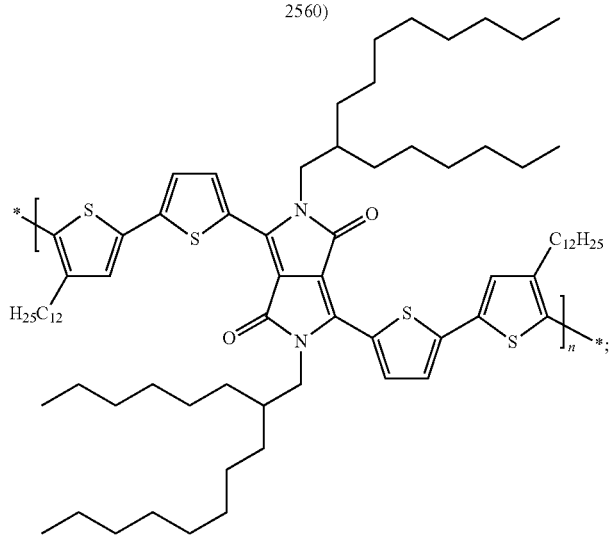
(Example 2, Homopolymer; Adv. Mat. 2008, 20, 11, 2217-2224)
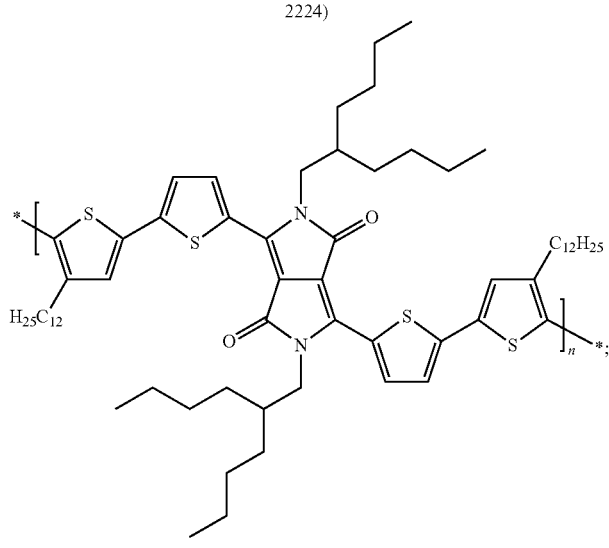
(Example 3, Homopolymer)

-continued

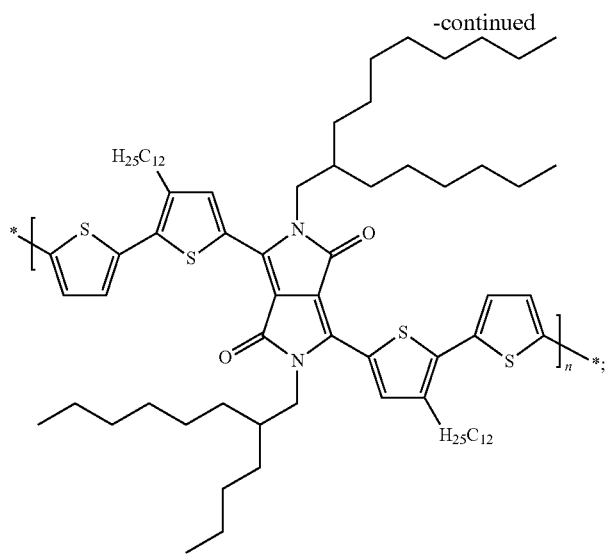
(Example 4, Homopolymer)

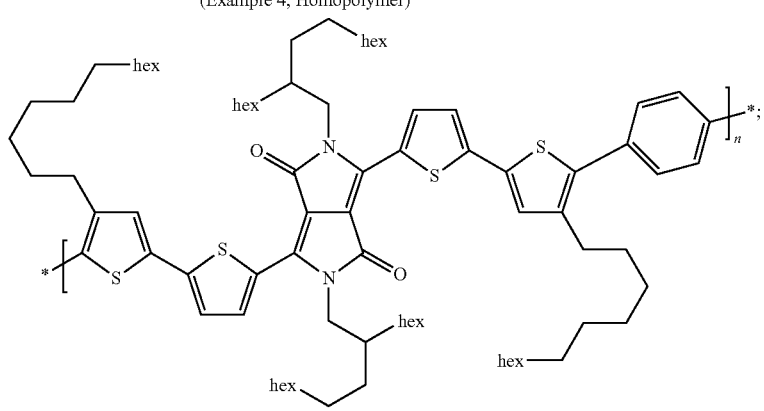
(Example 5, Co-polymer)

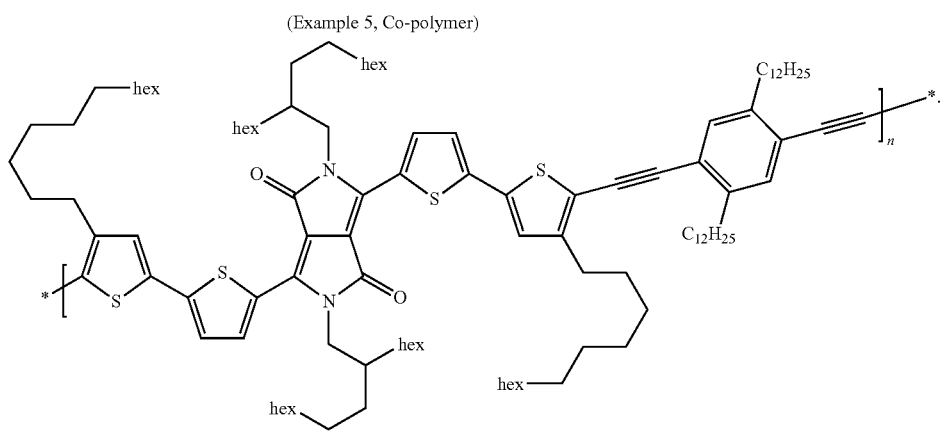
(Example 6, Co-polymer)

EP2034537A2, which enjoys an earlier priority date (6 Sep. 2007) than the present invention (31 Oct. 2008), but has been published (11 Mar. 2009) after the priority date of the present invention, is directed to a thin film transistor device comprising a semiconductor layer, the semiconductor layer comprising a compound comprising a chemical structure represented by:

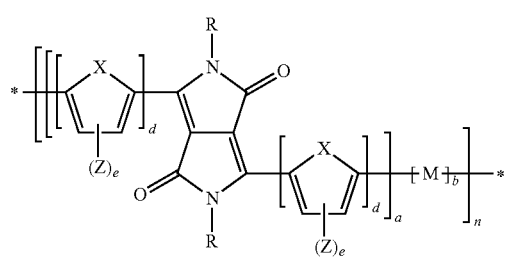

wherein each X is independently selected from S, Se, O, and NR", each R" is independently selected from hydrogen, an optionally substituted hydrocarbon, and a hetero-containing group, each Z is independently one of an optionally substituted hydrocarbon, a hetero-containing group, and a halogen, d is a number which is at least 1, e is a number from zero to 2; a represents a number that is at least 1; b represents a number from 0 to 20; and n represents a number that is at least 1.

The following polymers are explicitly disclosed:

wherein n is the number of repeat units and can be from about 2 to about 5000, R''' and R'''' can be the same or different substituent, and wherein the substituent is independently selected from the group consisting of an optionally substituted hydrocarbon group and a heteroatom-containing group.

BRIEF DESCRIPTION OF THE DRAWING

FIG. 1 contains a transfer curve for the ambipolar transistor of Example 1 measured at a drain basis of (+−30 V) by sweeping the gate from −60 V to 60 V and back.

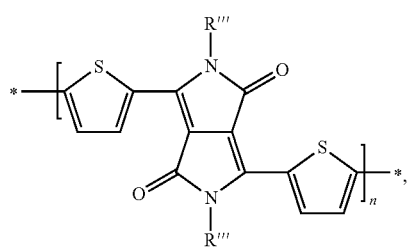
(10)

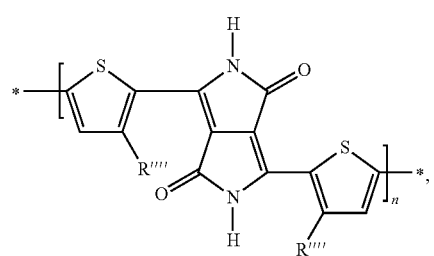
(11)

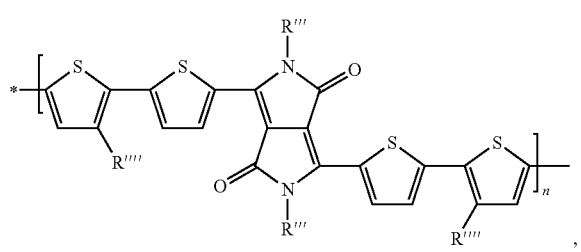
(12)

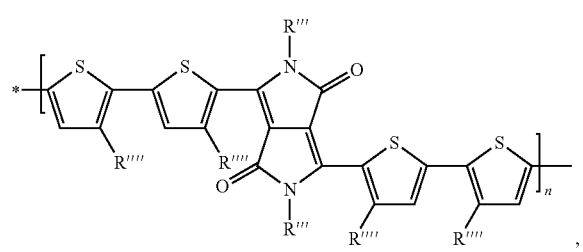
(13)

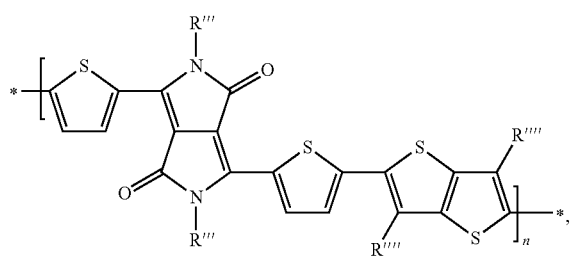
(48)

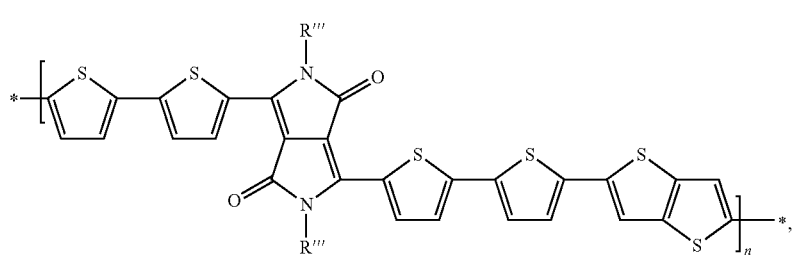
(49)

It is the object of the present invention to provide polymers, which show high efficiency of energy conversion, excellent field-effect mobility, good on/off current ratios and/or excellent stability, when used in organic field effect transistors.

Said object has been solved by polymers comprising one or more (repeating) unit(s) of the formula

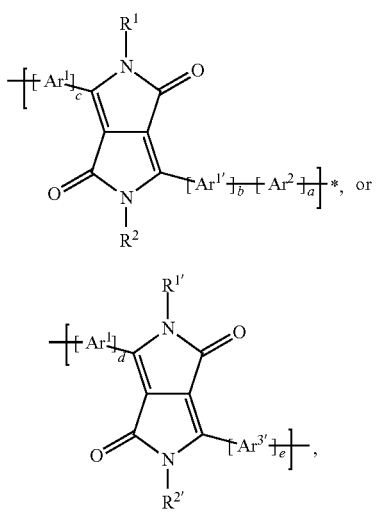

(I)

(III)

wherein
a is an integer of 1 to 5,
b is an integer of 1 to 3,
c is an integer of 1 to 3,
d is an integer 1, 2, or 3,
e is an integer 1, 2, or 3,
the sum of a, b and c is equal, or smaller than 7,
$Ar^1$, $Ar^{1'}$, $Ar^3$ and $Ar^{3'}$ are independently of each other a group of formula

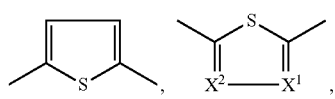

or a group —$Ar^4$—$Ar^5$—$[Ar^6]_f$—,
$Ar^4$ is a group of formula

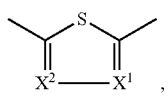

$Ar^5$ and $Ar^6$ have independently of each other the meaning of $Ar^1$, f is 0, or an integer 1, $Ar^2$ is a group of formula

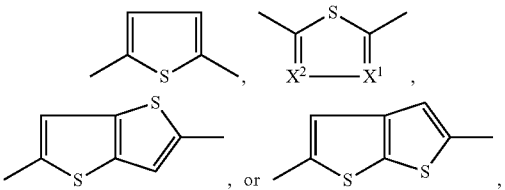

one of $X^1$ and $X^2$ is N and the other is CH, and
$R^1$, $R^2$, $R^{1'}$ and $R^{2'}$ may be the same or different and are selected from hydrogen, a $C_1$-$C_{100}$alkyl group, especially a $C_8$-$C_{36}$alkyl group, a $C_6$-$C_{24}$aryl, in particular phenyl or 1- or 2-naphthyl which can be substituted one to three times with $C_1$-$C_8$alkyl, $C_1$-$C_8$thioalkoxy, and/or $C_1$-$C_8$alkoxy, or pentafluorophenyl; with the proviso that polymers of formula

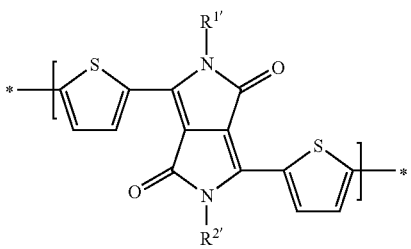

having a molecular weight below 10000 are excluded, and with the further proviso that polymers of formula

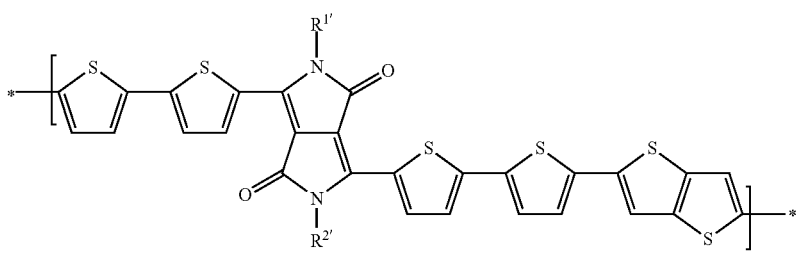

having a molecular weight below 10000 are excluded.

In a preferred embodiment of the present invention e is 2, or 3. d is preferably equal to e.

Polymers comprising repeating units of the formula I are preferred against polymers comprising repeating units of the formula III.

In a preferred embodiment the present invention is directed to a polymer comprising one or more (repeating) unit(s) of the formula

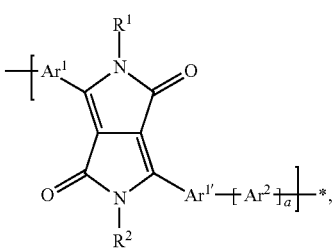

(II)

wherein
a is an integer of 1 to 5,

Ar¹ and Ar¹' are independently of each other a group of formula

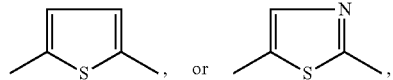

Ar² is a group of formula

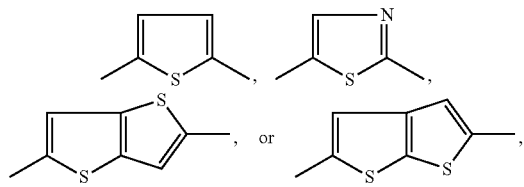

and

R¹ and R² may be the same or different and are selected from hydrogen, a $C_1$-$C_{100}$alkyl group, especially a $C_8$-$C_{36}$alkyl group, a $C_6$-$C_{24}$aryl, in particular phenyl or 1- or 2-naphthyl which can be substituted one to three times with $C_1$-$C_8$alkyl, $C_1$-$C_8$thioalkoxy, and/or $C_1$-$C_8$alkoxy, or pentafluorophenyl.

Advantageously, the polymer of the present invention, or an organic semiconductor material, layer or component, comprising the polymer of the present invention can be used in OFETs.

Ar¹, Ar¹', Ar³ and Ar³' can be the same and can be different, but are preferably the same. Ar¹, Ar¹', Ar³ and Ar³' can be a group of formula

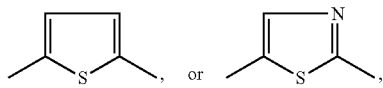

wherein a group of formula

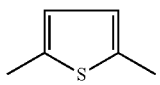

is preferred.

Ar² can be a group of formula

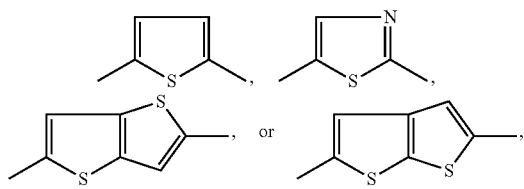

wherein groups of formula

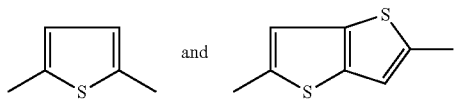

are preferred and a group of formula

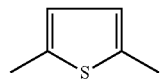

is even more preferred. If a is equal to, or greater than 2, Ar² can be composed of groups of formula

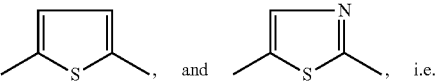

can, for example, be a group of formula

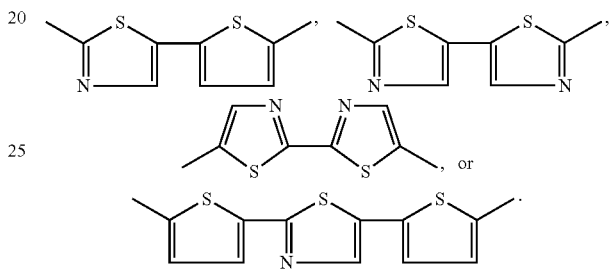

As indicated by the formula

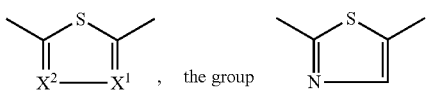, the group 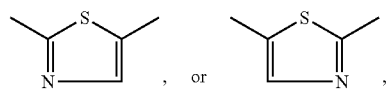

can be attached to the DPP basic unit, or arranged in the polymer chain in two ways

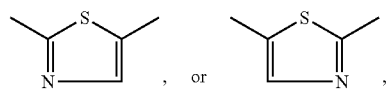

The notation

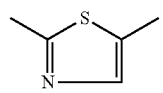

should comprise both possibilities.

a is preferably an integer of 1 to 5, especially an integer of 1 to 3.

b is an integer of 1 to 3. c is an integer of 1 to 3. The sum of a, b and c is equal, or smaller than 7.

R¹, R², R¹' and R²' can be different, but are preferably the same. R¹, R², R¹' and R²' can be linear, but are preferably branched. R¹, R², R¹' and R²' are preferably a $C_8$-$C_{36}$alkyl group, especially a $C_{12}$-$C_{24}$alkyl group, such as n-dodecyl, tridecyl, tetradecyl, pentadecyl, hexadecyl, 2-ethyl-hexyl, 2-butyl-hexyl, 2-butyl-octyl, 2-hexyldecyl, 2-decyl-tetradecyl, heptadecyl, octadecyl, eicosyl, heneicosyl, docosyl, or tetracosyl. The $C_8$-$C_{36}$alkyl and $C_{12}$-$C_{24}$alkyl group can be linear, or branched, but are preferably branched. In a particularly preferred embodiment of the present invention $R^1$, $R^2$, $R^{1'}$ and $R^{2'}$ are a 2-hexyldecyl or 2-decyl-tetradecyl group.

Advantageously, the groups $R^1$, $R^2$, $R^{1'}$ and $R^{2'}$ can be represented by formula

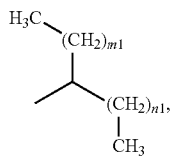

wherein m1=n1+4 and m1+n1≤22.

Chiral side chains, such as $R^1$, $R^2$, $R^{1'}$ and $R^{2'}$, can either be homochiral, or racemic, which can influence the morphology of the polymers.

In a preferred embodiment the present invention is directed to co-polymers of the formula

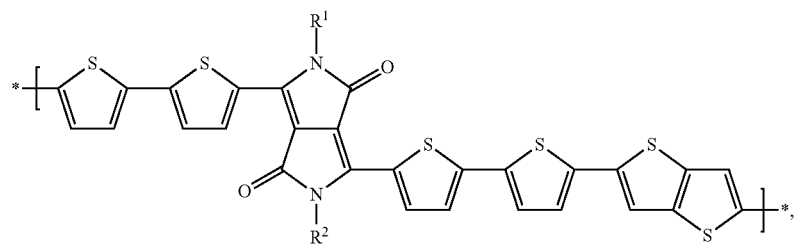

wherein $R^1$ and $R^2$ are a branched $C_8$-$C_{36}$alkyl group, especially a branched $C_{12}$-$C_{24}$alkyl group, such as, for example, a 2-hexyldecyl or 2-decyl-tetradecyl group. Said polymers have a weight average molecular weight of preferably 10,000 to 100,000 Daltons and most preferably 20,000 to 60,000 Daltons. Said polymers preferably have a polydispersibility of 1.1 to 3.0, most preferred 1.5 to 2.5.

In a preferred embodiment the present invention is directed to homopolymers of the formula

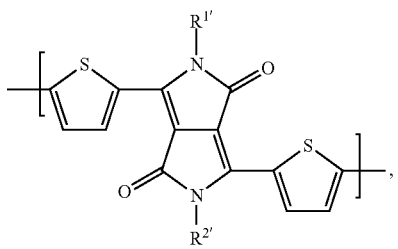

wherein $R^{1'}$ and $R^{2'}$ are a branched $C_8$-$C_{36}$alkyl group, especially a branched $C_{12}$-$C_{24}$alkyl group, such as, for example, a 2-hexyldecyl or 2-decyl-tetradecyl group. Said polymers have a weight average molecular weight of preferably 10,000 to 100,000 Daltons and most preferably 20,000 to 60,000 Daltons. Said polymers preferably have a polydispersibility of 1.1 to 3.0, most preferred 1.5 to 2.5. Said polymers can show ambipolarity.

In a preferred embodiment the present invention is directed to polymers, comprising one or more (repeating) unit(s) of the formula

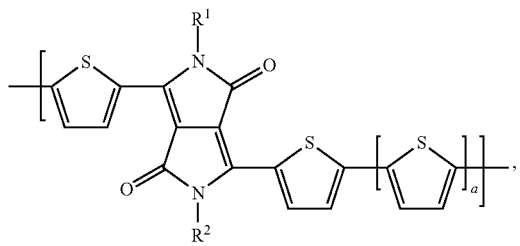
(IIa)

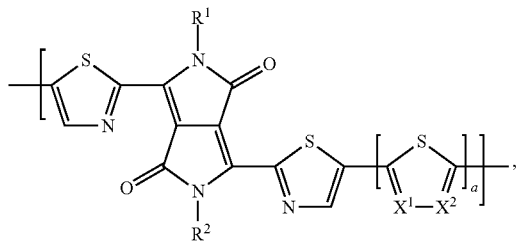
(IIb)

-continued

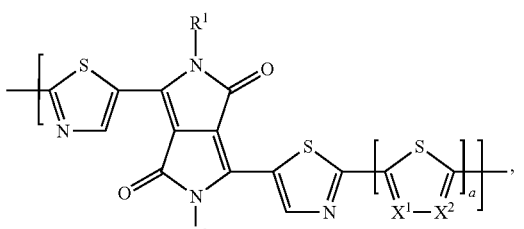
(Ic)

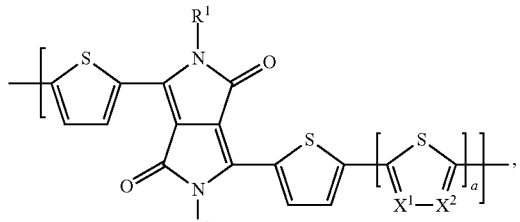
(IId)

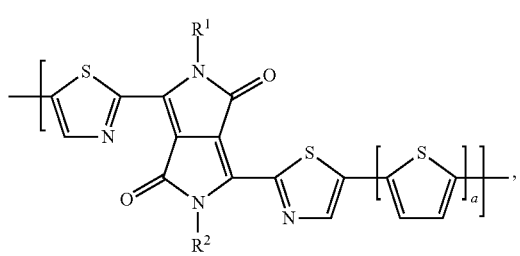
(IIe)

(IIf)
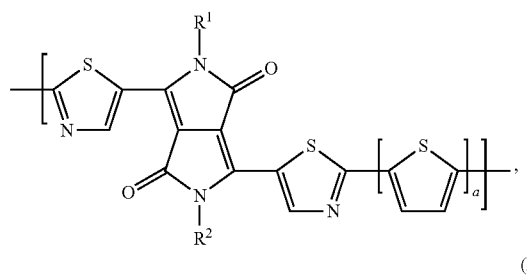
(IIg)
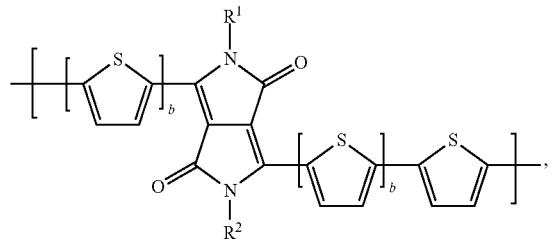
(IIh)
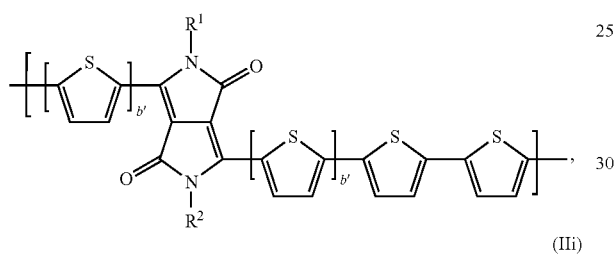
(IIi)
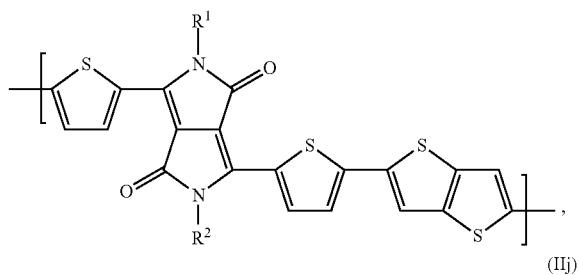
(IIj)
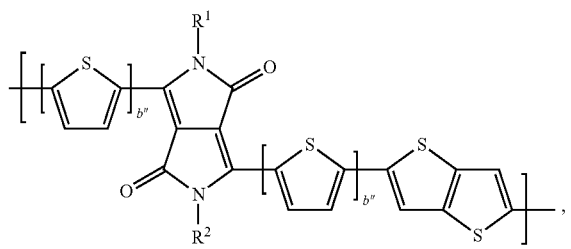
(IIk)
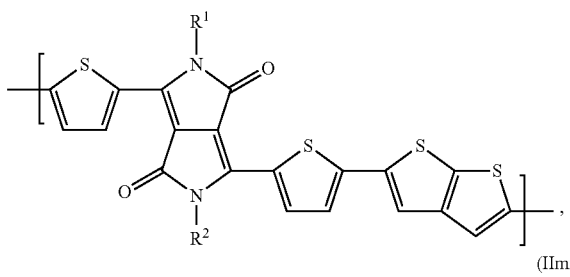
(IIm)
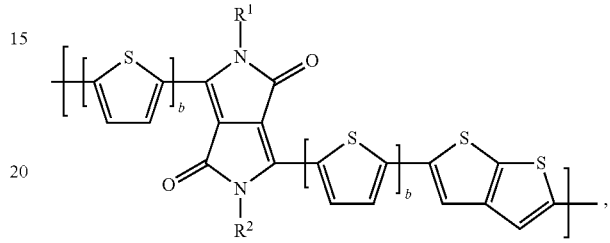
(IIn)
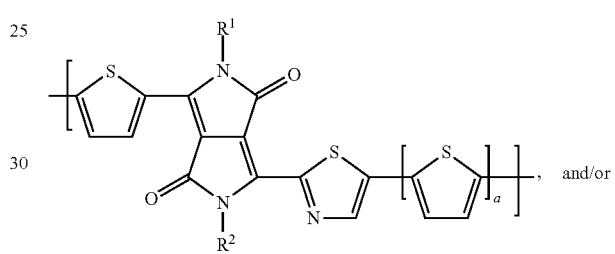
, and/or
(IIo)
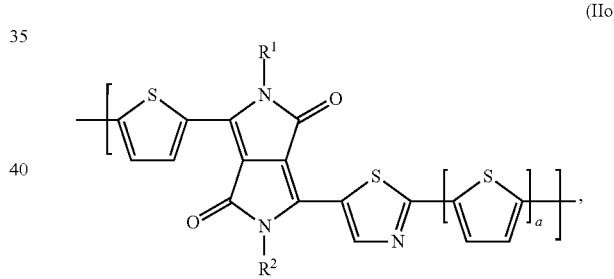
,
wherein
a is an integer of 1 to 5, especially 1 to 3,
b is an integer of 2, or 3, b' is an integer of 2, b" is an integer of 3, one of X¹ and X² is N and the other is CH, and
R¹ and R² may be the same or different and are selected from hydrogen, or a C₈-C₃₆alkyl group.
Even more preferred are polymers, comprising one or more (repeating) unit(s) of the formula
(IIa')
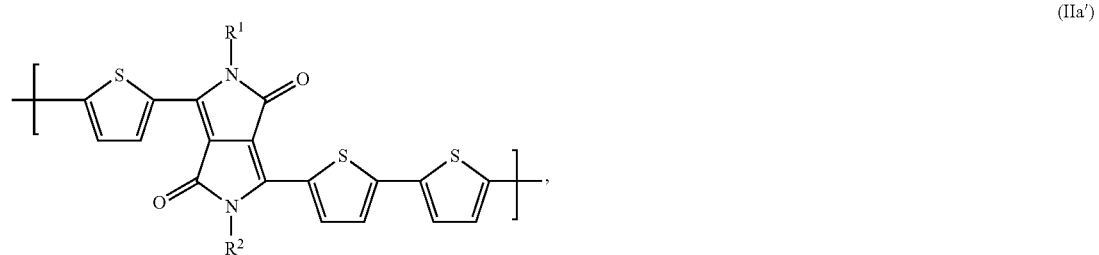
, -continued
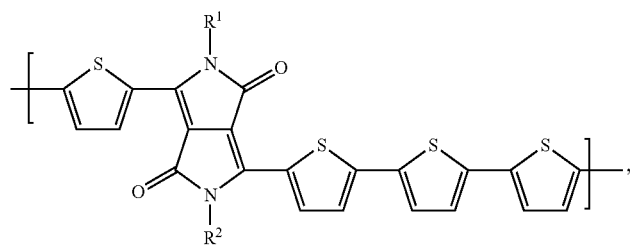
(IIa″)
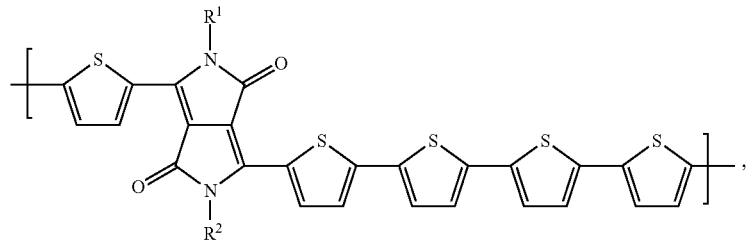
(IIa‴)
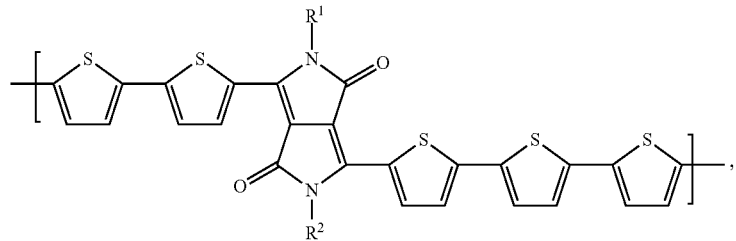
(IIg′)
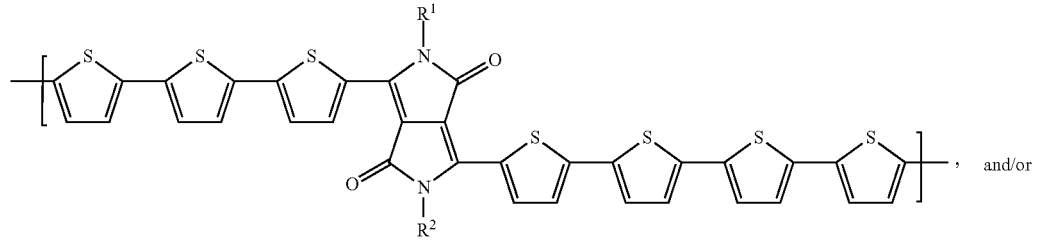
(IIg″), and/or
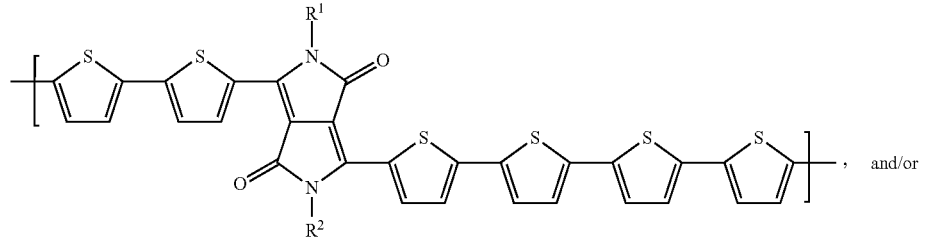
(IIh′), and/or
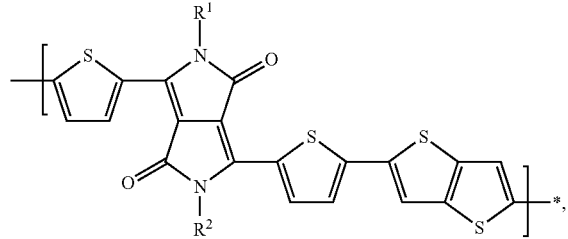
(IIm′),
wherein
R¹ and R² may be the same or different and are selected from a $C_8$-$C_{36}$alkyl group.
In a preferred embodiment of the present invention the polymer comprises two, or more different repeating units of formula I. Advantageously, the repeating units are selected from repeating units of formula IIa, IIb, IIc, IId, IIe, IIf, IIg and IIh. A polymer comprising repeating units of formula IIa' and IIa" shows, for example, excellent field effect mobility and on/off current ratio.

According to the present invention a homopolymer is a polymer derived from one species of (real, implicit, or hypothetical) monomer. Many polymers are made by the mutual reaction of complementary monomers. These monomers can readily be visualized as reacting to give an "implicit monomer", the homopolymerisation of which would give the actual product, which can be regarded as a homopolymer. Some polymers are obtained by chemical modification of other polymers, such that the structure of the macromolecules that constitute the resulting polymer can be thought of having been formed by the homopolymerisation of a hypothetical monomer.

Accordingly a copolymer is a polymer derived from more than one species of monomer, e.g. bipolymer, terpolymer, quaterpolymer, etc.

The term polymer comprises oligomers as well as polymers. The oligomers of this invention have a weight average molecular weight of <4,000 Daltons. The polymers of this invention preferably have a weight average molecular weight of 4,000 Daltons or greater, especially 4,000 to 2,000,000 Daltons, very especially 10,000 to 1,000,000 Daltons, more preferably 10,000 to 100,000 Daltons and most preferred 20,000 to 60,000 Daltons. Molecular weights are determined according to high-temperature gel permeation chromatography (HT-GPC) using polystyrene standards. The polymers of this invention preferably have a polydispersibility of 1.01 to 10, more preferably 1.1 to 3.0, most preferred 1.5 to 2.5.

In a preferred embodiment of the present invention the polymer is a copolymer, comprising repeating units of formula

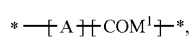

(VII)

especially, wherein
A is a group of formula

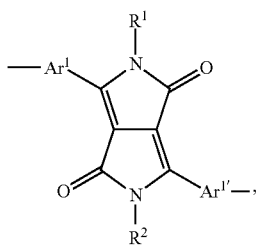

COM¹ is a group of formula

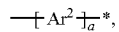

and
R¹, R², Ar¹, Ar¹'Ar² and a are as defined above.

Copolymers of formula VII can be obtained, for example, by the Suzuki reaction. The condensation reaction of an aromatic boronate and a halogenide, especially a bromide, commonly referred to as the "Suzuki reaction", is tolerant of the presence of a variety of organic functional groups as reported by N. Miyaura and A. Suzuki in Chemical Reviews, Vol. 95, pp. 457-2483 (1995). Preferred catalysts are 2-dicyclohexylphosphino-2',6'-di-alkoxybiphenyl/palladium(II) acetates, tri-alkyl-phosphonium salts/palladium (0) derivatives and tri-alkylphosphine/palladium (0) derivatives. Especially preferred catalysts are 2-dicyclohexylphosphino-2',6'-di-methoxybiphenyl (sPhos)/palladium(II)acetate and, tri-tert-butylphosphonium tetrafluoroborate ((t-Bu)₃P*HBF₄)/tris(dibenzylideneacetone) dipalladium (0) (Pd₂(dba)₃) and tri-tert-butylphosphine (t-Bu)₃P/tris(dibenzylideneacetone) dipalladium (0) (Pd₂(dba)₃). Preferred solvents are tetrahydrofuran (THF), or mixtures of THF and toluene. Preferred bases are aq. K₂CO₃ or aq. Na₂CO₃. This reaction can be applied to preparing high molecular weight polymers and copolymers.

To prepare polymers corresponding to formula

(VII)

wherein
A is a group of formula

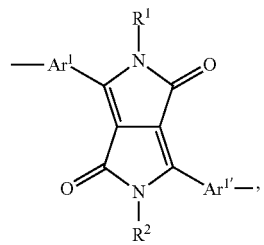

COM¹ is a group of formula

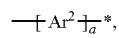

a is an integer of 1 to 5, n is number which results in a molecular weight of 4,000 to 2,000,000 Daltons, and R¹, R², Ar¹, A¹', Ar² and a are as defined above, a dihalogenide X¹⁰-A-X¹⁰, such as a dibromide or dichloride, or diiodide, especially a dibromide corresponding to formula Br-A-Br is reacted with an equimolar amount of a diboronic acid or diboronate corresponding to formula

or a dihalogenide of formula

is reacted with an equimolar amount of a diboronic acid or diboronate corresponding to formula X¹¹-A-X¹¹, wherein X¹⁰ is halogen, especially Br, and X¹¹ is independently in each occurrence —B(OH)₂, —B(OY¹)₂,

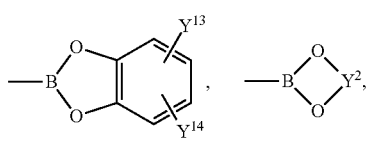

—BF$_3$Na, —BF$_3$N(Y$^{15}$)$_4$, or —BF$_3$K, wherein Y$^1$ is independently in each occurrence a C$_1$-C$_{10}$alkyl group and Y$^2$ is independently in each occurrence a C$_2$-C$_{10}$alkylene group, such as —CY$^3$Y$^4$—CY$^5$Y$^6$—, or —CY$^7$Y$^8$—CY$^9$Y$^9$—CY$^{11}$Y$^{12}$—, wherein Y$^3$, Y$^4$, Y$^5$, Y$^6$, Y$^7$, Y$^8$, Y$^9$, Y$^{10}$, Y$^{11}$ and Y$^{12}$ are independently of each other hydrogen, or a C$_1$-C$_{10}$alkyl group, especially —C(CH$_3$)$_2$C(CH$_3$)$_2$—, or —C(CH$_3$)$_2$CH$_2$C(CH$_3$)$_2$—, —CH$_2$C(CH$_3$)$_2$CH$_2$—, and Y$^{13}$ and Y$^{14}$ are independently of each other hydrogen, or a C$_1$-C$_{10}$alkyl group, Y$^{15}$ is H, or a C$_1$-C$_{25}$alkyl group, which may optionally be interrupted by —O—, in a solvent and in the presence of a catalyst; such as, for example, under the catalytic action of Pd and triphenylphosphine.

The reaction is typically conducted at about 0° C. to 180° C. in an aromatic hydrocarbon solvent such as toluene, xylene, anisole, chlorobenzene, fluorobenzene. Other solvents such as dimethylformamide, dioxane, dimethoxyethan, 2-methyltetrahydrofuran, cyclopentylmethylether and tetrahydrofuran can also be used alone, or in mixtures with an aromatic hydrocarbon. Most preferred are THF or THF/toluene. An aqueous base (such as, for example, for example, alkali and alkaline earth metal hydroxides, carboxylates, carbonates, fluorides and phosphates such as sodium and potassium hydroxide, acetate, carbonate, fluoride and phosphate or also metal alcoholates), preferably sodium carbonate or bicarbonate, potassium phosphate, potassium carbonate or bicarbonate is used as the HBr scavenger. A polymerization reaction may take 0.2 to 100 hours. Organic bases, such as, for example, tetraalkylammonium hydroxide, and phase transfer catalysts, such as, for example TBAB, can promote the activity of the boron (see, for example, Leadbeater & Marco; Angew. Chem. Int. Ed. Eng. 42 (2003) 1407 and references cited therein). Other variations of reaction conditions are given by T. I. Wallow and B. M. Novak in J. Org. Chem. 59 (1994) 5034-5037; and M. Remmers, M. Schulze, and G. Wegner in Macromol. Rapid Commun. 17 (1996) 239-252. Control of molecular weight is possible by using either an excess of dibromide, diboronic acid, or diboronate, or a chain terminator.

The palladium catalyst is present in the reaction mixture in catalytic amounts. The term "catalytic amount" as used herein refers to an amount that is clearly below one equivalent of dihalogenide and diboronic acid or diboronate used, preferably 0.01 to 5 mol. %, most preferably 0.01 to 1 mol. %, based on the equivalents of dihalogenide and diboronic acid or diboronate used.

The amount of phosphines or phosphonium salts in the reaction mixture is preferably from 0.02 to 10 mol. %, most preferably 0.02 to 2 mol. %, based on the equivalents of dihalogenide and diboronic acid or diboronate used. The preferred ratio of Pd:phosphine is 1:2. It is preferable that at least 1.5 equivalents of said base per functional boron group is present in the reaction mixture.

For polymerisations that are performed in a single solvent or a solvent mixture, it is possible to add a secondary or tertiary co-solvent once the polymerisation has initiated and after a given period of time. The purpose of this co-solvent addition is to keep the growing polymer chains in solution during the polymerisation process. This also assist the recovery of the polymer from the reaction mixture at the end of the reaction and therefore improve the isolated yield of the polymer.

If desired, a monofunctional aryl halide or aryl boronate may be used as a chain-terminator in such reactions, which will result in the formation of a terminal aryl group.

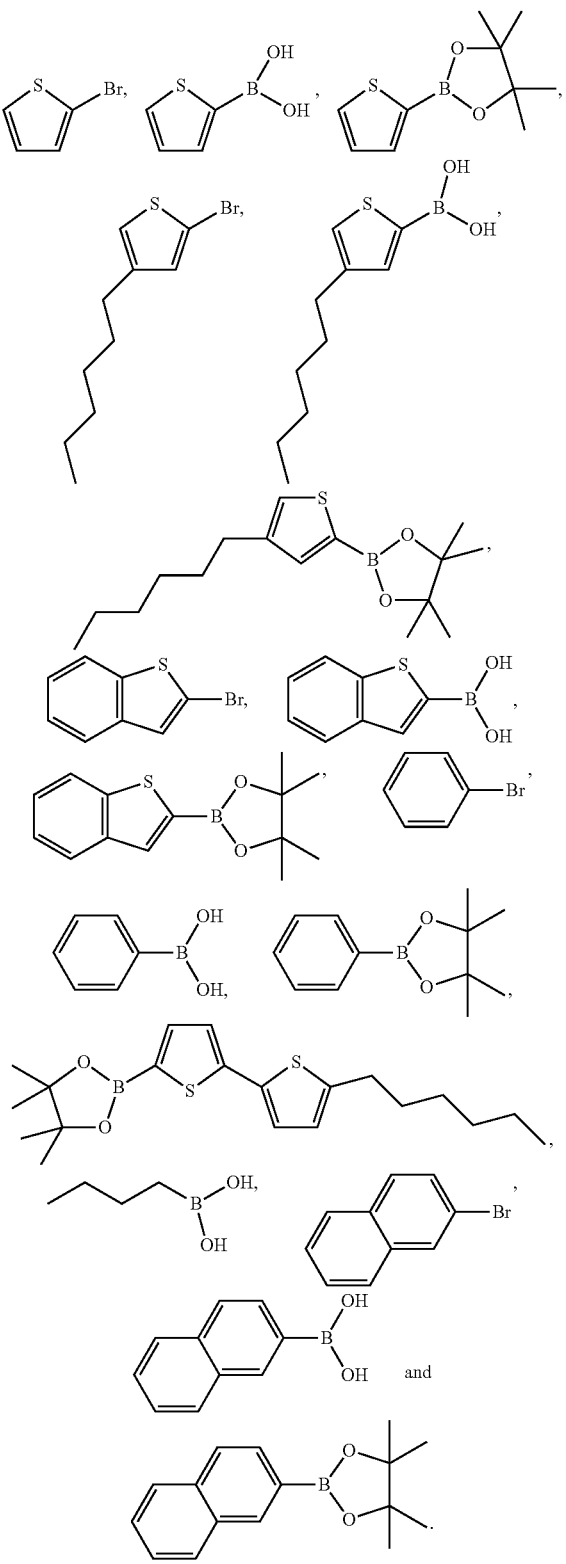

It is possible to control the sequencing of the monomeric units in the resulting copolymer by controlling the order and composition of monomer feeds in the Suzuki reaction.

After polymerisation the polymer is preferably recovered from the reaction mixture, for example by conventional work-up, and purified. This can be achieved according to standard methods known to the expert and described in the literature.

The polymers of the present invention can also be sythesized by the Stille coupling (see, for example, Babudri et al, J. Mater. Chem., 2004, 14, 11-34; J. K. Stille, Angew. Chemie Int. Ed. Engl. 1986, 25, 508). To prepare polymers corresponding to formula VII a dihalogenide, such as a dibromide or dichloride, especially a dibromide corresponding to formula Br-A-Br is reacted with a compound of formula

wherein $X^{21}$ is a group $-Sn\ R^{207}R^{208}R^{209}$, in an inert solvent at a temperature in range from 0° C. to 200° C. in the presence of a palladium-containing catalyst, wherein $R^{207}$, $R^{208}$ and $R^{209}$ are identical or different and are H, or $C_1$-$C_6$alkyl, wherein two radicals optionally form a common ring and these radicals are optionally branched or unbranched. It must be ensured here that the totality of all monomers used has a highly balanced ratio of organotin functions to halogen functions. In addition, it may prove advantageous to remove any excess reactive groups at the end of the reaction by end-capping with monofunctional reagents. In order to carry out the process, the tin compounds and the halogen compounds are preferably introduced into one or more inert organic solvents and stirred at a temperature of from 0 to 200° C., preferably from 30 to 170° C. for a period of from 1 hour to 200 hours, preferably from 5 hours to 150 hours. The crude product can be purified by methods known to the person skilled in the art and appropriate for the respective polymer, for example repeated re-precipitation or even by dialysis.

Suitable organic solvents for the process described are, for example, ethers, for example diethyl ether, dimethoxyethane, diethylene glycol dimethyl ether, tetrahydrofuran, dioxane, dioxolane, diisopropyl ether and tert-butyl methyl ether, hydrocarbons, for example hexane, isohexane, heptane, cyclohexane, benzene, toluene and xylene, alcohols, for example methanol, ethanol, 1-propanol, 2-propanol, ethylene glycol, 1-butanol, 2-butanol and tert-butanol, ketones, for example acetone, ethyl methyl ketone and isobutyl methyl ketone, amides, for example dimethylformamide (DMF), dimethylacetamide and N-methylpyrrolidone, nitriles, for example acetonitrile, propionitrile and butyronitrile, and mixtures thereof.

The palladium and phosphine components should be selected analogously to the description for the Suzuki variant.

Alternatively, the polymers of the present invention can also be synthesized by the Negishi reaction using zinc reagents $(A-(ZnX^{22})_2$, wherein $X^{22}$ is halogen) and halides or triflates $(COM^1$-$(X^{23})_2)$, wherein $X^{23}$ is halogen or triflate). Reference is, for example, made to E. Negishi et al., Heterocycles 18 (1982) 117-22.

The polymers, wherein $R^1$ and/or $R^2$ are hydrogen can be obtained by using a protecting group which can be removed after polymerization (see, for example, EP-A-0648770, EP-A-0648817, EP-A-0742255, EP-A-0761772, WO98/32802, WO98/45757, WO98/58027, WO99/01511, WO00/17275, WO00/39221, WO00/63297 and EP-A-1086984). Conversion of the pigment precursor into its pigmentary form is carried out by means of fragmentation under known conditions, for example thermally, optionally in the presence of an additional catalyst, for example the catalysts described in WO00/36210.

An example of such a protecting group is group of formula

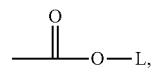

wherein L is any desired group suitable for imparting solubility.

L is preferably a group of formula

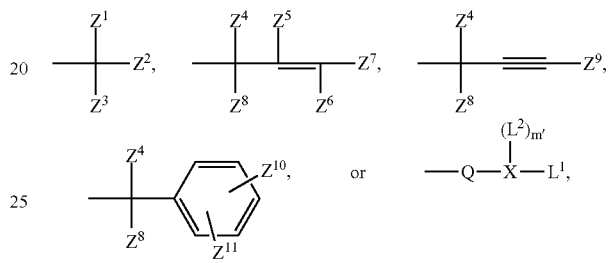

wherein $Z^1$, $Z^2$ and $Z^3$ are independently of each other $C_1$-$C_6$alkyl, $Z^4$ and $Z^8$ are independently of each other $C_1$-$C_6$alkyl, $C_1$-$C_6$alkyl interrupted by oxygen, sulfur or $N(Z^{12})_2$, or unsubstituted or $C_1$-$C_6$alkyl-, $C_1$-$C_6$alkoxy-, halo-, cyano- or nitro-substituted phenyl or biphenyl, $Z^5$, $Z^6$ and $Z^7$ are independently of each other hydrogen or $C_1$-$C_6$alkyl, $Z^9$ is hydrogen, $C_1$-$C_6$alkyl or a group of formula

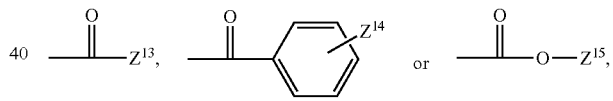

$Z^{10}$ and $Z^{11}$ are each independently of the other hydrogen, $C_1$-$C_6$alkyl, $C_1$-$C_6$alkoxy, halogen, cyano, nitro, $N(Z^{12})_2$, or unsubstituted or halo-, cyano-, nitro-, $C_1$-$C_6$alkyl- or $C_1$-$C_6$alkoxy-substituted phenyl, $Z^{12}$ and $Z^{13}$ are $C_1$-$C_6$alkyl, $Z^{14}$ is hydrogen or $C_1$-$C_6$alkyl, and $Z^{15}$ is hydrogen, $C_1$-$C_6$alkyl, or unsubstituted or $C_1$-$C_6$alkyl-substituted phenyl, Q is p,q-$C_2$-$C_6$alkylene unsubstituted or mono- or poly-substituted by $C_1$-$C_6$alkoxy, $C_1$-$C_6$alkylthio or $C_2$-$C_{12}$dialkylamino, wherein p and q are different position numbers, X is a hetero atom selected from the group consisting of nitrogen, oxygen and sulfur, m' being the number 0 when X is oxygen or sulfur and m being the number 1 when X is nitrogen, and $L^1$ and $L^2$ are independently of each other unsubstituted or mono- or poly-$C_1$-$C_{12}$alkoxy-, $-C_1$-$C_{12}$alkylthio-, $-C_2$-$C_{24}$dialkylamino-, $-C_6$-$C_{12}$aryloxy-, $-C_6$-$C_{12}$arylthio-, $-C_7$-$C_{24}$alkylarylamino- or $-C_{12}$-$C_{24}$diarylamino-substituted $C_1$-$C_6$alkyl or $[-(p',q'-C_2$-$C_6$alkylene)-Z$-]_{n'}$, $-C_1$-$C_6$alkyl, n' being a number from 1 to 1000, p' and q' being different position numbers, each Z independently of any others being a hetero atom oxygen, sulfur or $C_1$-$C_{12}$alkyl-substituted nitrogen, and it being possible for $C_2$-$C_6$alkylene in the repeating $[-C_2$-$C_6$alkylene-Z$-]$ units to be the same or different, and $L_1$ and $L_2$ may be saturated or unsaturated from one to ten times, may be uninterrupted or interrupted at any location by from 1 to 10 groups selected from the group consisting of —(C=O)— and —$C_6H_4$—, and may carry no further substituents or from 1 to 10 further substituents selected from the group consisting of halogen, cyano and nitro. Most preferred L is a group of formula

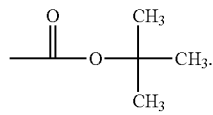

The synthesis of the compounds of formula Br-A-Br is described in WO05/049695, WO08/000664, and WO09/047104, or can be done in analogy to the methods described therein. The synthesis of N-aryl substituted compounds of formula Br-A-Br can be done in analogy to the methods described in U.S. Pat. No. 5,354,869 and WO03/022848.

In another embodiment the present invention is directed to polymers of formula III.

In said embodiment polymers are preferred, comprising one or more (repeating) unit(s) of the formula

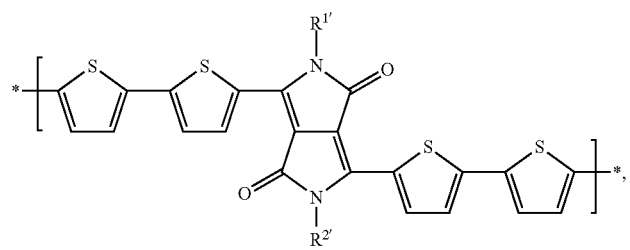

(IIIa)

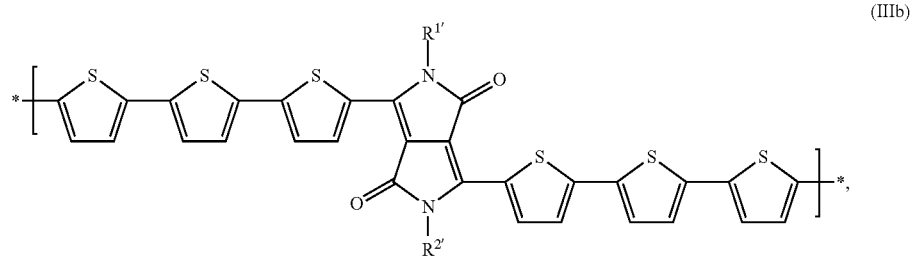

(IIIb)

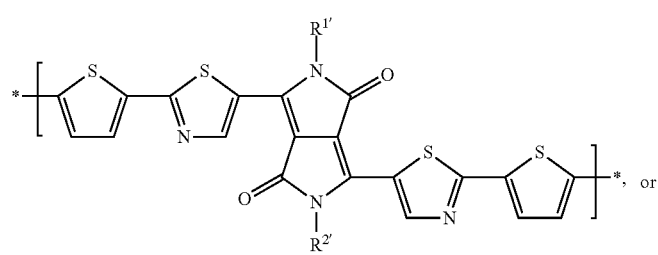

(IIIc), or

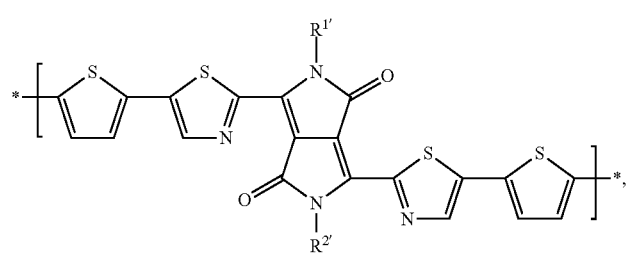

(IIId)

wherein $R^{1'}$ and $R^{2'}$ may be the same or different and are selected from a $C_8$-$C_{36}$alkyl group.

In another preferred embodiment the present invention is directed to homopolymers of the formula

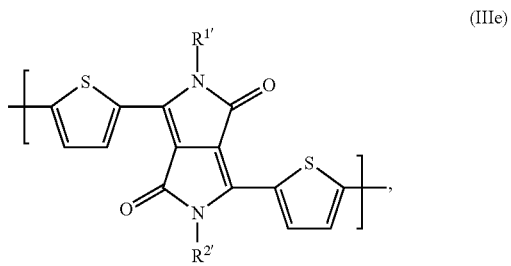

(IIIe)

or copolymers of formula

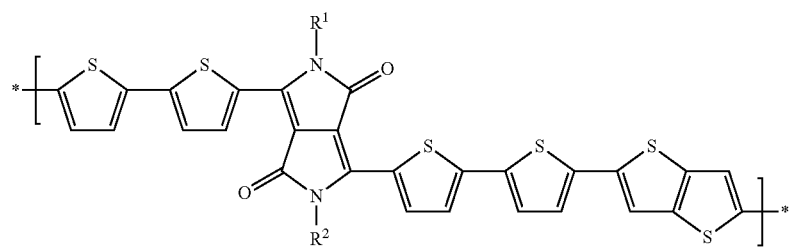

(IIIm″)

wherein $R^1$, $R^2$, $R^{1'}$ and $R^{2'}$ are a branched $C_8$-$C_{36}$alkyl group, especially a branched $C_{12}$-$C_{24}$alkyl group, or a copolymer of formula

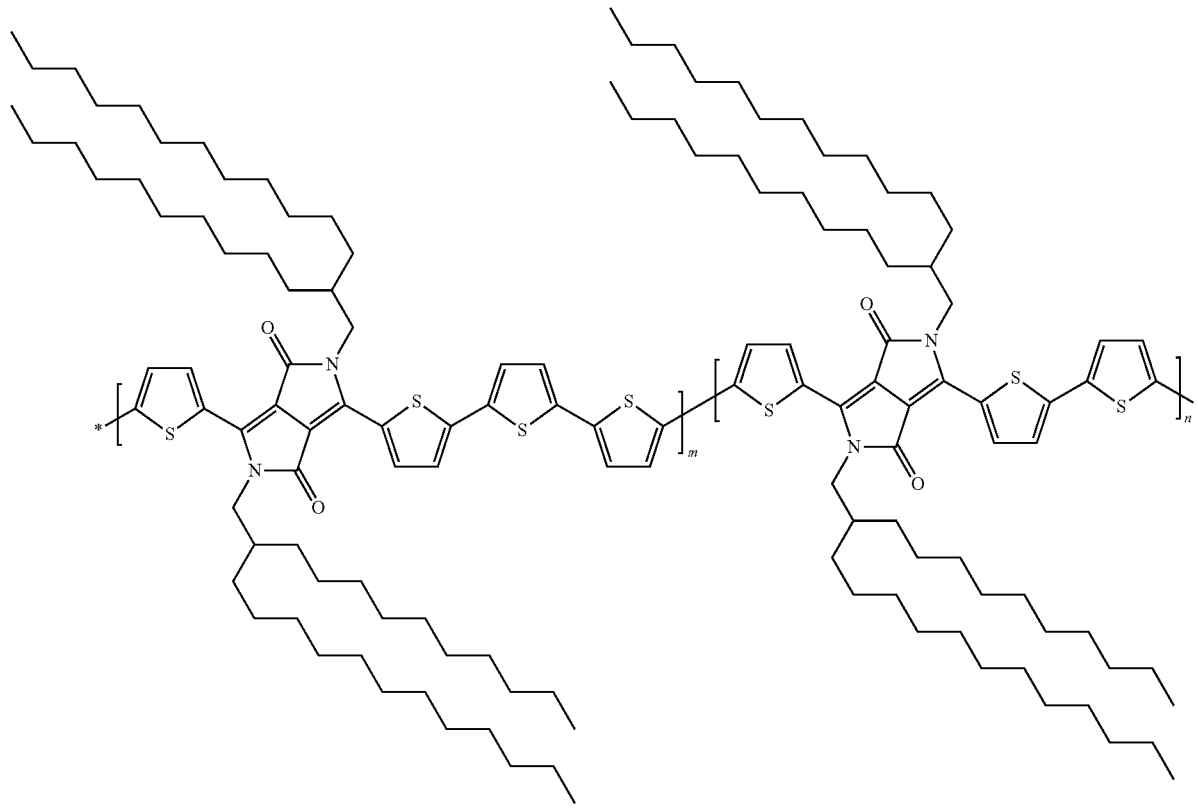

having a Mw of 51'500 and a Polydispersity of 2.0 (measured by HT-GPC).

The polymers comprising repeating units of formula III are preferably homopolymers, which can be prepared by dehalogenative polycondensation (reductive coupling) of the corresponding dihaloaromatic compounds such as Br-A-Br with 0-valent Ni complexes (Yamamoto coupling reaction). As Nickel source bis(cyclooctadiene)nickel can be used in combination with bipyridine, triarylphosphine or trialyklphosphine. Reference is, for example, made to T. Yamamoto, et al., Synthetic Metals (1993), 55(2-3), 1214-20.

Alternatively, such polymers can be prepared by reacting a dihalogenide $X^{10}$-A-$X^{10}$ with an equimolar amount of a diboronic acid or diboronate corresponding to formula $X^{11}$-A-$X^{11}$.

A further embodiment of the present invention is directed to compounds of formula

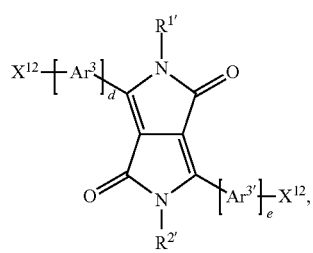

(X)

wherein
d is an integer 1, 2, or 3,
e is an integer 1, 2, or 3,
$Ar^3$ and $Ar^{3'}$ are independently of each other a group of formula

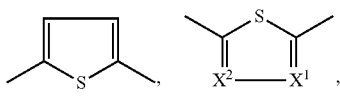

or a group —Ar⁴—Ar⁵—[Ar⁶]$_f$—,
Ar⁴ is a group of formula

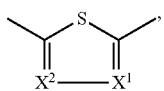

Ar⁵ and Ar⁶ have independently of each other the meaning of Ar³, f is 0, or an integer 1, R¹' and R²' are as defined in claim 1, $X^{12}$ is —B(OH)$_2$, —B(OY¹)$_2$,

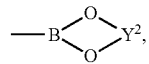

—BF$_3$Na, —BF$_3$N(Y¹⁵)$_4$, or —BF$_3$K, wherein Y¹ is independently in each occurrence a $C_1$-$C_{10}$alkyl group and Y² is independently in each occurrence a $C_2$-$C_{10}$alkylene group, such as —CY³Y⁴—CY⁵Y⁶—, or —CY⁷Y⁸—CY⁹Y¹⁰—CY¹¹Y¹²—, wherein Y³, Y⁴, Y⁵, Y⁶, Y⁷, Y⁸, Y⁹, Y¹⁰, Y¹¹ and Y¹² are independently of each other hydrogen, or a $C_1$-$C_{10}$alkyl group, especially —C(CH$_3$)$_2$C(CH$_3$)$_2$—, or —C(CH$_3$)$_2$CH$_2$C(CH$_3$)$_2$— and Y¹⁵ is H, or a $C_1$-$C_{25}$alkyl group, which may optionally be interrupted by O.

The compounds of formula X represent intermediates for the synthesis of the polymers of the present invention. Specific examples of such compounds are shown below:

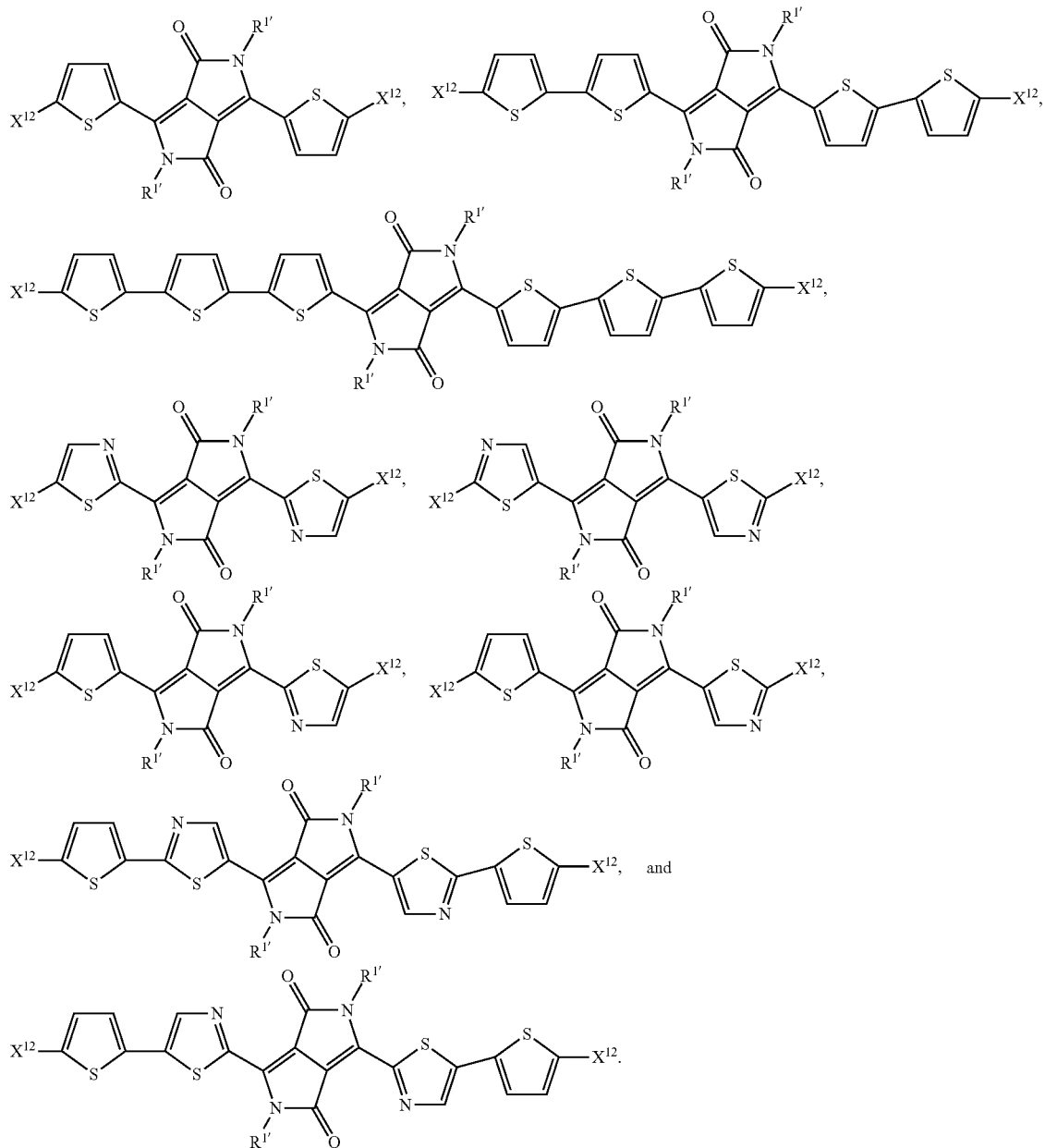

The polymers of the invention can be used as the semiconductor layer in semiconductor devices. Accordingly, the present invention also relates to semiconductor devices, comprising a polymer of the present invention, or an organic semiconductor material, layer or component. The semiconductor device is especially an organic field effect transistor (OFET).

There are numerous types of semiconductor devices. Common to all is the presence of one or more semiconductor materials. Semiconductor devices have been described, for example, by S. M. Sze in Physics of Semiconductor Devices, $2^{nd}$ edition, John Wiley and Sons, New York (1981). Such devices include rectifiers, transistors (of which there are many types, including p-n-p, n-p-n, and thin-film transistors), light emitting semiconductor devices (for example, organic light emitting diodes in display applications or backlight in e.g. liquid crystal displays), photoconductors, current limiters, solar cells, thermistors, p-n junctions, field-effect diodes, Schottky diodes, and so forth. In each semiconductor device, the semiconductor material is combined with one or more metals, metal oxides, such as, for example, indium tin oxide (ITO), and/or insulators to form the device. Semiconductor devices can be prepared or manufactured by known methods such as, for example, those described by Peter Van Zant in Microchip Fabrication, Fourth Edition, McGraw-Hill, New York (2000). In particular, organic electronic components can be manufactured as described by D. R. Gamota et al. in Printed Organic and Molecular Electronics, Kluver Academic Publ., Boston, 2004.

A particularly useful type of transistor device, the thin-film transistor (TFT), generally includes a gate electrode, a gate dielectric on the gate electrode, a source electrode and a drain electrode adjacent to the gate dielectric, and a semiconductor layer adjacent to the gate dielectric and adjacent to the source and drain electrodes (see, for example, S. M. Sze, Physics of Semiconductor Devices, $2^{nd}$ edition, John Wiley and Sons, page 492, New York (1981)). These components can be assembled in a variety of configurations. More specifically, an OFET has an organic semiconductor layer.

Typically, a substrate supports the OFET during manufacturing, testing, and/or use. Optionally, the substrate can provide an electrical function for the OFET. Useful substrate materials include organic and inorganic materials. For example, the substrate can comprise silicon materials inclusive of various appropriate forms of silicon, inorganic glasses, ceramic foils, polymeric materials (for example, acrylics, polyester, epoxies, polyamides, polycarbonates, polyimides, polyketones, poly(oxy-1,4-phenyleneoxy-1,4-phenylenecarbonyl-1,4-phenylene) (sometimes referred to as poly(ether ether ketone) or PEEK), polynorbornenes, polyphenyleneoxides, poly(ethylene naphthalenedicarboxylate) (PEN), poly(ethylene terephthalate) (PET), poly(phenylene sulfide) (PPS)), filled polymeric materials (for example, fiber-reinforced plastics (FRP)), and coated metallic foils.

The gate electrode can be any useful conductive material. For example, the gate electrode can comprise doped silicon, or a metal, such as aluminum, chromium, gold, silver, nickel, palladium, platinum, tantalum, and titanium. Conductive oxides, such as indium tin oxide, or conducting inks/pastes comprised of carbon black/graphite or colloidal silver dispersions, optionally containing polymer binders can also be used. Conductive polymers also can be used, for example polyaniline or poly(3,4-ethylenedioxythiophene)/poly(styrene sulfonate) (PEDOT:PSS). In addition, alloys, combinations, and multilayers of these materials can be useful. In some OFETs, the same material can provide the gate electrode function and also provide the support function of the substrate. For example, doped silicon can function as the gate electrode and support the OFET.

The gate dielectric is generally provided on the gate electrode. This gate dielectric electrically insulates the gate electrode from the balance of the OFET device. Useful materials for the gate dielectric can comprise, for example, an inorganic electrically insulating material.

The gate dielectric (insulator) can be a material, such as, an oxide, nitride, or it can be a material selected from the family of ferroelectric insulators (e.g. organic materials such as poly(vinylidene fluoride/trifluoroethylene or poly(m-xylylene adipamide)), or it can be an organic polymeric insulator (e.g. poly(methacrylate)s, poly(acrylate)s, polyimides, benzocyclobutenes (BCBs), parylenes, polyvinylalcohol, polyvinylphenol (PVP), polystyrenes, polyester, polycarbonates) as for example described in J. Veres et al. Chem. Mat. 2004, 16, 4543 or A. Facchetti et al. Adv. Mat. 2005, 17, 1705. Specific examples of materials useful for the gate dielectric include strontiates, tantalates, titanates, zirconates, aluminum oxides, silicon oxides, tantalum oxides, titanium oxides, silicon nitrides, barium titanate, barium strontium titanate, barium zirconate titanate, zinc selenide, and zinc sulphide, including but not limited to $PbZr_xTi_{1-x}O_3$ (PZT), $Bi_4Ti_3O_{12}$, $BaMgF_4$, $Ba(Zr_{1-x}Ti_x)O_3$ (BZT). In addition, alloys, hybride materials (e.g. polysiloxanes or nanoparticle-filled polymers) combinations, and multilayers of these materials can be used for the gate dielectric. The thickness of the dielectric layer is, for example, from about 10 to 1000 nm, with a more specific thickness being about 100 to 500 nm, providing a capacitance in the range of 0.1-100 nanofarads (nF).

The source electrode and drain electrode are separated from the gate electrode by the gate dielectric, while the organic semiconductor layer can be over or under the source electrode and drain electrode. The source and drain electrodes can be any useful conductive material favourably providing a low resistance ohmic contact to the semiconductor layer. Useful materials include most of those materials described above for the gate electrode, for example, aluminum, barium, calcium, chromium, gold, silver, nickel, palladium, platinum, titanium, polyaniline, PEDOT:PSS, other conducting polymers, alloys thereof, combinations thereof, and multilayers thereof. Some of these materials are appropriate for use with n-type semiconductor materials and others are appropriate for use with p-type semiconductor materials, as is known in the art.

The thin film electrodes (that is, the gate electrode, the source electrode, and the drain electrode) can be provided by any useful means such as physical vapor deposition (for example, thermal evaporation or sputtering) or (ink jet) printing methods. The patterning of these electrodes can be accomplished by known methods such as shadow masking, additive photolithography, subtractive photolithography, printing, microcontact printing, and pattern coating.

The present invention further provides an organic field effect transistor device comprising
a plurality of electrically conducting gate electrodes disposed on a substrate;
a gate insulator layer disposed on said electrically conducting gate electrodes;
a plurality of sets of electrically conductive source and drain electrodes disposed on said insulator layer such that each of said sets is in alignment with each of said gate electrodes;

an organic semiconductor layer disposed in the channel between source and drain electrodes on said insulator layer substantially overlapping said gate electrodes; wherein said organic semiconductor layer comprises a polymer of the present invention, or a mixture containing a polymer of the present invention.

The present invention further provides a process for preparing a thin film transistor device comprising the steps of:

depositing a plurality of electrically conducting gate electrodes on a substrate;

depositing a gate insulator layer on said electrically conducting gate electrodes;

depositing a plurality of sets of electrically conductive source and drain electrodes on said layer such that each of said sets is in alignment with each of said gate electrodes;

depositing a layer of a polymer of the present invention on said insulator layer such that said layer of the compound of the present invention, or a mixture containing a polymer of the present invention, substantially overlaps said gate electrodes; thereby producing the thin film transistor device.

A mixture containing a polymer of the present invention results in a semi-conducting layer comprising a polymer of the present invention (typically 5% to 99.9999% by weight, especially 20 to 85% by weight) and at least another material. The other material can be, but is not restricted to a fraction of the same polymer of the present invention with different molecular weight, another polymer of the present invention, a semi-conducting polymer, organic small molecules, carbon nanotubes, a fullerene derivative, inorganic particles (quantum dots, quantum rods, quantum tripods, $TiO_2$, ZnO etc.), conductive particles (Au, Ag etc.), insulator materials like the ones described for the gate dielectric (PET, PS etc.).

Accordingly, the present invention also relates to an organic semiconductor material, layer or component, comprising a polymer according to the present invention.

The polymers of the present invention can be blended with small molecules described, for example, in European patent application no. 09155919.5, WO09/047104, U.S. Pat. No. 6,690,029, WO2007082584, and WO2008107089.

WO2007082584:

(I1)

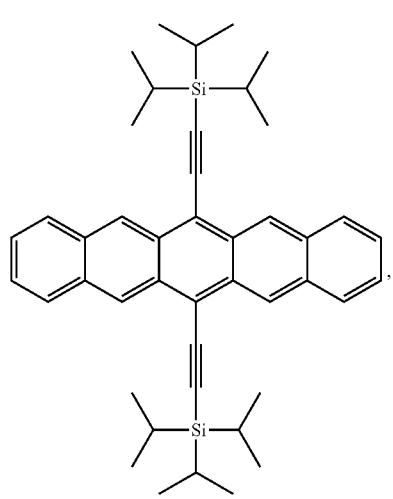

-continued (I2)

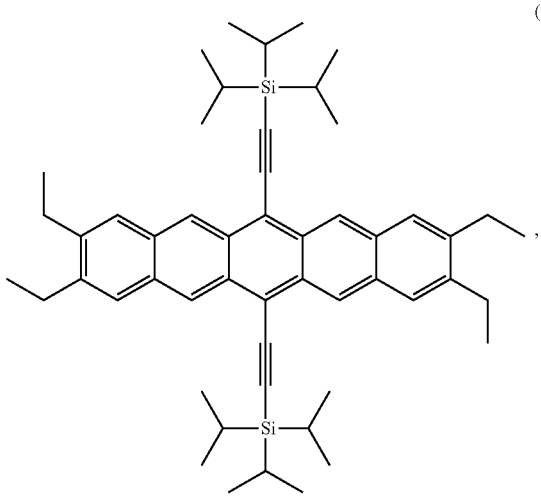

(I3)

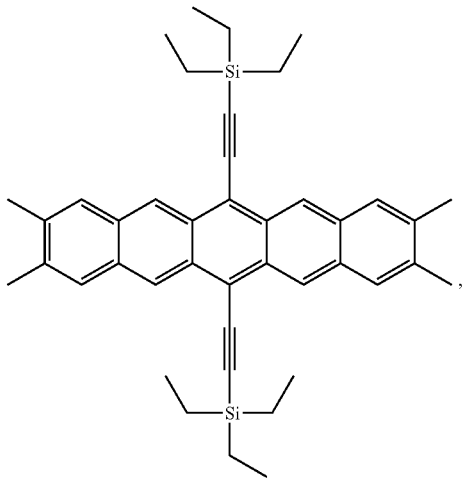

(I4)

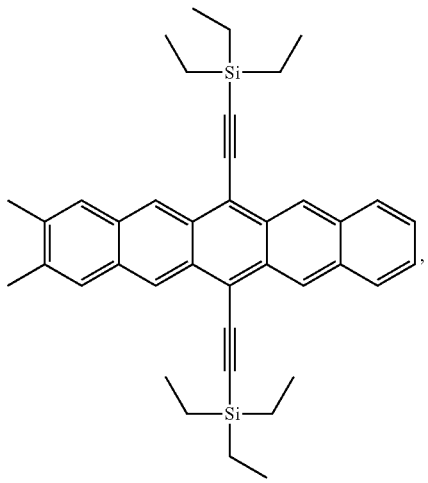

-continued (I5)
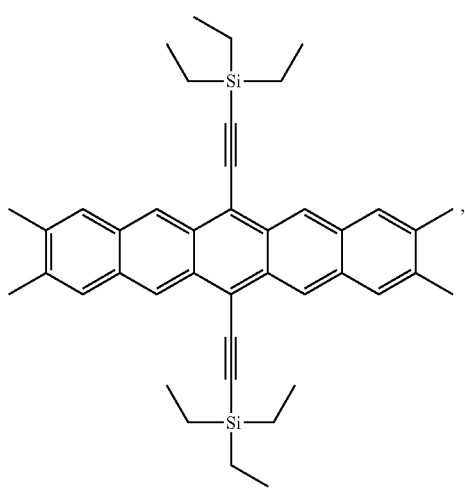

(I6)
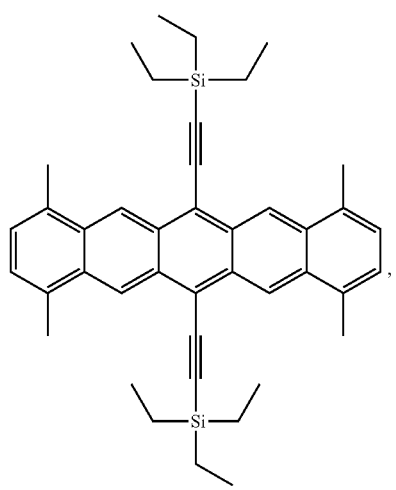

(I7)
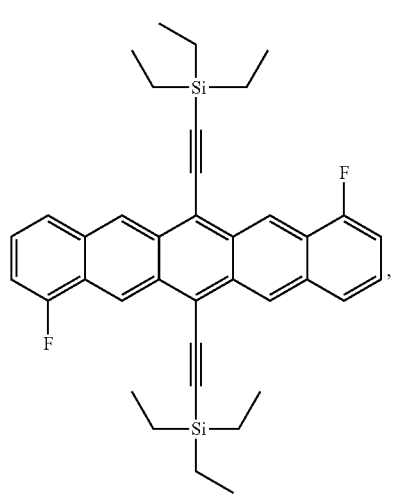

-continued (I8)
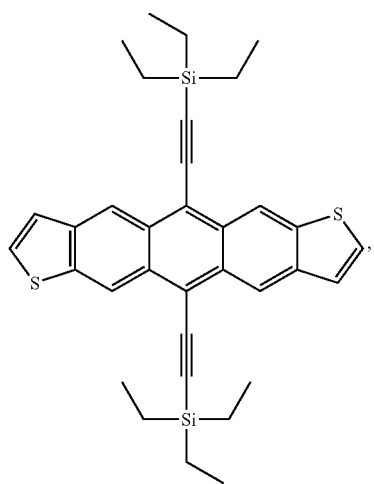

(I9)
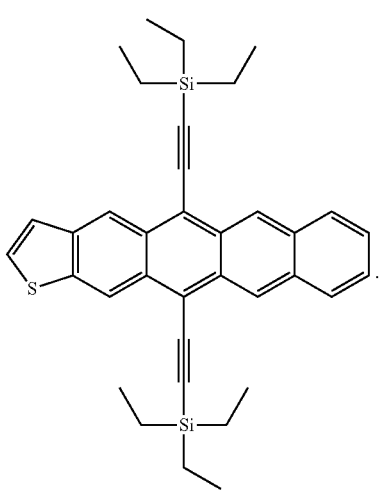

WO2008107089:

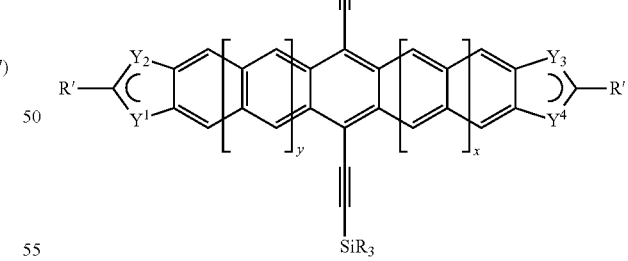

wherein one of $Y_1$ and $Y_2$ denotes —CH= or =CH— and the other denotes —X—, one of $Y_3$ and $Y_4$ denotes —CH= or =CH— and the other denotes —X—, X is —O—, —S—, —Se— or —NR'''—, $R_3$ is cyclic, straight-chain or branched alkyl or alkoxy having 1 to 20 C-atoms, or aryl having 2-30 C-atoms, all of which are optionally fluorinated or perfluorinated, R' is H, F, Cl, Br, I, CN, straight-chain or branched alkyl or alkoxy having 1 to 20 C-atoms and optionally being fluorinated or perfluorinated, optionally fluorinated or perfluorinated aryl having 6 to 30 C-atoms, or $CO_2R''$, with R'' being H, optionally fluorinated alkyl having 1 to 20 C-atoms, or optionally fluorinated aryl having 2 to 30 C-atoms, R'" is H or cyclic, straight-chain or branched alkyl with 1 to 10 C-atoms, y is 0, or 1, x is 0, or 1.

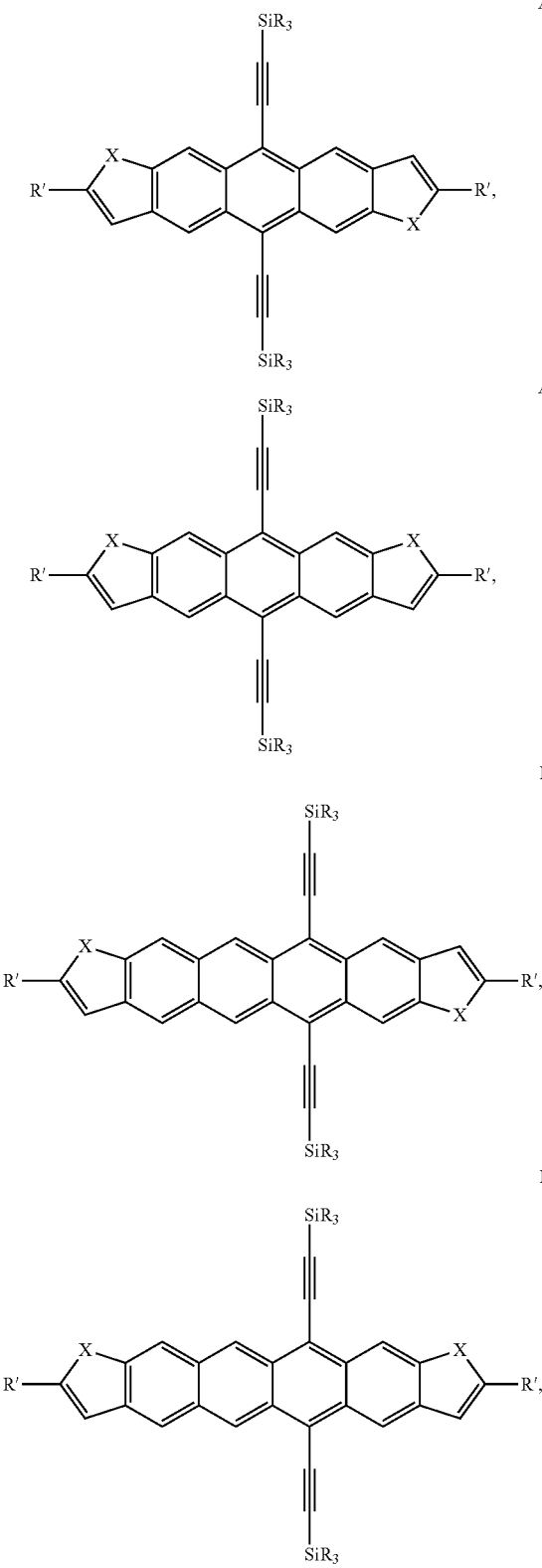

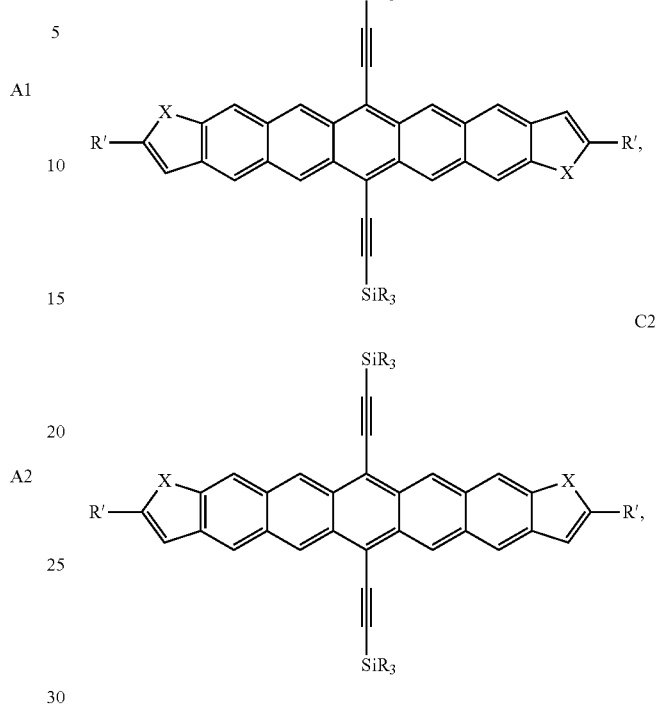

The polymer can contain a small molecule, or a mixture of two, or more small molecule compounds.

Alternatively, an OFET is fabricated by, for example, by solution deposition of a polymer on a highly doped silicon substrate covered with a thermally grown oxide layer followed by vacuum deposition and patterning of source and drain electrodes.

In yet another approach, an OFET is fabricated by deposition of source and drain electrodes on a highly doped silicon substrate covered with a thermally grown oxide and then solution deposition of the polymer to form a thin film.

The gate electrode could also be a patterned metal gate electrode on a substrate or a conducting material such as, a conducting polymer, which is then coated with an insulator applied either by solution coating or by vacuum deposition on the patterned gate electrodes.

Any suitable solvent can be used to dissolve, and/or disperse the polymers of the present application, provided it is inert and can be removed partly, or completely from the substrate by conventional drying means (e.g. application of heat, reduced pressure, airflow etc.). Suitable organic solvents for processing the semiconductors of the invention include, but are not limited to, aromatic or aliphatic hydrocarbons, halogenated such as chlorinated or fluorinated hydrocarbons, esters, ethers amides, such as chloroform, tetrachloroethane, tetrahydrofuran, toluene, tetraline, decaline, anisole, xylene, ethyl acetate, methyl ethyl ketone, dimethyl formamide, chloroform, chlorobenzene, dichlorobenzene, trichlorobenzene, propylene glycol monomethyl ether acetate (PGMEA) and mixtures thereof. Preferred solvents are xylene, toluene, tetraline, decaline, chlorinated ones such as chloroform, chlorobenzene, ortho-dichlorobenzene, trichlorobenzene and mixtures thereof. The solution, and/or dispersion is then applied by a method, such as, spin-coating, dip-coating, screen printing, microcontact printing, doctor blading or other solution application techniques known in the art on the substrate to obtain thin films of the semiconducting material.

The term "dispersion" covers any composition comprising the semiconductor material of the present invention, which is not fully dissolved in a solvent. The dispersion can be done selecting a composition including at least a polymer of the present invention, or a mixture containing a polymer of the present invention, and a solvent, wherein the polymer exhibits lower solubility in the solvent at room temperature but exhibits greater solubility in the solvent at an elevated temperature, wherein the composition gels when the elevated temperature is lowered to a first lower temperature without agitation;

dissolving at the elevated temperature at least a portion of the polymer in the solvent; lowering the temperature of the composition from the elevated temperature to the first lower temperature; agitating the composition to disrupt any gelling, wherein the agitating commences at any time prior to, simultaneous with, or subsequent to the lowering the elevated temperature of the composition to the first lower temperature; depositing a layer of the composition wherein the composition is at a second lower temperature lower than the elevated temperature; and drying at least partially the layer.

The dispersion can also be constituted of (a) a continuous phase comprising a solvent, a binder resin, and optionally a dispersing agent, and (b) a disperse phase comprising a polymer of the present invention, or a mixture containing a polymer of the present invention. The degree of solubility of the polymer of the present invention in the solvent may vary for example from 0% to about 20% solubility, particularly from 0% to about 5% solubility.

Preferably, the thickness of the organic semiconductor layer is in the range of from about 5 to about 1000 nm, especially the thickness is in the range of from about 10 to about 100 nm.

The polymers of the invention can be used alone or in combination as the organic semiconductor layer of the semiconductor device. The layer can be provided by any useful means, such as, for example, vapor deposition (for materials with relatively low molecular weight) and printing techniques. The compounds of the invention may be sufficiently soluble in organic solvents and can be solution deposited and patterned (for example, by spin coating, dip coating, ink jet printing, gravure printing, flexo printing, offset printing, screen printing, microcontact (wave)-printing, drop or zone casting, or other known techniques).

The polymers of the invention can be used in integrated circuits comprising a plurality of OTFTs, as well as in various electronic articles. Such articles include, for example, radio-frequency identification (RFID) tags, backplanes for flexible displays (for use in, for example, personal computers, cell phones, or handheld devices), smart cards, memory devices, sensors (e.g. light-, image-, bio-, chemo-, mechanical- or temperature sensors), especially photodiodes, or security devices and the like. Due to its solid state fluorescence the material can also be used in Organic Light Emitting Transistors (OLET).

A further aspect of the present invention is an organic semiconductor material, layer or component comprising one or more polymers of the present invention. A further aspect is the use of the polymers or materials of the present invention in an organic field effect transistor (OFET). A further aspect is an OFET comprising a polymer or material of the present invention.

The polymers of the present invention are typically used as organic semiconductors in form of thin organic layers or films, preferably less than 30 microns thick. Typically the semiconducting layer of the present invention is at most 1 micron (=1 µm) thick, although it may be thicker if required. For various electronic device applications, the thickness may also be less than about 1 micron thick. For example, for use in an OFET the layer thickness may typically be 100 nm or less. The exact thickness of the layer will depend, for example, upon the requirements of the electronic device in which the layer is used.

For example, the active semiconductor channel between the drain and source in an OFET may comprise a layer of the present invention.

An OFET device according to the present invention preferably comprises:
a source electrode,
a drain electrode,
a gate electrode,
a semiconducting layer,
one or more gate insulator layers, and
optionally a substrate, wherein the semiconductor layer comprises one or more polymers of the present invention.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer.

Preferably the OFET comprises an insulator having a first side and a second side, a gate electrode located on the first side of the insulator, a layer comprising a polymer of the present invention located on the second side of the insulator, and a drain electrode and a source electrode located on the polymer layer.

The OFET device can be a top gate device or a bottom gate device.

Suitable structures and manufacturing methods of an OFET device are known to the skilled in the art and are described in the literature, for example in WO03/052841.

The gate insulator layer may comprise for example a fluoropolymer, like e.g. the commercially available Cytop 809M®, or Cytop 107M® (from Asahi Glass). Preferably the gate insulator layer is deposited, e.g. by spin-coating, doctor blading, wire bar coating, spray or dip coating or other known methods, from a formulation comprising an insulator material and one or more solvents with one or more fluoro atoms (fluorosolvents), preferably a perfluorosolvent. A suitable perfluorosolvent is e.g. FC75e (available from Acros, catalogue number 12380). Other suitable fluoropolymers and fluorosolvents are known in prior art, like for example the perfluoropolymers Teflon AF® 1600 or 2400 (from DuPont), or Fluoropel® (from Cytonix) or the perfluorosolvent FC 43® (Acros, No. 12377).

The semiconducting layer comprising a polymer of the present invention may additionally comprise at least another material. The other material can be, but is not restricted to another polymer of the present invention, a semi-conducting polymer, a polymeric binder, organic small molecules different from a polymer of the present invention, carbon nanotubes, a fullerene derivative, inorganic particles (quantum dots, quantum rods, quantum tripods, $TiO_2$, ZnO etc.), conductive particles (Au, Ag etc.), and insulator materials like the ones described for the gate dielectric (PET, PS etc.). As stated above, the semiconductive layer can also be composed of a mixture of one or more polymers of the present invention and a polymeric binder. The ratio of the polymers of the present invention to the polymeric binder can vary from 5 to 95 percent. Preferably, the polymeric binder is a semicristalline polymer such as polystyrene (PS), high-density polyethylene (HDPE), polypropylene (PP) and polymethylmethacrylate (PMMA). With this technique, a degradation of the electrical performance can be avoided (cf. WO2008/001123A1).

Digital circuits are largely based on complimentary metal oxide (CMOS) structures that use both p-type and n-type unipolar transistors. The advantages of CMOS circuits are lower power dissipation, greater speed, and greater tolerance of variability and shifts in transistor operating characteristics. These CMOS circuits may be constructed using unipolar transistors with either p-type or n-type semiconductors.

For example poly[2-methoxyx-5-(3',7'-dimethylocty-loxy)]-p-phenylene vinylene ($OC_1C_{10}$-PPV) p-type semiconductor and [6,6]-phenyl $C_{61}$-butyric acid methyl ester (PCBM) n-type semiconductor each show mobilities of about $10^{-2}$ cm$^2$/Vs when each is used as an unipolar transistor. However the mobility of these semiconductors decreases to $10^{-04}$ cm2/Vs and $10^{-05}$ cm2/Vs, respectively, in ambipolar transistors with a mixture of $OC_1C_{10}$-PPV and PCBM [E. J. Meijer, et al Nature Materials, 2003, Vol. 2 page 678). WO2008/122778 discloses an improved blend composition to achieve a balanced mobility but still the mobility is low. At these levels, the mobility is too low to have practical use for electronic devices such as radio frequency identification tags.

Fabrication of discrete organic n- and p-channel transistors with lateral dimensions of a few micrometers, typically required for large scale integration, is still very challenging.

In order to design more efficient circuits based on solution processable transistors, there is an urgent need for complementary technology, where both p-type and n-type operation are realized as single component transistor. Ideally, the transistor should exhibit high mobility, balanced on current and/or balanced mobility.

US20080099758 and WO20080246095 disclose single component ambipolar polymers and monomers which show hole and electron mobilities in the order of $2\times10^{-4}$ cm$^2$/Vs, Adv. Material. 2008, 20, 2217-2224 discloses as example a homopolymer according formula

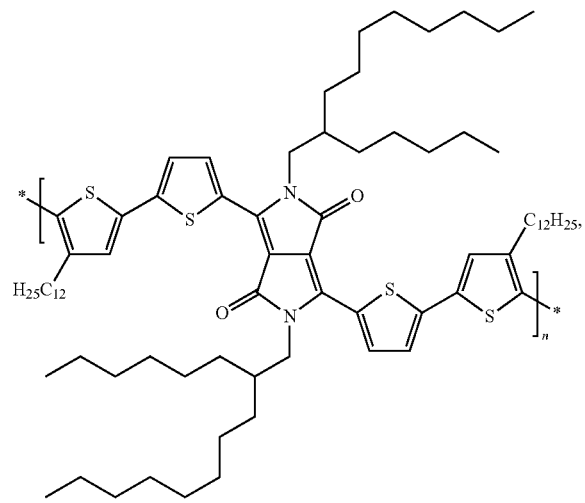

measured in different device configurations that reach maximum values of hole mobility of 0.05 cm$^2$/Vs the electron mobility was not determined using bottom contact gold electrodes. Using top contact gold electrodes 0.11 cm$^2$/Vs for hole mobility and electron mobilities in the range of 0.04-0.09 cm$^2$/Vs are determined. The polymers of the present invention can show up a factor 5 to 10 better hole and electron mobility in a bottom gate bottom contact device structure. Due to low contact resistance of this type of polymers the ambipolarity can be induced by a single contact material like gold for both type of carriers, no longer relying on reactive low work function metals such as Ca, Mg for injecting electrons. Injection is even achieved with Ag and Cu or alloys thereof as source and drain electrodes.

For example, using top contact gold electrodes 0.43 cm$^2$/Vs for hole mobility and electron mobilities in the range of 0.35 cm$^2$/Vs are determined for the polymer of example 1:

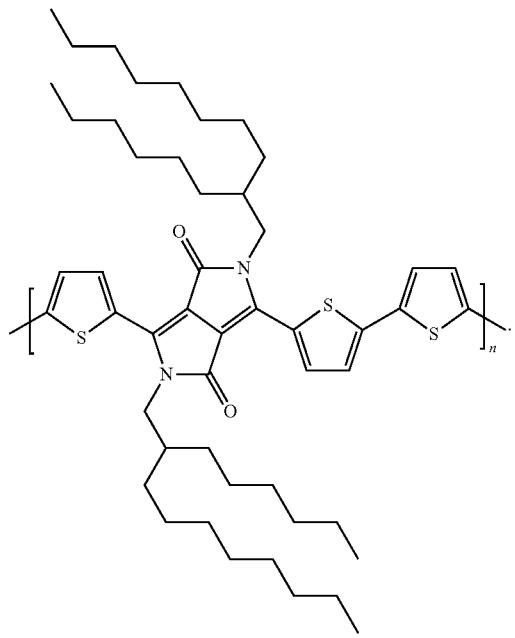

Accordingly, the present invention also provides an ambipolar organic field effect transistor (OFET), comprising a p-type and n-type behaviour, especially an organic thin film transistor (OTFT), comprising a gate electrode, a gate insulating layer, an organic active layer, and source/drain electrodes on a substrate, wherein the organic active layer includes a polymer of the present invention. Preferably, the active layer is composed of a polymer of the present invention. The composition of the active (semiconductor) layer is such as to transport both electrons and holes, with the mobility of the holes being substantially equal to the mobility of the electrons, such that the transistor substantially exhibits ambipolarity in its transfer characteristics.

The ambipolar OTFT may include a substrate, a gate electrode, a gate insulating layer, source/drain electrodes, and an active layer, or alternatively may include a substrate, a gate electrode, a gate insulating layer, an active layer, and source/drain electrodes, but example embodiments may not be limited thereto.

In order to form the organic active layer using the polymer of the present invention, a composition for the organic active layer including chloroform or chlorobenzene may be used. Examples of the solvent used in the composition for the organic active layer may include chloroform, chlorobenzene, dichlorobenzene, trichlorobenzene, and toluene.

Examples of the process of forming the organic active layer may include, but may not be limited to, screen printing, printing, spin coating, dipping or ink jetting. As such, in the gate insulating layer included in the ambipolar OTFT any insulator having a high dielectric constant may be used as long as it is typically known in the art. Specific examples thereof may include, but may not be limited to, a ferroelectric insulator, including $Ba_{0.33}Sr_{0.66}TiO_3$ (BST: Barium Strontium Titanate), $Al_2O_3$, $Ta_2O_5$, $La_2O_5$, $Y_2O_5$, or $TiO_2$, an inorganic insulator, including $PbZr_{0.33}Ti_{0.66}O_3$ (PZT), $Bi_4Ti_3O_{12}$, $BaMg\ F_4$, $SrBi_2(TaNb)_2O_9$, $Ba(ZrTi)O_3$(BZT), $BaTiO_3$, $SrTiO_3$, $Bi_4Ti_3O_{12}$, $SiO_2$, $SiN_x$, or AlON, or an organic insulator, including polyimide, benzocyclobutane (BCB), parylene, polyvinylalcohol, or polyvinylphenol. In the gate electrode and the source/drain electrodes included in the ambipolar OTFT of the present invention, a typical metal may be used, specific examples thereof include, but are not limited to, gold (Au), silver (Ag), copper (Cu), aluminum (Al), nickel (Ni), and indium tin oxide (ITO). Preferably, the material of at least one of the gate, source and drain electrodes is selected from the group Cu, Ag, Au or alloys thereof. Examples of material for the substrate in the ambipolar OTFT of the present invention may include, but may not be limited to, glass, polyethylenenaphthalate (PEN), polyethyleneterephthalate (PET), polycarbonate, polyvinylalcohol, polyacrylate, polyimide, polynorbornene, or polyethersulfone (PES).

The present invention also provides an electronic device comprising the ambipolar organic field effect transistor (OFET), especially the organic thin film transistor (OTFT) of the present invention. Because the polymer of the present invention serves to improve the device characteristics of an ambipolar organic thin film transistor, the polymer may be effectively used to fabricate a variety of electronic devices, including liquid crystal display (LCD) devices, photovoltaic devices, organic light-emitting devices (OLEDs), sensors, memory devices and/or integrated circuits.

The method of fabricating an ambipolar organic thin film transistor may include forming a gate electrode, a gate insulating layer, an organic active layer, and source/drain electrodes on a substrate, wherein the organic active layer includes the polymer of the present invention. The organic active layer may be formed into a thin film through screen printing, printing, spin coating, dipping or ink jetting. The insulating layer may be formed using material selected from the group consisting of a ferroelectric insulator, including $Ba_{0.33}Sr_{0.66}TiO_3$ (BST: Barium Strontium Titanate), $Al_2O_3$, $Ta_2O_5$, $La_2O_5$, $Y_2O_5$, or $TiO_2$, an inorganic insulator, including $PbZr_{0.33}Ti_{0.66}O_3$ (PZT), $Bi_4Ti_3O_{12}$, $BaMg\ F_4$, $SrBi_2(TaNb)_2O_9$, $Ba(ZrTi)O_3$(BZT), $BaTiO_3$, $SrTiO_3$, $Bi_4Ti_3O_{12}$, $SiO_2$, $SiN_x$, or AlON, or an organic insulator, including polyimide, benzocyclobutane (BCB), parylene, polyvinylalcohol, or polyvinylphenol The substrate may be formed using material selected from the group consisting of glass, polyethylenenaphthalate (PEN), polyethyleneterephthalate (PET), polycarbonate, polyvinylalcohol, polyacrylate, polyimide, polynorbornene, and polyethersulfone (PES). The gate electrode and the source/drain electrodes may be formed using material selected from the group consisting of gold (Au), silver (Ag), copper (Cu), aluminum (Al), nickel (Ni), and indium tin oxide (ITO).

The polymers of the present invention may also be used in organic photovoltaic (PV) devices (solar cells). Accordingly, the invention provides PV devices comprising a polymer according to the present invention.

The PV device comprise in this order:
(a) a cathode (electrode),
(b) optionally a transition layer, such as an alkali halogenide, especially lithium fluoride,
(c) a photoactive layer,
(d) optionally a smoothing layer,
(e) an anode (electrode),
(f) a substrate.

The photoactive layer comprises the polymers of the present invention. Preferably, the photoactive layer is made of a conjugated polymer of the present invention, as an electron donor and an acceptor material, like a fullerene, particularly a functionalized fullerene PCBM, as an electron acceptor.

For heterojunction solar cells the active layer comprises preferably a mixture of a polymer of the present invention and a fullerene, such as [60]PCBM (=6,6-phenyl-$C_{61}$-butyric acid methyl ester), or [70]PCBM, in a weight ratio of 1:1 to 1:3.

Further preferred is an integrated circuit comprising a field effect transistor according to the present invention.

The following examples are included for illustrative purposes only and do not limit the scope of the claims. Unless otherwise stated, all parts and percentages are by weight. Weight-average molecular weight (Mw) and polydispersity (Mw/Mn=PD) are determined by Heat Temperature Gel Permeation Chromatography (HT-GPC) [Apparatus: GPC PL 220 from Polymer laboratories (Church Stretton, UK; now Varian) yielding the responses from refractive index (RI), Chromatographic conditions: Column: 3 "PLgel Olexis" column from Polymer Laboratories (Church Stretton, UK); with an average particle size of 13 µm (dimensions 300×8 mm I.D.) Mobile phase: 1,2,4-trichlorobenzene purified by vacuum distillation and stabilised by butylhydroxytoluene (BHT, 200 mg/l), Chromatographic temperature: 150° C.; Mobile phase flow: 1 ml/min; Solute concentration: about 1 mg/ml; Injection volume: 200 µl; Detection: RI, Procedure of molecular weight calibration: Relative calibration is done by use of a set of 10 polystyrene calibration standards obtained from Polymer Laboratories (Church Stretton, UK) spanning the molecular weight range from 1,930,000 Da-5,050 Da, i. e., PS 1,930,000, PS 1,460,000, PS 1,075,000, PS 560,000, PS 330,000, PS 96,000, PS 52,000, PS 30,300, PS 10,100, PS 5,050 Da. A polynomic calibration is used to calculate the molecular weight.

All polymer structures given in the examples below are idealized representations of the polymer products obtained via the polymerization procedures described. If more than two components are copolymerized with each other sequences in the polymers can be either alternating or random depending on the polymerisation conditions.

EXAMPLES

Example 1

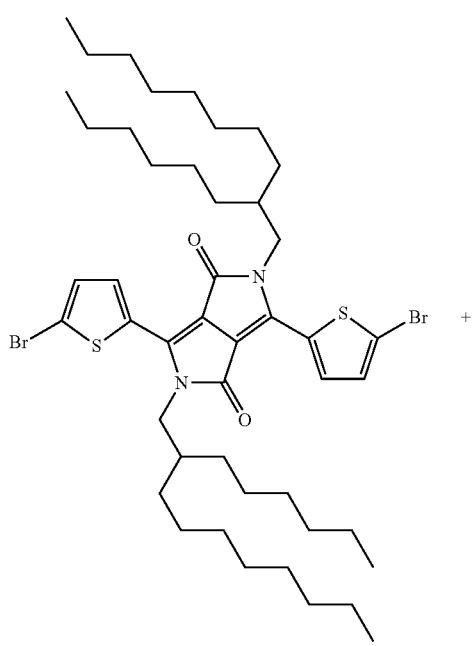

1

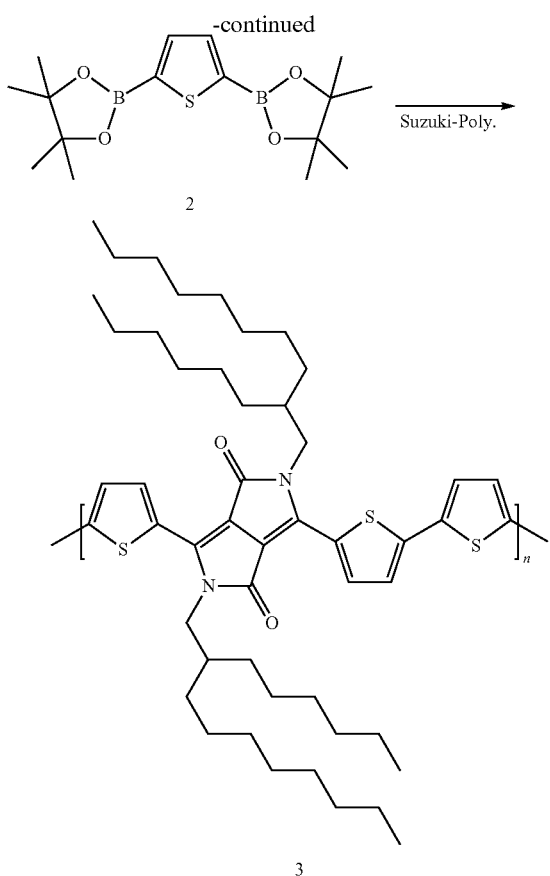

Starting material 1 for polymer 3 is prepared according to Example 2a of WO2008000664. In a three neck-flask, 1.45 g of potassium phosphate ($K_3PO_4$) dissolved in 5 ml of water (previously degassed) is added to a degassed solution of 2.07 g of 1, 0.74 g of 2,5-thiopheneboronic acid bis (pinacol) ester, 32.1 mg of tri-tert-butylphosphonium tetrafluoroborate ($(t-Bu)_3P*HBF_4$) and 52.2 mg of tris(dibenzylideneacetone) dipalladium (0) ($Pd_2(dba)_3$) in 20 ml of tetrahydrofuran. The reaction mixture is heated at reflux temperature for two hours. Subsequently, 18 mg bromothiophene and 20 minutes later 24 mg thiophene-boronic acid pinacol ester are added to stop the polymerisation reaction. The reaction mixture is cooled to room temperature and precipitated in methanol. The residue is purified by soxhlet extraction using pentane and heptane and the polymer is then extracted with cyclohexane to give 1.45 g of a dark powder. Mw=39,500, Polydispersity=2.2 (measured by HT-GPC).

Application Example 1a

Bottom-gate thin film transistor (TFT) structures with p-Si gate (10 cm) are used for all experiments. A high-quality thermal $SiO_2$ layer of 300 nm thickness served as gate-insulator of $C_i$=32.6 nF/cm² capacitance per unit area. Source and drain electrodes are patterned by photolithography directly on the gate-oxide. Gold source drain electrodes defining channels of width W=10 mm and varying lengths L=4, 8, 15, 30 µm are used. Prior to deposition of the organic semiconductor the $SiO_2$ surface is derivatized either with hexadimethylsilazane (HMDS) by exposing to a saturated silane vapour at 160° C. for 2 hours, or treating the substrate at 60° C. with a 0.1 m solution of octadecyltrichlorosilane (OTS) in toluene for 20 minutes. After rinsing with isopropanol the substrates are dried.

Transistor Performance in Xylene

The semiconductor thin film is prepared either by spin-coating, or drop casting the DPP derivative of the formula 3 obtained in example 1 in a 1% (w/w) solution in xylene. Before use the solution is filtered through a 0.2 m filter. The spin coating is accomplished at a spinning speed of 800 rpm (rounds per minute) for about 20 seconds in ambient conditions. The devices are dried at 80° C. for 1 hour before evaluation.

The transistor behaviour is measured on an automated transistor prober (TP-10). From a linear fit to the square root of the saturated transfer characteristics a field effect mobility of $2.4 \times 10^{-1}$ cm²/Vs with an on/off current ratio of $8.5 \times 10^5$ can be determined. The threshold voltage is at −2.7 V.

Transistor Performance in Chloroform

The semiconductor thin film is prepared either by spin-coating or drop casting the DPP derivative of the formula 3 obtained in example 1 in a 0.5% (w/w) solution in chloroform. The spin coating is accomplished at a spinning speed of 3000 rpm (rounds per minute) for about 20 seconds in ambient conditions. The devices are dried at 120° C. for 15 minutes before evaluation.

The transistor behaviour is measured on an automated transistor prober (TP-10). From a linear fit to the square root of the saturated transfer characteristics a field effect mobility of $2.1 \times 10^{-1}$ cm²/Vs with an on/off current ratio of $5.7 \times 10^6$ can be determined. The threshold voltage is at 2.0 V.

Measurement of the Ambipolarity

Application Example 1b

The ambipolar transistor just described in application example 1 using o-xylene as solvent is measured at a drain bias of (+−V) by sweeping the gate from −60 V to 60 V and back. The FIGURE shows the transfer curve, which shows a very balanced ratio between the p-type and the n-type region. The p-type mobility is 0.43 cm²/Vs whereas the n-type mobility is 0.35 cm²/Vs. In comparison to the measurement disclosed in Adv. Mat. 2008, 2011, 2217-2224 the p-type mobility is improved by a factor of 10 and for the same source-drain electrodes (Au) an almost equal performance of the n-type behavior can be demonstrated.

Application Example 1c

Application example 1 a is repeated, except that instead of the gold source and drain electrodes silver contact electrodes are used (1c). The results are shown in the table below:

| Example | Bottom Gate | Bottom Insulator | Contacts | $\mu_h$ [cm²/Vs] | $\mu_e$ [cm²/Vs] |
|---|---|---|---|---|---|
| Reference[1] | Si | $SiO_2$/OTS | Au | 0.05 | ND |
| 1b | Si | $SiO_2$/OTS | Au | 0.43 | 0.35 |
| 1c | Si | $SiO_2$/OTS | Ag | 0.026 | 0.022 |

[1] Adv. Mater. 2008, 20, 2217-2224 (table 1, type A)

Example 2

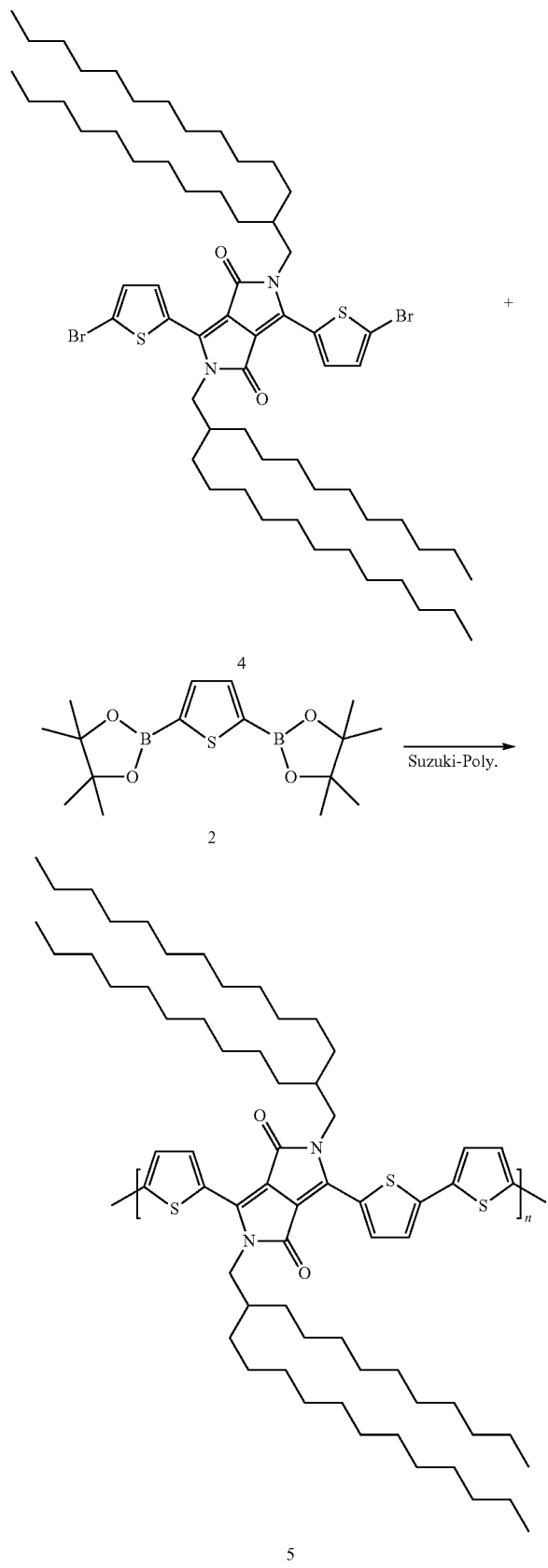

The starting material 4 is prepared according to example 2a of WO2008000664 using decyl-tetradecyl-iodide. 2.0 g of 4, 0.59 g of 2,5-thiopheneboronic acid bis(pinacol) ester, 24.4 mg of tri-tert-butylphosphonium tetrafluoroborate (($t$-$Bu)_3P*HBF_4$), 48.6 mg of tris(dibenzylideneacetone) dipalladium (0) ($Pd_2(dba)_3$) in 50 ml of tetrahydrofuran and 1.13 g of potassium phosphate ($K_3PO_4$) dissolved in 10 ml of water (previously degassed) is used. After 2 hours of reflux 24 mg bromo-thiophene and 20 minutes later 31 mg thiophene-boronic acid pinacol ester is added to stop the polymerisation reaction. The reaction mixture is cooled to room temperature and precipitated in methanol. The residue is purified by soxhlet extraction using pentane and the polymer is then extracted with cyclohexane to give 1.67 g of a dark powder. Mw=43,300, Polydispersity=1.9 (measured by HT-GPC).

Application Example 2

DPP-Polymer 5 Based Organic Field Effect Transistors

Bottom-gate thin film transistor (TFT) structures with p-Si gate (10 cm) are used for all experiments. A high-quality thermal $SiO_2$ layer of 300 nm thickness served as gate-insulator of $C_i$=32.6 nF/$cm^2$ capacitance per unit area. Source and drain electrodes are patterned by photolithography directly on the gate-oxide. Gold source drain electrodes defining channels of width W=10 mm and varying lengths L=4, 8, 15, 30 μm are used. Prior to deposition of the organic semiconductor the $SiO_2$ surface is derivatized either with hexadimethylsilazane (HMDS) by exposing to a saturated silane vapour at 160° C. for 2 hours or treating the substrate at 60° C. with a 0.1 m solution of octadecyltrichlorosilane (OTS) in toluene for 20 minutes. After rinsing with isopropanol the substrates are dried.

Transistor Performance in Toluene

The semiconductor thin film is prepared either by spin-coating or drop casting the DPP derivative of the formula 5 obtained in example 2 in a 0.5% (w/w) solution in toluene. The spin coating is accomplished at a spinning speed of 6000 rpm (rounds per minute) for about 10 seconds in ambient conditions. The devices are dried at 100° C. for 15 minutes before evaluation.

The transistor behaviour is measured on an automated transistor prober (TP-10). From a linear fit to the square root of the saturated transfer characteristics a field effect mobility of $2.8\times10^{-2}$ $cm^2$/Vs with an on/off current ratio of $4.7\times10^5$ can be determined. The threshold voltage is at 5.6 V.

Transistor Performance in Chloroform

The semiconductor thin film is prepared either by spin-coating or drop casting the DPP derivative of the formula 5 obtained in example 2 in a 0.5% (w/w) solution in chloroform. The spin coating is accomplished at a spinning speed of 3000 rpm (rounds per minute) for about 20 seconds in ambient conditions. The devices are evaluated after deposition.

The transistor behaviour is measured on an automated transistor prober (TP-10). From a linear fit to the square root of the saturated transfer characteristics a field effect mobility of $1.0\times10^{-2}$ $cm^2$/Vs with an on/off current ratio of $3.3\times10^4$ can be determined. The threshold voltage is at 5.4 V.

Example 3

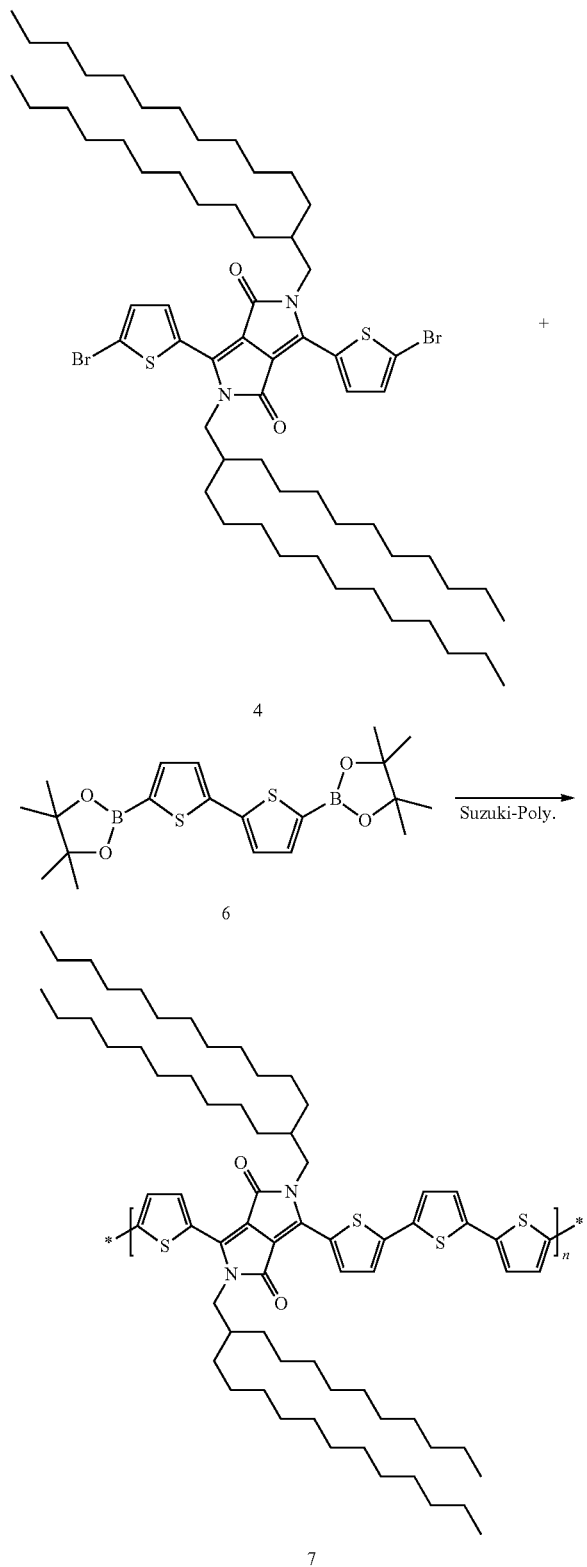

7.1 g of 4, 2.62 g of 2,2'-bithiophene-5,5'-diboronic acid bis(pinacol) ester, 86.2 mg of tri-tert-butylphosphonium tetrafluoroborate ((t-Bu)$_3$P*HBF$_4$), 172.3 mg of tris(dibenzylideneacetone) dipalladium (0) (Pd$_2$(dba)$_3$), 140 ml of tetrahydrofuran and 3.99 g of potassium phosphate (K$_3$PO$_4$) dissolved in 28 ml of water (previously degassed) is used. After 2 hours of reflux 94 mg bromo-thiophene and 20 minutes later 110 mg thiophene-boronic acid pinacol ester are added to stop the polymerisation reaction. The reaction mixture is cooled to room temperature and precipitated in methanol. The residue is purified by soxhlet extraction using THF and the polymer is then extracted with chloroform to give 5.34 g of a dark powder. Mw=54,500, Polydispersity=1.7 (measured by HT-GPC).

Application Example 3

Bottom-gate thin film transistor (TFT) structures with p-Si gate (10 cm) are used for all experiments. A high-quality thermal SiO$_2$ layer of 300 nm thickness served as gate-insulator of C$_i$=32.6 nF/cm$^2$ capacitance per unit area. Source and drain electrodes are patterned by photolithography directly on the gate-oxide. Gold source drain electrodes defining channels of width W=10 mm and varying lengths L=4, 8, 15, 30 μm are used. Prior to deposition of the organic semiconductor the SiO$_2$ surface is derivatized either with hexadimethylsilazane (HMDS) by exposing to a saturated silane vapour at 160° C. for 2 hours or treating the substrate at 60° C. with a 0.1 m solution of octadecyltrichlorosilane (OTS) in toluene for 20 minutes. After rinsing with isopropanol the substrates are dried.

Transistor Performance in Xylene

The semiconductor thin film is prepared either by spin-coating or drop casting the DPP derivative of the formula 7 obtained in example 3 in a 1% (w/w) solution in xylene. Before use the solution is filtered through 0.2 m filter. The spin coating is accomplished at a spinning speed of 800 rpm (rounds per minute) for about 20 seconds in ambient conditions. The devices are dried at 80° C. for 1 hour before evaluation.

The transistor behaviour is measured on an automated transistor prober (TP-10). From a linear fit to the square root of the saturated transfer characteristics a field effect mobility of 2.5×10$^{-1}$ cm$^2$/Vs with an on/off current ratio of 8.9×10$^8$ can be determined. The threshold voltage is at 0.5 V.

Transistor Performance in Chloroform

The semiconductor thin film is prepared either by spin-coating or drop casting the DPP derivative of the formula 7 obtained in example 1 in a 0.5% (w/w) solution in chloroform. The spin coating is accomplished at a spinning speed of 3000 rpm (rounds per minute) for about 20 seconds in ambient conditions. The devices are dried at 100° C. for 15 minutes before evaluation.

The transistor behaviour is measured on an automated transistor prober (TP-10). From a linear fit to the square root of the saturated transfer characteristics a field effect mobility of 3.0×10$^{-1}$ cm$^2$/Vs with an on/off current ratio of 9.3×10$^6$ can be determined. The threshold voltage is at 0.8 V.

Example 4
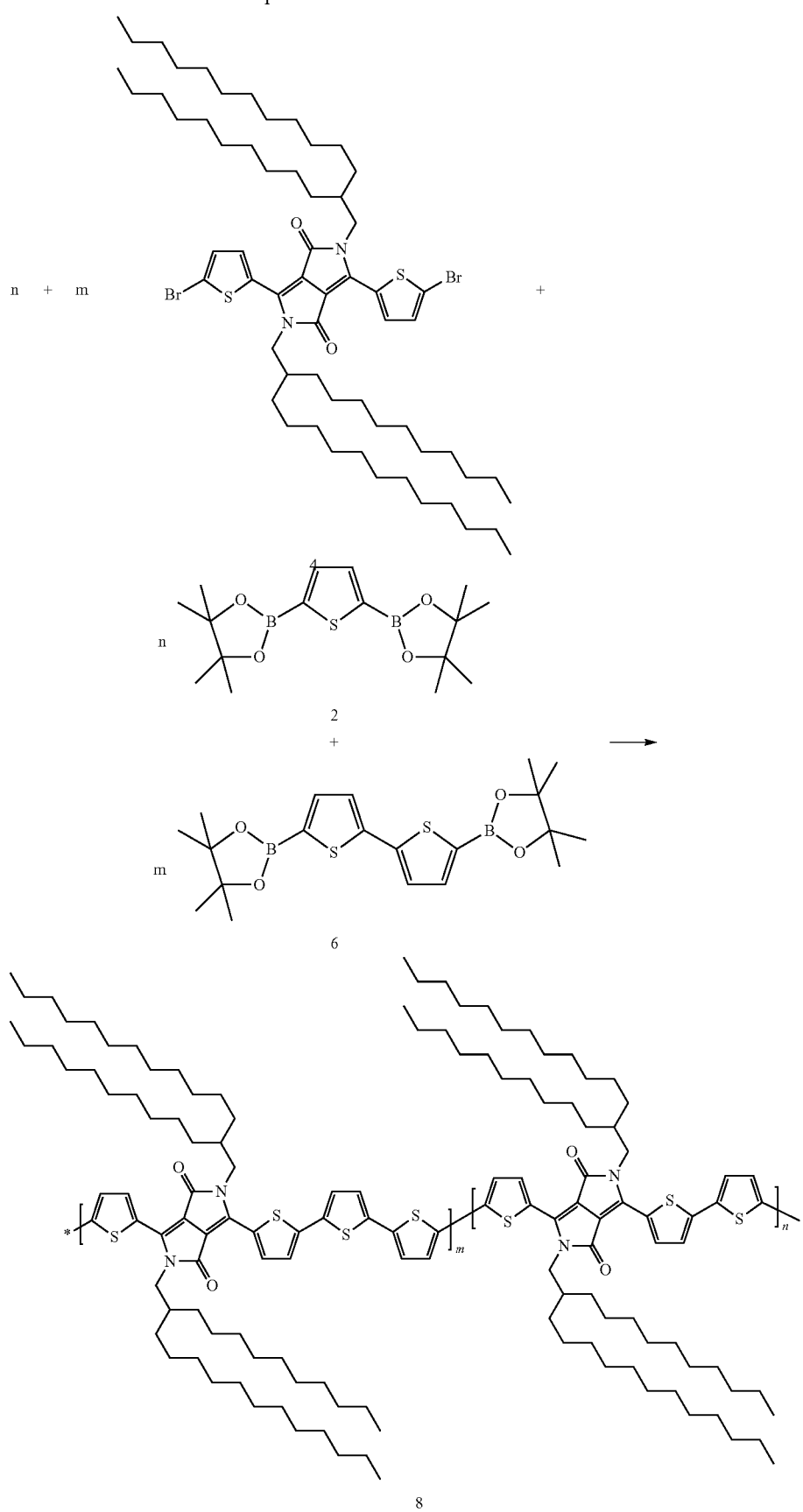

1.0 g of 4, 148 mg of 2,5-thiopheneboronic acid bis(pinacol) ester, 185 mg 2,2'-bithiophene-5,5'-diboronic acid bis(pinacol) ester, 12.2 mg of tri-tert-butylphosphonium tetrafluoroborate (($^t$Bu)$_3$P*HBF$_4$), 24.3 mg of tris(dibenzylideneacetone) dipalladium (0) (Pd$_2$(dba)$_3$), 25 ml of tetrahydrofuran and 0.56 g of potassium phosphate (K$_3$PO$_4$) dissolved in 5 ml of water (previously degassed) is used. After 2 hours of reflux 12 mg bromo-thiophene and 20 minutes later 16 mg thiophene-boronic acid pinacol ester is added to stop the polymerisation reaction. The reaction mixture is cooled to room temperature and precipitated in methanol. The residue is purified by soxhlet extraction using pentane and the polymer is then extracted with cyclohexane to give 0.83 g of a dark powder. Mw=51,500, Polydispersity=2.0 (measured by HT-GPC).

Application Example 4

DPP-Polymer 8 Based Organic Field Effect Transistors

Bottom-gate thin film transistor (TFT) structures with p-Si gate (10 cm) are used for all experiments. A high-quality thermal SiO$_2$ layer of 300 nm thickness served as gate-insulator of C$_i$=32.6 nF/cm$^2$ capacitance per unit area. Source and drain electrodes are patterned by photolithography directly on the gate-oxide. Gold source drain electrodes defining channels of width W=10 mm and varying lengths L=4, 8, 15, 30 m are used. Prior to deposition of the organic semiconductor the SiO$_2$ surface is derivatized either with hexadimethylsilazane (HMDS) by exposing to a saturated silane vapour at 160° C. for 2 hours or treating the substrate at 60° C. with a 0.1 m solution of octadecyltrichlorosilane (OTS) in toluene for 20 minutes. After rinsing with iso-propanol the substrates are dried.

Transistor Performance in Toluene

The semiconductor thin film is prepared either by spin-coating or drop casting the DPP derivative of the formula 8 obtained in example 4 in a 0.5% (w/w) solution in toluene. The spin coating is accomplished at a spinning speed of 6000 rpm (rounds per minute) for about 10 seconds in ambient conditions. The devices are dried at 130° C. for 15 minutes before evaluation.

The transistor behaviour is measured on an automated transistor prober (TP-10). From a linear fit to the square root of the saturated transfer characteristics a field effect mobility of 2.1×10$^{-1}$ cm$^2$/Vs with an on/off current ratio of 1.9×10$^7$ can be determined. The threshold voltage is at 0.4 V.

Example 5

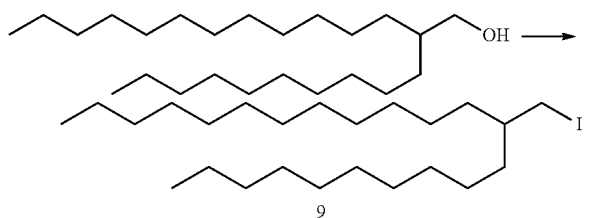

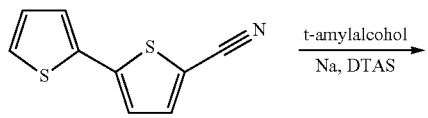

a) 228.06 g of 2-decyl-1-tetradecanol are mixed with 484.51 g 47% hydroiodic acid and the mixture is refluxed overnight. The product is extracted with t-butyl-methylether. Then the organic phase is dried and concentrated. The product is purified over a silica gel column to give 211.54 g of the desired compound 9 (73%). $^1$H-NMR data (ppm, CDCl$_3$): 3.26 2H d, 1.26-1.12 41H m, 0.88 6H t;

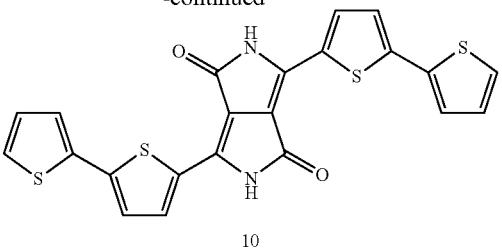

b) A mixture of 30 mg FeCl$_3$, 10.27 g sodium and 600 mL t-amylalcohol is heated to 110° C. for 30 minutes before a mixture of 30.52 g of the nitrile and 24.83 g di-tert-amylsuccinate is added dropwise. The reaction mixture is stirred at 110° C. over night before it is poured onto water-methanol mixture. Büchner filtration and exhaustive washing with methanol affords 33.60 g of the desired compound 10 as dark blue powder with 90% yield. MS m/z: 464;

9 + 10 ⟶

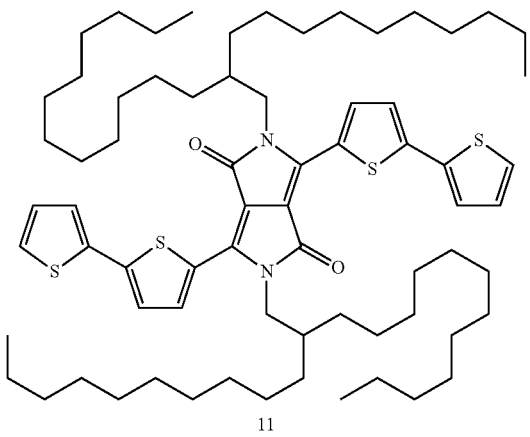

c) 33.55 g of the compound 10 are reacted with 12.22 g K$_2$CO$_3$ and 74.4 g 2-decyl-1-tetradecyl iodide 9 in 1300 ml DMF at 110° C. overnight. The reaction mixture is poured on ice and extracted with methylene chloride. Purification is achieved by column chromatography over silica gel and affords 35.1 g of the desired compound 11 (42.7%). $^1$H-NMR data (ppm, CDCl$_3$): 8.91 2H d, 7.35-7.32 6H m, 7.09 2H dxd, 4.05 4H d, 1.98 2H m, 1.35-1.20 80H m, 0.89 6H t, 0.87 6H t;

11 →$^{NBS}$

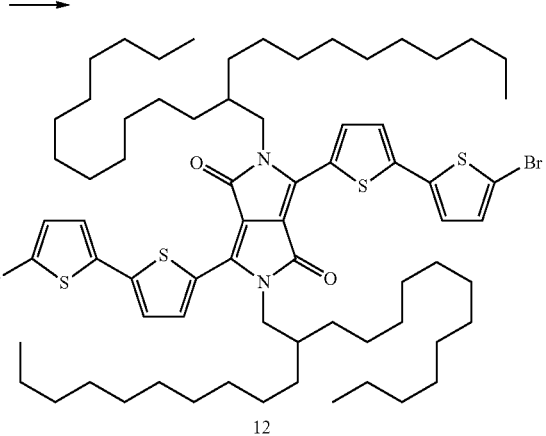

d) 10.00 g of 11 and one drop of perchloric acid are dissolved in 200 ml of chloroform, cooled down to 0° C. and 2 equivalents of N-bromosuccinimide are then added portion wise over a period of 1 h. After the reaction is completed, the mixture is washed with water. The organic phase is extracted, dried and concentrated. The compound is then purified over a silica gel column to give 5.31 g of a dark violet powder of the formula 12 (47%). $^1$H-NMR data (ppm, CDCl$_3$): 8.85 2H d, 7.22 2H d, 7.03 4H dxd, 4.00 4H d, 1.93 2H m, 1.29-1.21 80H m, 0.87 6H t, 0.85 6H t.

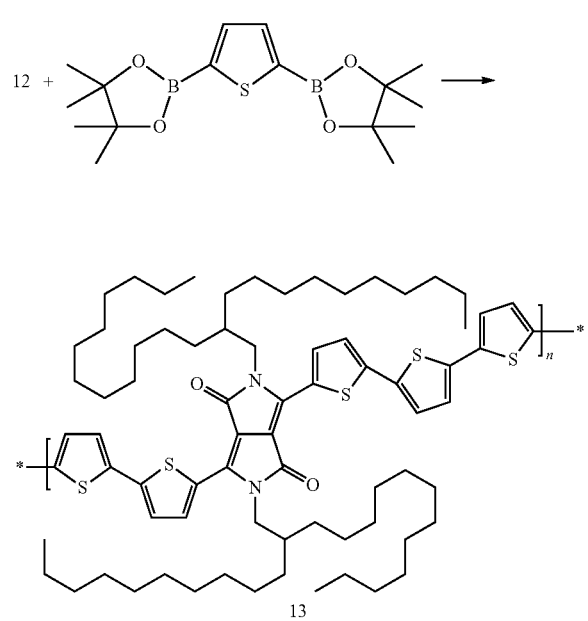

e) 300 mg of compound 12, 78 mg thiophene-di-boronic acid pinacol ester, 5 mg Pd$_2$(dba)$_3$ (tris(dibenzylideneacetone)-di-palladium) and 3 mg tri-tert-butyl-phosphonium-tetrafluoroborate are dissolved in 3 ml of tetrahydrofurane. This solution is degassed with 3 cycles of freeze/pump/thaw (Ar). The reaction mixture is then heated to reflux temperature. Then 149 mg of K$_3$PO$_4$ are dissolved in 0.7 ml of water and degassed under argon. The water solution is added to the THF solution and the reaction mixture is refluxed over night. Then 5 mg of 2-thiophene-mono-boronic-acid-pinacol-ester are added, and the mixture is refluxed for another 30 minutes. Then 4 mg of 2-bromo-thiophene are added, and the mixture is refluxed for another 30 minutes. The reaction mixture is cooled to room temperature and diluted with water and then extracted with chloroform. The chloroform solution is then refluxed with a solution of NaCN in water for 1 hour. The water is separated and the chloroform solution dried. The residue is then Soxhlet extracted with tetrahydrofuran. The organic phase is evaporated to give 224 mg of the desired polymer 13.

Example 6

To a mixture of 1.006 g of 4, 0.349 g of 2,5-thieno[3,2-b]thiophenediboronic acid bis(pinacol) ester (e.g. made by esterification of the corresponding diboronic acid (J. Org. Chem., 1978, 43(11), p 2199) with pinacol in refluxing toluene), 13 mg of tri-tert-butylphosphonium tetrafluoroborate (($t$-Bu)$_3$P*HBF$_4$), 21 mg of tris(dibenzylideneacetone) dipalladium (0) (Pd$_2$(dba)$_3$) in 20 ml of tetrahydrofuran (degassed under Ar), a solution of 0.572 g of potassium phosphate (K$_3$PO$_4$) dissolved in 1.7 ml of water (previously degassed) is added. After 2 hours of reflux 4 mg bromothiophene and 20 minutes later 5 mg thiophene-boronic acid pinacol ester is added to stop the polymerization reaction. The reaction mixture is cooled down and diluted with chloroform. Then water is added. The layers are separated and the organic layer is washed once more with water. The organic layer is then concentrated under reduced pressure. The chloroform solution is then refluxed over night together with a 1% NaCN solution in water. The layers are separated, the organic layer is then washed once more with water and concentrated under reduced pressure. The crude product is precipitated by the addition of methanol and filtered. The product is then isolated by soxhlet extraction. A first fraction extracted with tetrahydrofurane is discarded, and the second fraction extracted with chloroform is precipitated by the addition of methanol to give 76 mg of the desired polymer of formula A as dark powder, Mw=25,800, polydispersity=2.0 (measured by HT-GPC).

Example 7

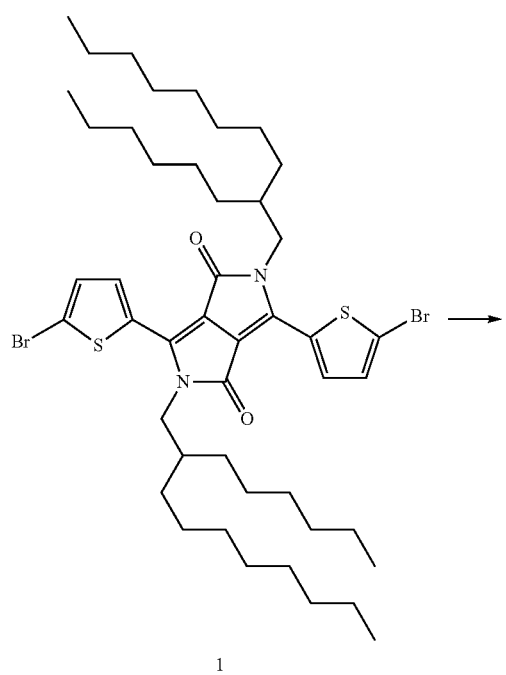

1

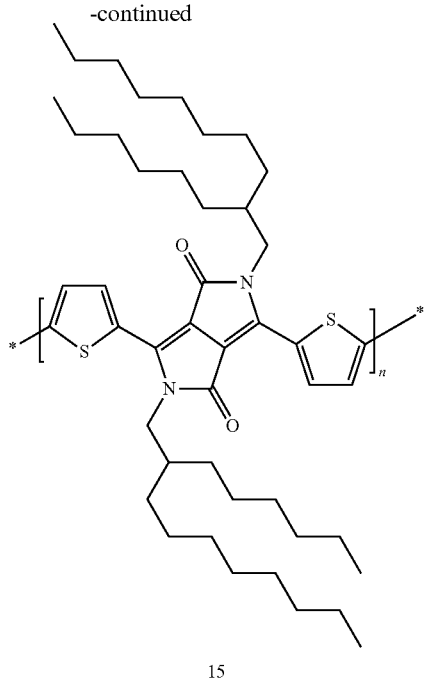

15

In a schlenk tube, a solution of 1.13 g of Ni(COD)$_2$ and 0.65 g bipyridine in 90 ml of toluene is degassed for 15 min. 3 g of the corresponding dibrominated monomer 1 is added to this solution and then the mixture is heated to 80° C. and stirred vigorously overnight. The solution is poured on 500 ml of a 3/1/1 methanol/HCl (4N)/acetone mixture and stirred for 1 h. The precipitate is then filtrated, dissolved in CHCl$_3$ and stirred vigorously at 60° C. with an aqueous solution of ethylenediaminetetraacetic acid (EDTA) tetrasodium salt for one additional hour. The organic phase is washed with water, concentrated and precipitated in methanol. The residue is purified by soxhlet extraction using methanol, diethylether, cyclohexane and the polymer is then extracted with CHCl$_3$ to give 1.7 g of a dark powder. Mw=37,000, Polydispersity=2.3 (measured by HT-GPC).

Application Example 5

Bottom-gate thin film transistor (TFT) structures with p-Si gate (10 cm) are used for all experiments. A high-quality thermal SiO$_2$ layer of 300 nm thickness served as gate-insulator of $C_i$=32.6 nF/cm$^2$ capacitance per unit area. Source and drain electrodes are patterned by photolithography directly on the gate-oxide. Gold source drain electrodes defining channels of width W=10 mm and varying lengths L=4, 8, 15, 30 µm are used. Prior to deposition of the organic semiconductor the SiO$_2$ surface is derivatized either with hexadimethylsilazane (HMDS) by exposing to a saturated silane vapour at 160° C. for 2 hours, by spin coating the HMDS at a spinning speed of 800 rpm (rounds per minute) for about a minute or by treating the substrate at 60° C. with a 0.1 M solution of octadecyltrichlorosilane (OTS) in toluene for 20 minutes. After rinsing with iso-propanol the substrates are dried.

Transistor Performance in Chloroform

The semiconductor thin film is prepared either by spin-coating or drop casting the DPP derivative of the formula 15 obtained in example 7 in a 0.5% (w/w) solution in chloroform. The spin coating is accomplished at a spinning speed of 3000 rpm (rounds per minute) for about 20 seconds in ambient conditions. The devices are evaluated as deposited as well as after drying at 120° C. for 15 minutes.

The transistor behaviour is measured on an automated transistor prober (TP-10). The DPP derivative of the formula 15 shows good ambipolar behaviour in the standard device configuration.

Example 8

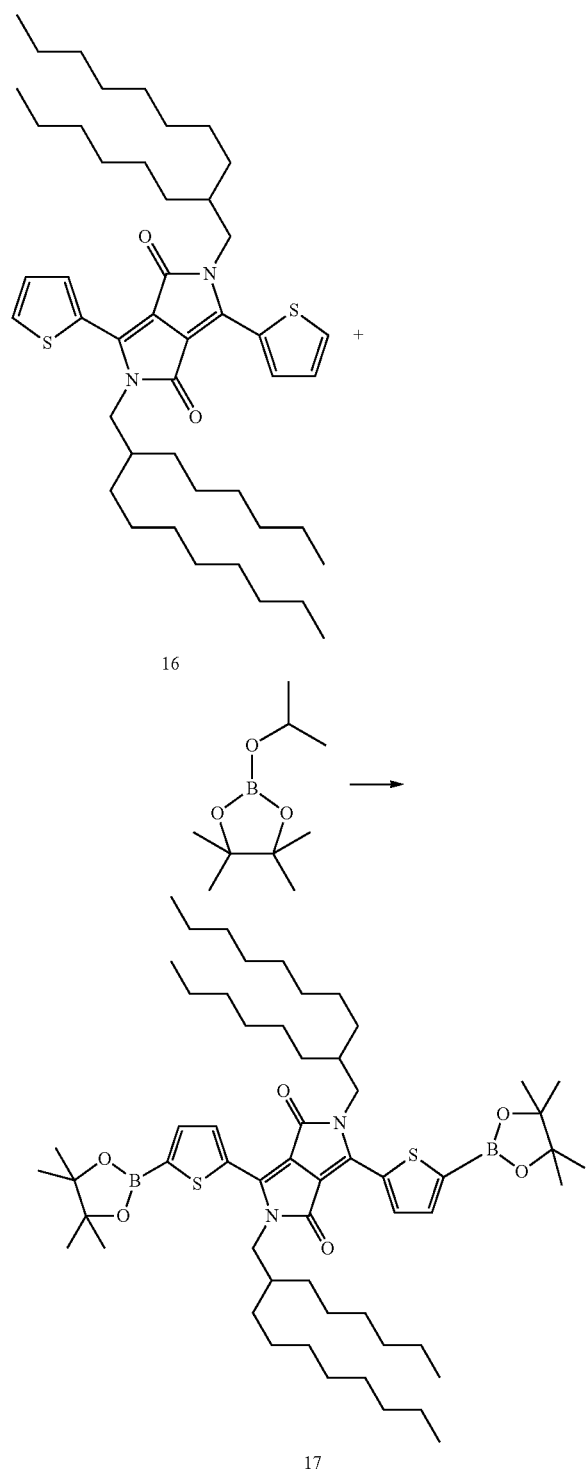

16

17

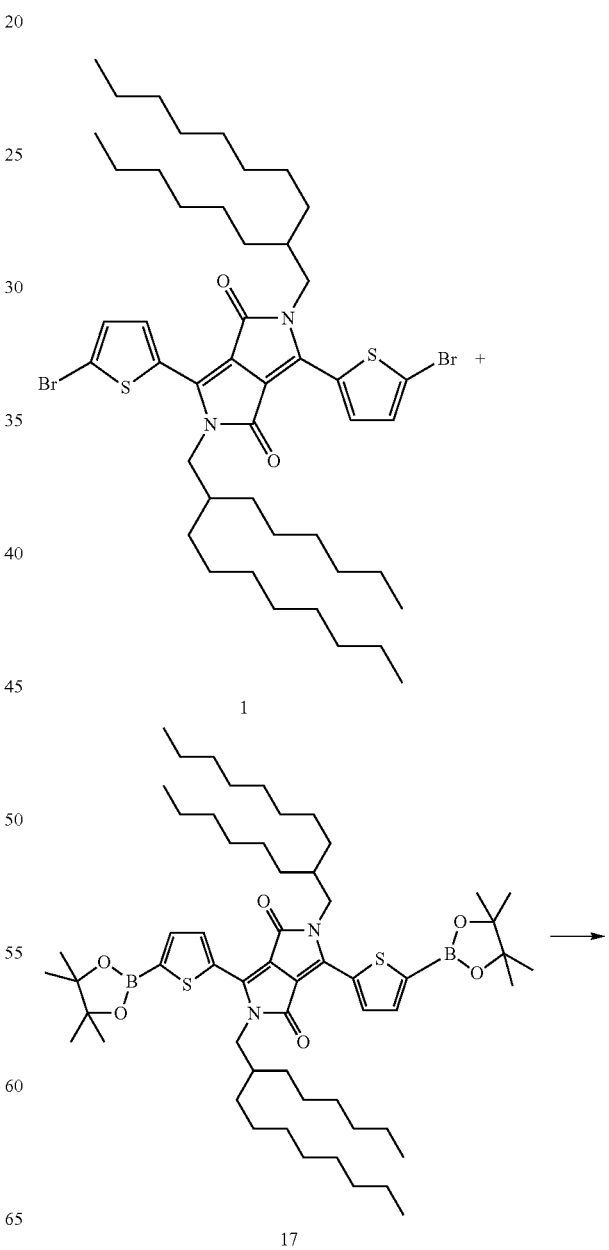

1

17 a) To a solution of 5.0 g Dithienyl-DPP (16) and 3.73 g 2-lsopropoxy-4,4,5,5-tetramethyl-1,3,2-dioxoborolane in 30 ml THF under nitrogen at −25° C. is added drop-wise a freshly prepared LDA solution (from 5.4 ml butyllithium 2.7 M and 2.2 ml diisopropylamin in 20 ml THF,) over 15 minutes. The resulting reaction mixture is stirred for 1 hour at 0° C. and then quenched with 100 ml 1 M HCl. The product is extracted with 2×50 ml TBME and the combined organic layers are washed twice with brine and dried with sodium sulfate. After evaporation of the solvent the residue is dissolved in 20 ml methylenchloride and then slowly added to 200 ml of heavily stirred acetone. The precipitate is collected by filtration, washed several times with acetone and dried at 40° C. in a vacuum-oven, affording 6.3 g of pinkish-violet powder. $^1$H-NMR (ppm, CDCl$_3$): 8.90 2H, d, $^3$J=3.9 Hz; 7.71 2H, d, $^3$J=3.9 Hz; 4.05 4H d, $^3$J=7.7 Hz; 1.84 2H m; 1.37 24H m; 1.35-1.2 48, m; 0.9-0.8 12H m.

-continued

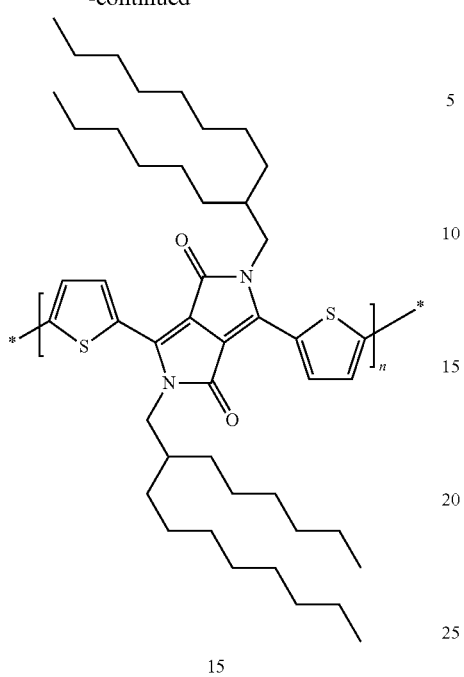

15

-continued

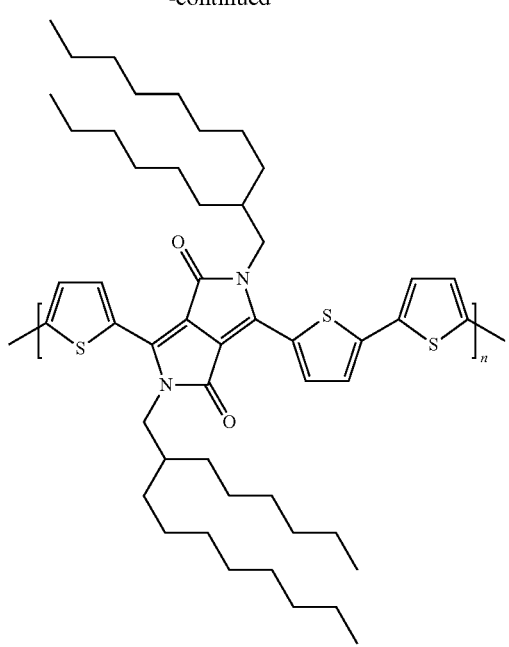

3 b) According to the procedure for the synthesis of polymer 3 described in example 1, 0.91 g of 1 and 1.004 g of 17 are reacted to give polymer 15. After the reaction, the mixture is poured into methanol and washed with acetone, yielding in 1.2 g of polymer 15.

According to the procedure for the synthesis of polymer 3 described in example 1, 0.5 g of 17 and 0.12 g of dibromothiophene are reacted to give polymer 3. After the reaction, the mixture is poured into methanol and washed with acetone, yielding in 0.380 g of polymer 3. Mw=20,000, Polydispersity=2.3 (measured by HT-GPC).

Example 9

Example 10

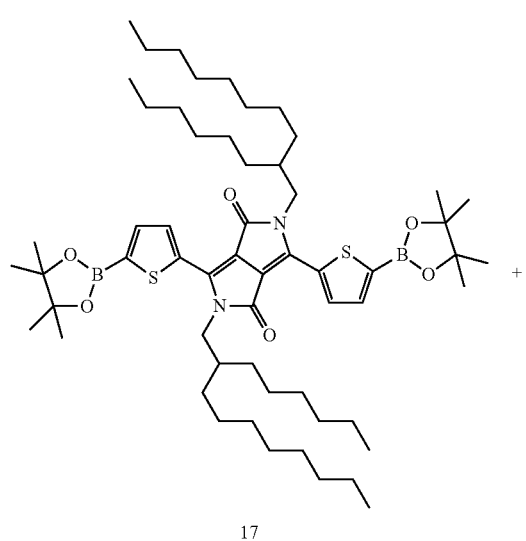

17

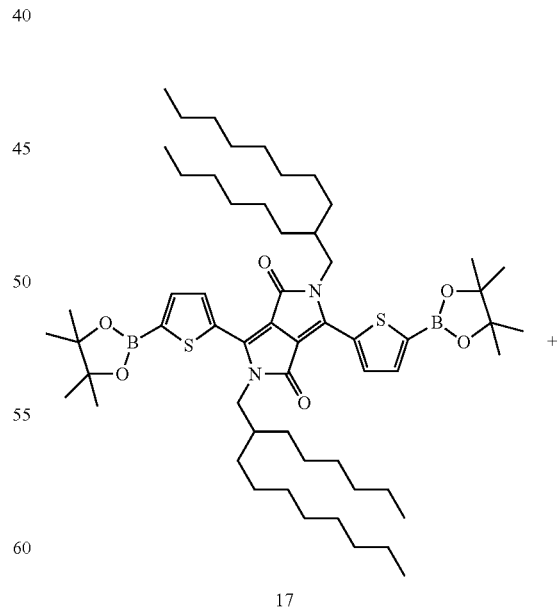

17

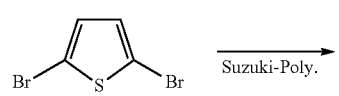

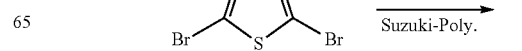

-continued

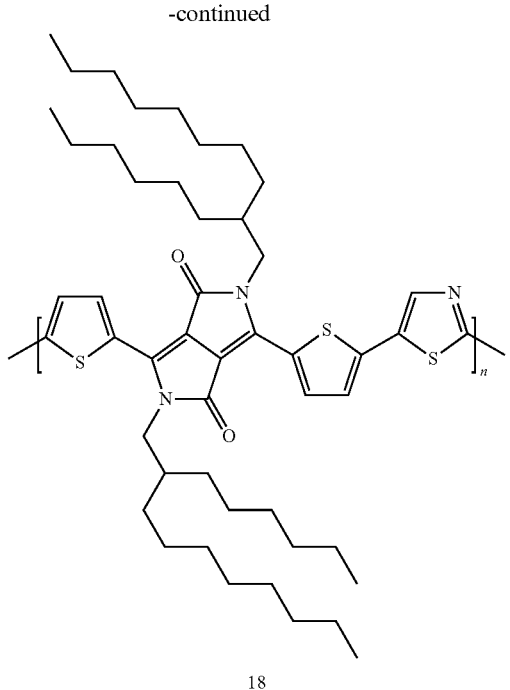

18

According to the procedure for the synthesis of polymer 3 described in example 1, 0.5 g of 17 and 0.12 g of 2,5-dibromothiazole are reacted to give polymer 18. The residue is purified by soxhlet extraction using pentane and the polymer is then extracted with cyclohexane to give 0.26 g of a dark powder. Mw=17,700, Polydispersity=2.0 (measured by HT-GPC).

Example 11

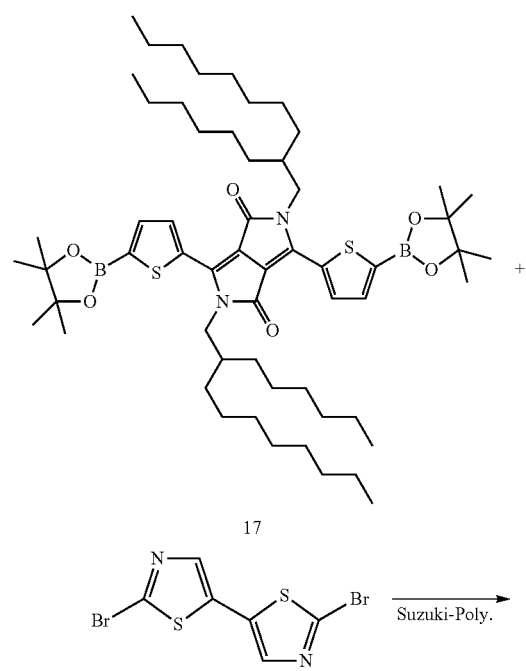

-continued

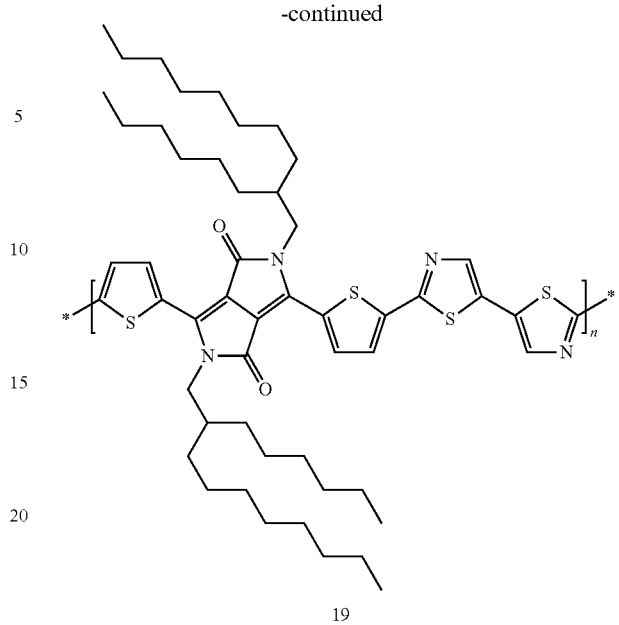

19

According to the procedure for the synthesis of polymer 3 described in example 1, 0.15 g of 17 and 0.05 g of 2,2'-Dibromo-[5,5']bithiazolyl are reacted to give polymer 19. After the reaction, the mixture is poured into methanol and washed with acetone, yielding in 0.13 g of polymer 19.

Example 12

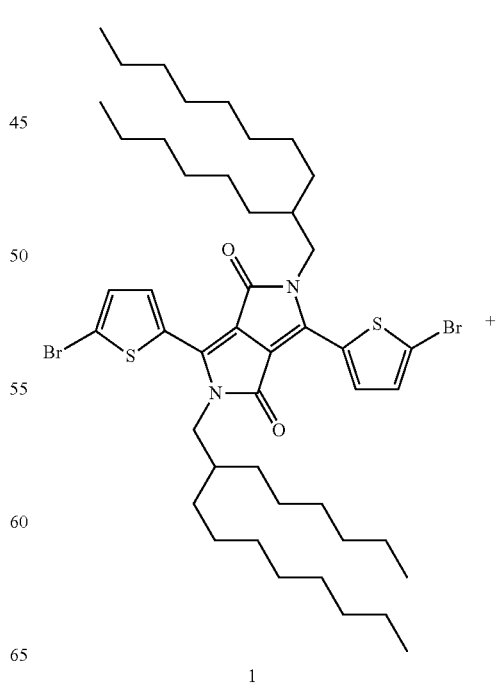

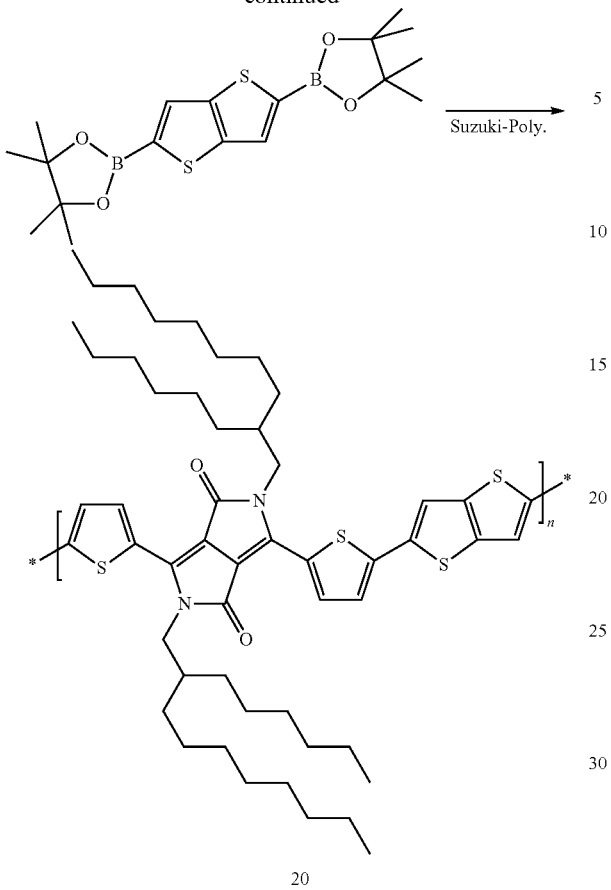

20

According to the procedure for the synthesis of polymer 3 described in example 1, 2.3 g of 1 and 1 g 2,5-thieno[3,2-b]thiophenediboronic acid bis(pinacol) ester (e.g. made by esterification of the corresponding diboronic acid (J. Org. Chem., 1978, 43(11), p 2199) with pinacol in refluxing toluene) have been reacted to give polymer 20. After the reaction, the mixture was poured into methanol and washed with acetone, yielding in 2.0 g of polymer 20.

Example 13

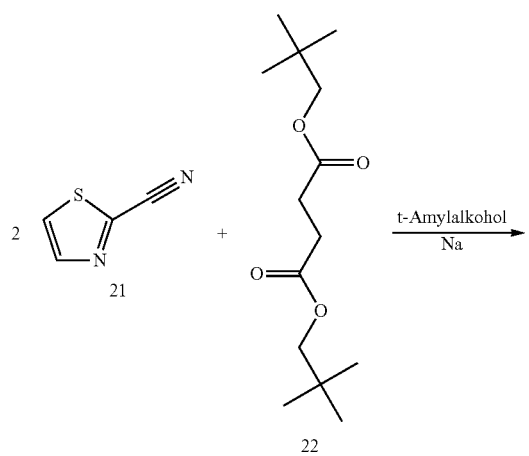

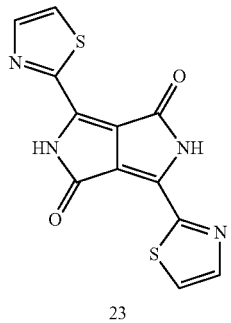

23 a) A mixture of 5 mg iron trichloride (FeCl$_3$), 2.6 g of sodium and 100 ml of t-amylalcohol is heated to 110° C. for 20 minutes before a mixture of 5.0 g of the thiazole-2-nitrile of the formula 21 and 8.25 g of di-tert-amyl succinate of the formula 22 is added dropwise. The reaction mixture is stirred at 110° C. for 3 hours before it is poured onto 8.15 g acetic acid in a water-methanol mixture (200 ml/100 ml). Büchner filtration and exhaustive washing with methanol affords 5.2 g of the desired 1,4-diketopyrrolo[3,4-c]pyrrole (DPP) derivative of the formula 23 as dark blue powder: ESI-MS m/z (% int.): 303.13 ([M+H]+, 100%).

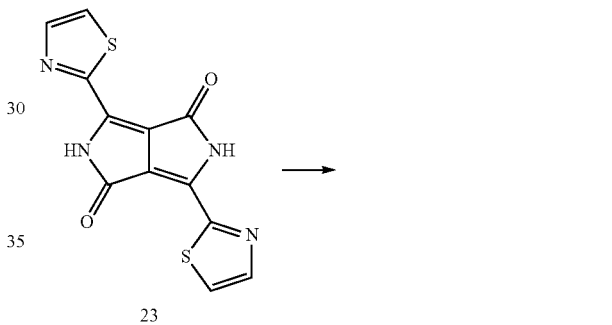

b) A solution of 4 g of the 1,4-diketopyrrolo[3,4-c]pyrrole (DPP) derivative of the formula 3, 2.9 g of KOH in 3 ml of water and 18.5 g of 1-bromo-2-hexyl-decyl in 50 ml of N-methyl-pyrrolidone (NMP) is heated to 140° C. for 6h. The mixture is washed with water and extracted with dichloromethane. Purification is achieved by column chromatography over silica gel and precipitation out of chloroform/methanol which affords 0.4 g of the desired DPP 24 as blue solid. ESI-MS m/z (% int.): 751.93 ([M+H]+, 100%).

¹H-NMR (ppm, CDCl₃): 8.05 2H, d, ³J=3.1 Hz; 7.70 2H, d, ³J=3.1 Hz; 4.34 4H d, ³J=7.4 Hz; 1.86 2H m; 1.3-1.2 48, m; 0.9-0.8 12H t.

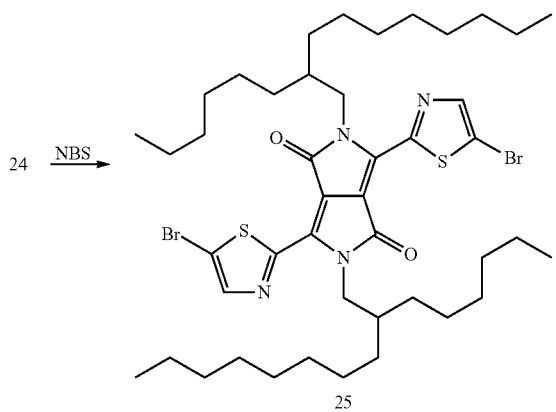 [SMILES: "NBS" ; CCCCCCCCC(CCCCCC)CN1C(=O)C2=C(c3ncc(Br)s3)N(CC(CCCCCC)CCCCCCCC)C(=O)C2=C1c1ncc(Br)s1]

c) Compound 25 is obtained in analogy to example 5d.

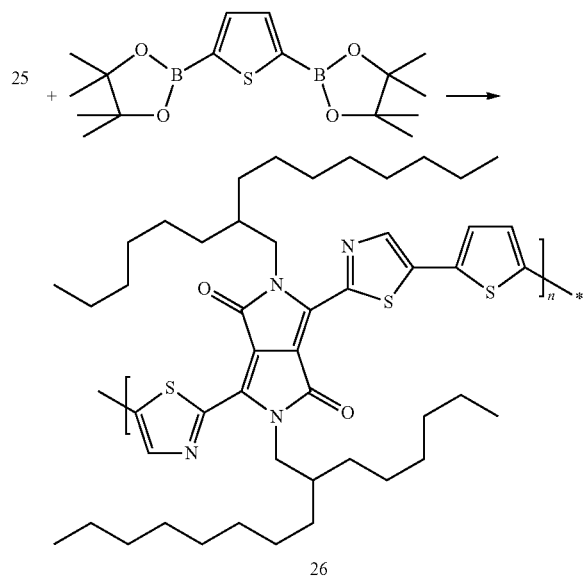

d) Polymer 26 is obtained in analogy to example 5e.

25 →

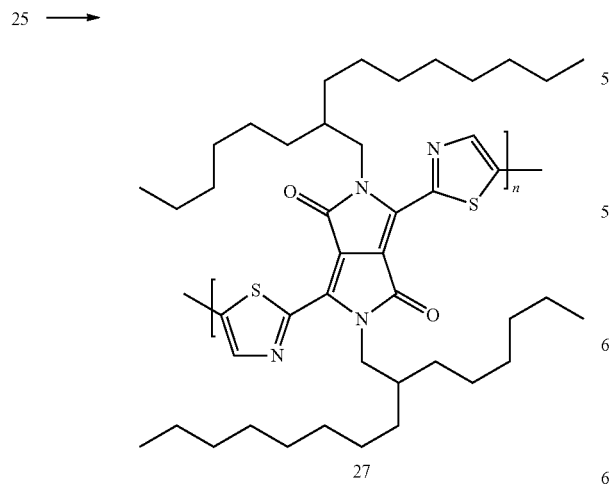

e) Polymer 27 is obtained in analogy to example 7.

Example 14

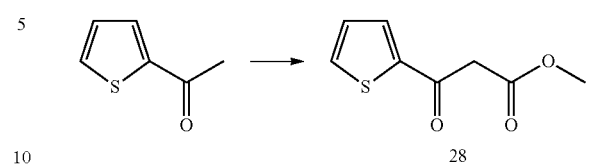

a) 554.6 g of potassium tert-butoxide, 424.2 g g of dimethyl carbonate and 3 L of anhydrous toluene are heated to 100° C. with stirring. 300 g of 1-acetyl thiophene is added drop by drop during three hours and stirred at 100° C. for 15 hours. The reaction mixture is allowed to cool to room temperature and poured onto 4 L of ice. The water layer is separated and two times extracted with 200 ml of ethyl acetate. The organic layers are combined and dried over sodium sulfate, filtered, evaporated and dried, giving 363.7 g of 28. The crude product is used for the next reaction step without further purification.

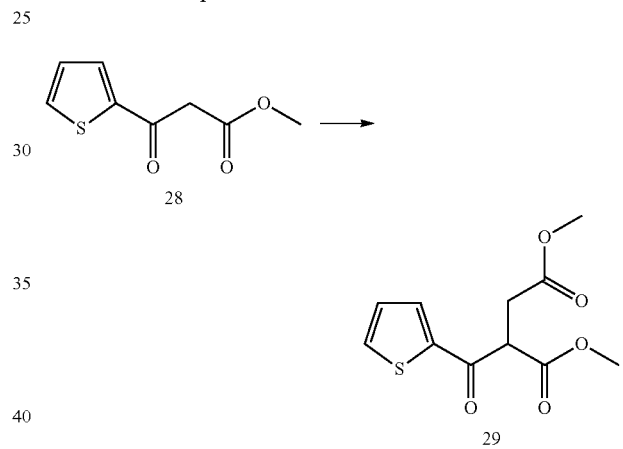

b) 363.7 g of 28, 322.7 g of methyl bromooacetate, 288.7 g potassium carbonate, 1100 ml of acetone and 750 ml of 1,2-dimethoxyethane are placed in a vessel. The mixture is stirred at 80° C. for 20 hours. After the mixture has cooled down to room temperature, it is filtered and dried. 460 g of 29 are obtained. The crude product is used for the next reaction step without further purification.

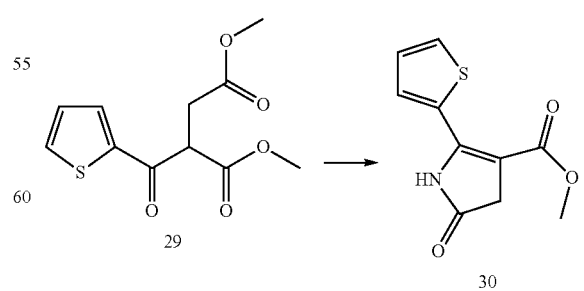

c) 218 g of 29, 643 g of ammonium acetate and 680 ml of acetic acid are stirred at 115° C. for 3 hours. After the reaction mixture has cooled down to room temperature, it is poured into 3 L of acetone. The produced solid is separated and washed with methanol and dried. 99.6 g of 30 are obtained.

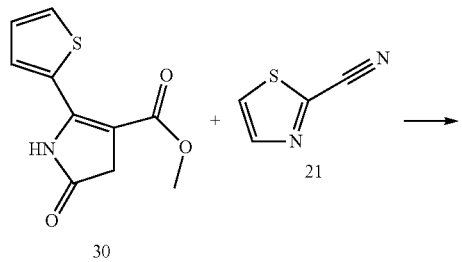

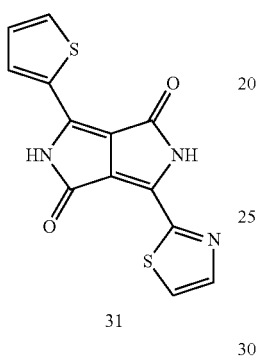

d) A mixture of 5 mg iron trichloride (FeCl₃), 2 g of sodium and 40 ml of t-amylalcohol is heated to 110° C. for 20 minutes before a mixture of 3.9 g of the thiazole-2-nitrile of the formula 21 and 7.82 g of 30 is added portionwise. The reaction mixture is stirred at 110° C. for 3 hours before it is poured onto 6.3 g acetic acid in a water-methanol mixture (100 ml/100 ml). Büchner filtration and exhaustive washing with methanol affords 4.5 g of the desired 1,4-diketopyrrolo [3,4-c]pyrrole (DPP) derivative of the formula 31 as dark blue powder; ESI-MS m/z (% int.): 302.15 ([M+H]+, 100%).

31 ⟶

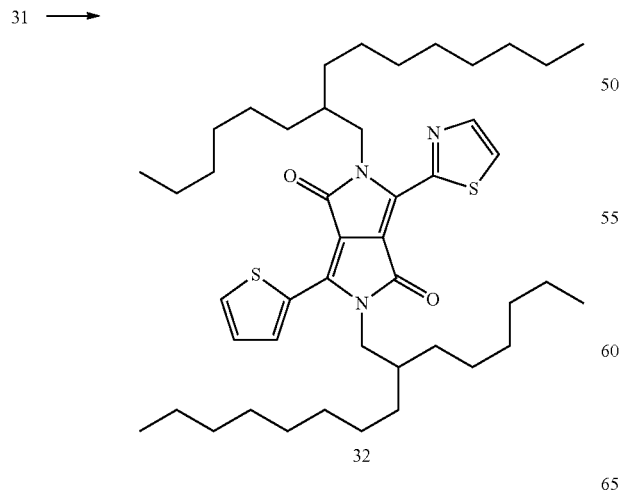

e) Compound 32 is obtained in analogy to example 5c.

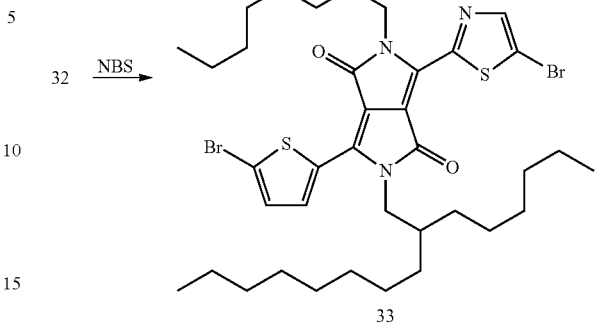

f) Compound 33 is obtained in analogy to example 5d.

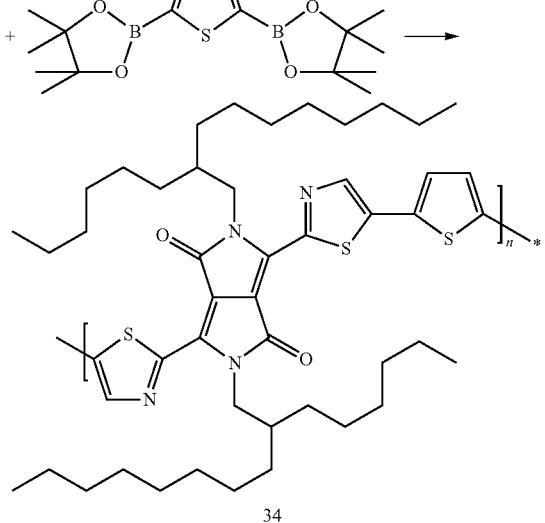

g) Polymer 34 is obtained in analogy to example 5e.

33 ⟶

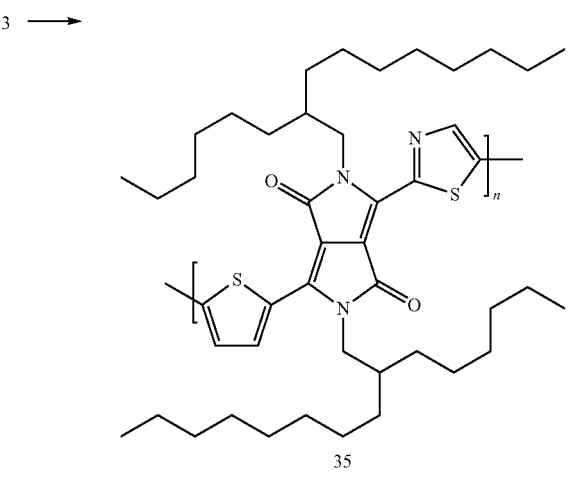

h) Polymer 35 is obtained in analogy to example 7.

Example 15

Polymer 36 is obtained from compound 12 in analogy to example 7.

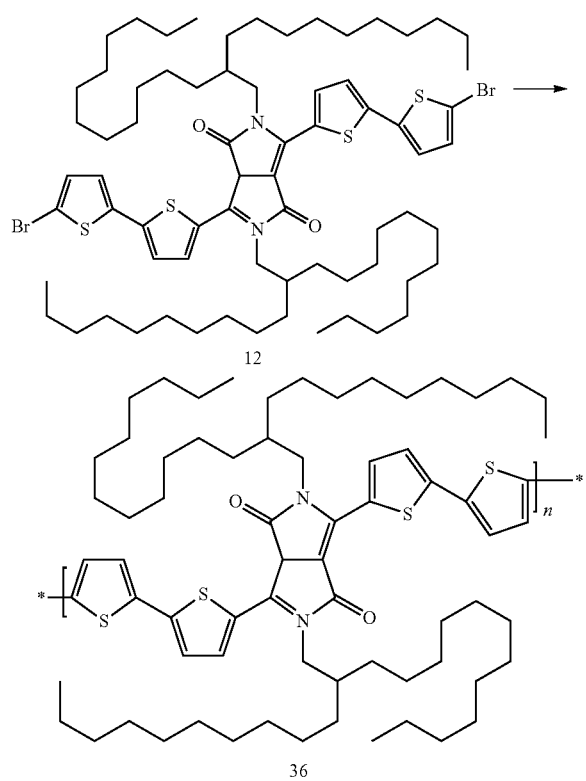

Example 16

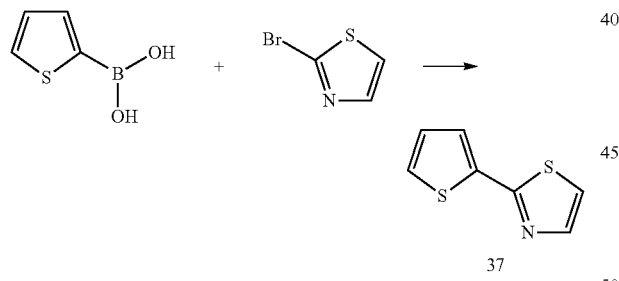

a) In a three neck-flask, 83.6 g of potassium phosphate ($K_3PO_4$) dissolved in 110 ml of water (previously degassed) is added to a degassed solution of 20 g of thienylboronic acid, 22.0 g of 2-bromothiazole, 2.3 g of tri-tert-butylphosphonium tetrafluoroborate (($t$-Bu)$_3$P*HBF$_4$) and 3.6 g of tris(dibenzylideneacetone) dipalladium (0) (Pd$_2$(dba)$_3$) in 350 ml of tetrahydrofuran. The reaction mixture is heated at reflux temperature overnight. The reaction mixture is cooled to room temperature and 100 ml water was added. The reaction mixture was extracted with ethylacetate and the organic layer was dried and evaporated under reduced pressure. It was further purified with column chromatography using a gradient of hexane/ehtylacetate on silicagel. 8.0 g of 2-thiophen-2-yl-thiazole 37 was obtained, spectral data correspond to the ones described in literature using Negishi-cross coupling reaction. (J. Jensen et al., Synthesis, 2001, 1, 128).

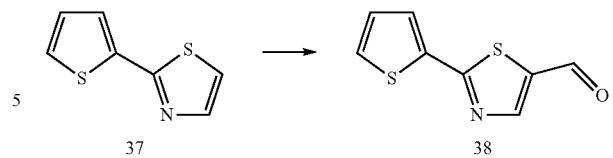

b) Compound 38 is obtained using the procedure known in literature (P. Chauvin et al., Bull. Soc. Chim. Fr. 1974, 9-10, 2099).

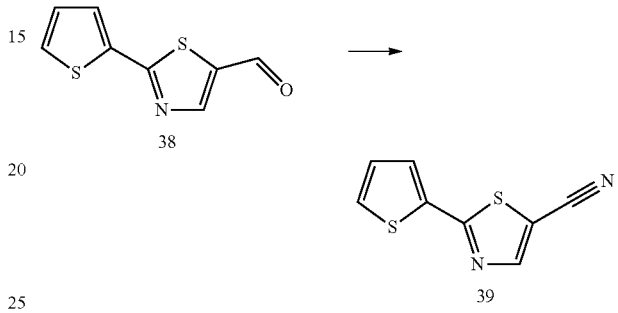

c) Compound 39 is obtained in analogy to the procedure known in literature (A. D. Borthwick et al.; J. Chem. Soc., Perkin Trans 1, 1973; 2769).

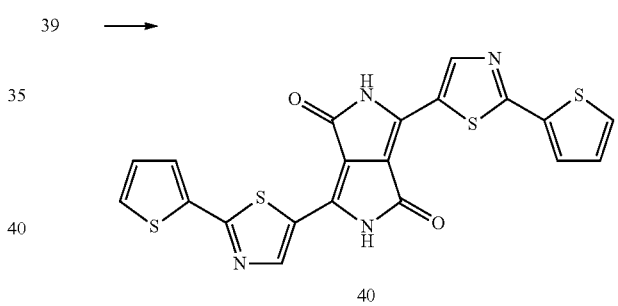

d) Compound 40 is obtained in analogy to example 5b.

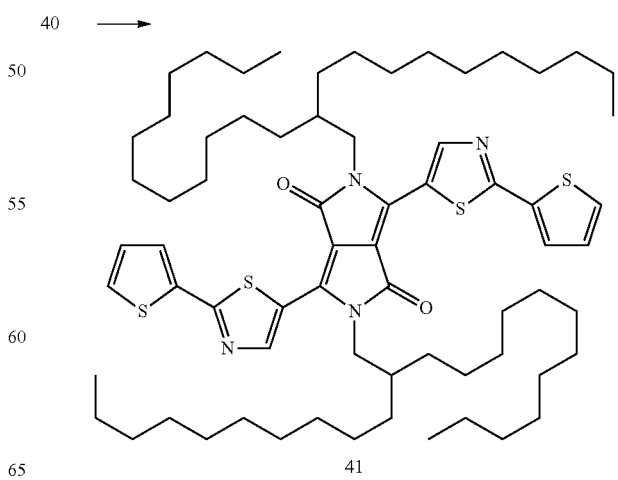

e) Compound 41 is obtained in analogy to example 5c.

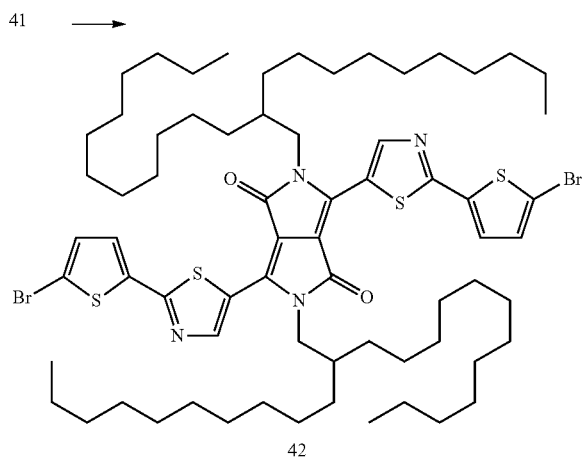

41 →

42 f) Compound 42 is obtained in analogy to example 5d.

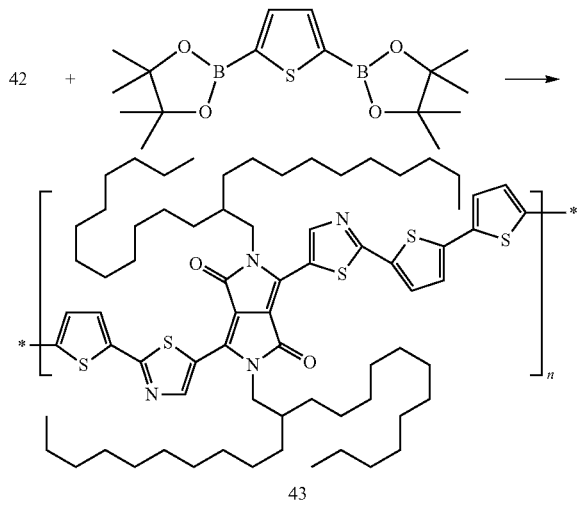

42 +

43 g) Polymer 43 is obtained in analogy to example 5e.

42 →

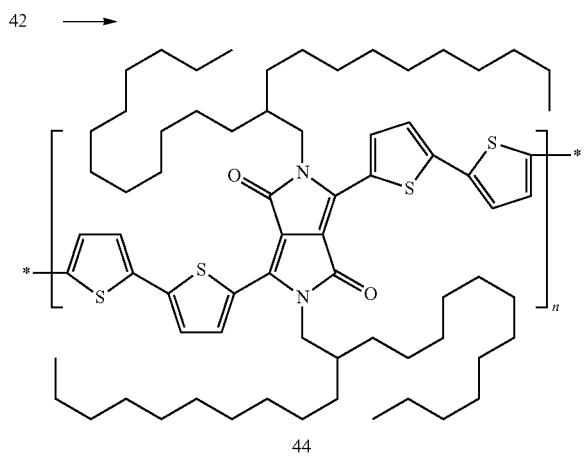

44 h) Polymer 44 is obtained in analogy to example 7.

The polymers of the present invention can show higher field-effect mobility as the polymers disclosed in WO08/000664.

The invention claimed is:

1. A copolymer comprising repeating units of formula (VII)

wherein

A is a group of formula

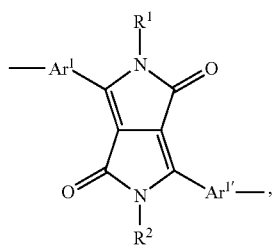

$COM^1$ is a group of formula

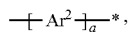

a is an integer of 1 and 3 to 5, n is number which results in a molecular weight of 10,000 to 1,000,000 Daltons, $Ar^1$ and $Ar^{1'}$ are a group of formula

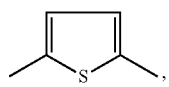

$Ar^2$ is a group of formula

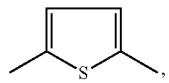

and $R^1$ and $R^2$ are the same or different and are selected from a branched $C_8$-$C_{36}$alkyl group.

2. The copolymer according to claim 1, wherein a is an integer of 1 and 3.

3. A copolymer comprising repeating units of formula (IIa')

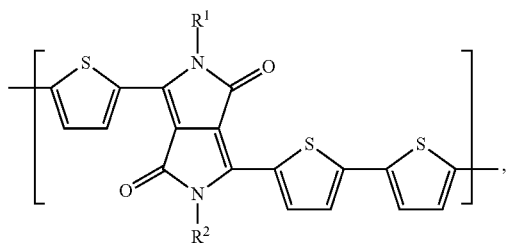
(IIa')

R[1] and R[2] are the same or different and are selected from a branched $C_8$-$C_{36}$ alkyl group.

4. The copolymer according to claim 1, which has a weight average molecular weight of 10,000 to 100,000 Daltons.

5. A semiconductor device comprising the copolymer according to claim 1.

6. The semiconductor device according to claim 5 is an organic field effect transistor.

7. An integrated circuit comprising the organic field effect transistor according to claim 6.

8. A semiconductor device comprising a polymer according to claim 3.

9. The copolymer according to claim 3, wherein R[1] and R[2] are selected from a branched $C_{12}$-$C_{24}$ alkyl group.

10. The copolymer according to claim 1, wherein R[1] and R[2] are the same or different and are selected from 2-hexyldecyl and decyl-tetradecyl.

11. The copolymer according to claim 3, wherein R[1] and R[2] are the same or different and are selected from 2-hexyldecyl and decyl-tetradecyl.

12. The copolymer according to claim 1, wherein n is a number which results in a molecular weight of 20,000 to 60,000 Daltons.

13. The copolymer according to claim 3, wherein n is a number which results in a molecular weight of 20,000 to 60,000 Daltons.

14. The copolymer according to claim 1 having a structure

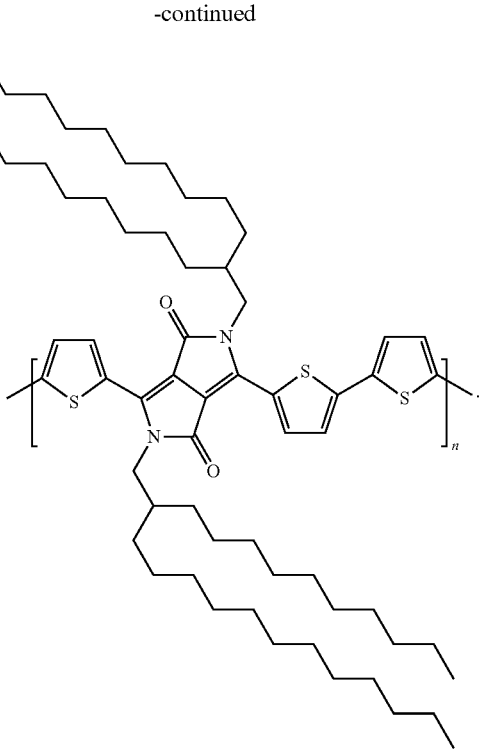

or

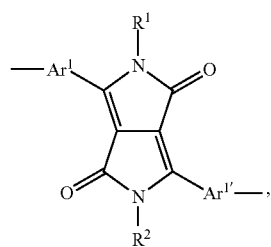

15. A copolymer comprising repeating units of formula (VII)

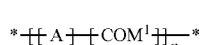
(VII)

wherein
A is a group of formula

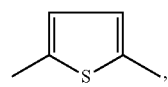

$COM^1$ is a group of formula

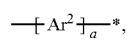

a is an integer of 1 and 3 to 5,
n is number which results in a molecular weight of 10,000 to 1,000,000 Daltons,
$Ar^1$ and $Ar^{1'}$ are a group of formula Ar² is a group of formula

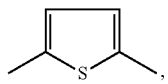

and

R¹ and R² are the same or different and are selected from a branched $C_{12}$-$C_{24}$alkyl group.

16. The copolymer according to claim 15, wherein a is an integer of 1 and 3.

17. The copolymer according to claim 15, which has a weight average molecular weight of 10,000 to 100,000 Daltons.

18. A semiconductor device comprising the copolymer according to claim 15.

19. The semiconductor device according to claim 18 is an organic field effect transistor.

20. An integrated circuit comprising the organic field effect transistor according to claim 19.

* * * * *